United States Patent
Tanaka

(10) Patent No.: US 7,563,661 B2
(45) Date of Patent: Jul. 21, 2009

(54) CRYSTALLIZATION METHOD FOR SEMICONDUCTOR FILM, MANUFACTURING METHOD FOR SEMICONDUCTOR DEVICE, AND LASER IRRADIATION APPARATUS

(75) Inventor: Koichiro Tanaka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 44 days.

(21) Appl. No.: 11/657,561

(22) Filed: Jan. 25, 2007

(65) Prior Publication Data

US 2007/0178631 A1  Aug. 2, 2007

(30) Foreign Application Priority Data

Feb. 2, 2006  (JP) ............................. 2006-025276

(51) Int. Cl.
*H01L 21/84* (2006.01)
(52) U.S. Cl. ............................. 438/166; 257/E21.561
(58) Field of Classification Search ......... 438/151–166; 257/E21.561
See application file for complete search history.

(56) References Cited

U.S. PATENT DOCUMENTS

| | | | |
|---|---|---|---|
| 4,769,750 A | 9/1988 | Matsumoto et al. | |
| 5,153,773 A | 10/1992 | Muraki et al. | |
| 5,463,497 A | 10/1995 | Muraki et al. | |
| 5,706,094 A | 1/1998 | Maris | |
| 5,795,795 A * | 8/1998 | Kousai et al. ............ | 438/166 |
| 5,900,980 A | 5/1999 | Yamazaki et al. | |
| 5,959,779 A | 9/1999 | Yamazaki et al. | |
| 6,002,523 A | 12/1999 | Tanaka | |
| 6,038,075 A | 3/2000 | Yamazaki et al. | |
| 6,061,375 A | 5/2000 | Zhang et al. | |
| 6,104,535 A | 8/2000 | Tanaka | |
| 6,137,633 A | 10/2000 | Tanaka | |
| 6,160,827 A | 12/2000 | Tanaka | |
| 6,176,926 B1 | 1/2001 | Tanaka | |
| 6,212,012 B1 | 4/2001 | Tanaka | |
| 6,239,913 B1 | 5/2001 | Tanaka | |
| 6,242,292 B1 * | 6/2001 | Yamazaki et al. ......... | 438/166 |
| 6,246,524 B1 | 6/2001 | Tanaka | |
| 6,249,381 B1 | 6/2001 | Suganuma | |
| 6,300,176 B1 | 10/2001 | Zhang et al. | |
| 6,373,633 B1 | 4/2002 | Brown | |
| 6,392,810 B1 | 5/2002 | Tanaka | |
| 6,393,042 B1 | 5/2002 | Tanaka | |

(Continued)

FOREIGN PATENT DOCUMENTS

JP  2003-332236  11/2003

*Primary Examiner*—Richard A. Booth
(74) *Attorney, Agent, or Firm*—Nixon Peabody LLP; Jeffrey L. Costellia; Marc W. Butler

(57) ABSTRACT

A semiconductor film formed over a substrate is irradiated by a first laser beam which is incident on a bottom surface of the substrate at an angle and by a second laser beam which is incident on the bottom surface of the substrate at an angle opposite that of the first laser beam and oscillated by an oscillator differing from that of the first laser beam; whereby, part of the semiconductor film is melted, and a portion of the semiconductor film being melted is moved while the positions of irradiation of the first and the second laser beams and are being scanned approximately along the direction of slant for the first laser beam or the second laser beam.

22 Claims, 38 Drawing Sheets

U.S. PATENT DOCUMENTS

| | | |
|---|---|---|
| 6,548,370 B1 | 4/2003 | Kasahara et al. |
| 6,567,219 B1 | 5/2003 | Tanaka |
| 6,573,162 B2 | 6/2003 | Tanaka et al. |
| 6,621,636 B2 | 9/2003 | Tanaka et al. |
| 6,707,614 B2 | 3/2004 | Tanaka |
| 6,728,039 B2 | 4/2004 | Tanaka |
| 6,730,550 B1 | 5/2004 | Yamazaki et al. |
| 6,809,012 B2 | 10/2004 | Yamazaki et al. |
| 6,856,630 B2 | 2/2005 | Tanaka |
| 6,927,109 B1 | 8/2005 | Tanaka et al. |
| 6,955,956 B2 | 10/2005 | Tanaka et al. |
| 6,977,775 B2 | 12/2005 | Sasaki et al. |
| 7,115,457 B2 | 10/2006 | Sasaki et al. |
| 7,138,306 B2 | 11/2006 | Tanaka et al. |
| 2001/0043401 A1 | 11/2001 | Tanaka |
| 2003/0024905 A1 | 2/2003 | Tanaka |
| 2003/0032222 A1 | 2/2003 | Okumura |
| 2003/0035219 A1 | 2/2003 | Tanaka |
| 2003/0042430 A1 | 3/2003 | Tanaka et al. |
| 2003/0058916 A1 | 3/2003 | Tanaka et al. |
| 2003/0080099 A1 | 5/2003 | Tanaka et al. |
| 2003/0100169 A1 | 5/2003 | Tanaka et al. |
| 2003/0143337 A1 | 7/2003 | Tanaka |
| 2003/0151822 A1 | 8/2003 | Tanaka |
| 2003/0203602 A1 | 10/2003 | Tanaka |
| 2004/0058553 A1 | 3/2004 | Tanaka |
| 2004/0065643 A1 | 4/2004 | Tanaka |
| 2004/0069751 A1 | 4/2004 | Yamazaki et al. |
| 2004/0196561 A1 | 10/2004 | Tanaka |
| 2004/0213514 A1 | 10/2004 | Tanaka et al. |
| 2004/0253838 A1* | 12/2004 | Yamazaki et al. ........... 438/795 |
| 2005/0031261 A1 | 2/2005 | Tanaka |
| 2005/0055016 A1 | 3/2005 | Tanaka et al. |
| 2005/0225771 A1 | 10/2005 | Sasaki et al. |
| 2005/0227460 A1 | 10/2005 | Sasaki et al. |
| 2005/0227504 A1 | 10/2005 | Sasaki et al. |
| 2005/0264824 A1 | 12/2005 | Sasaki et al. |
| 2005/0282408 A1 | 12/2005 | Sasaki et al. |
| 2006/0252189 A1 | 11/2006 | Sasaki et al. |

* cited by examiner

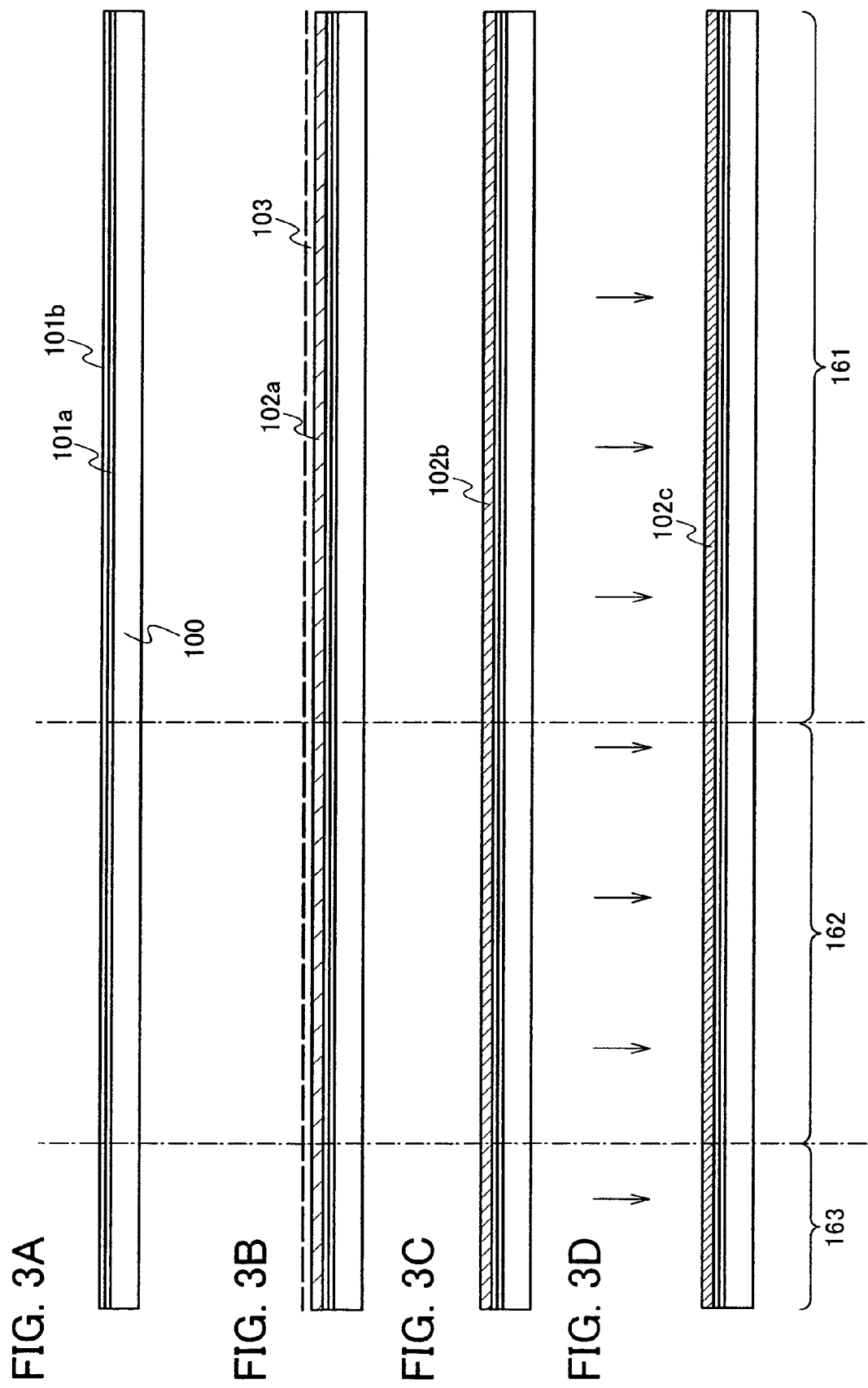

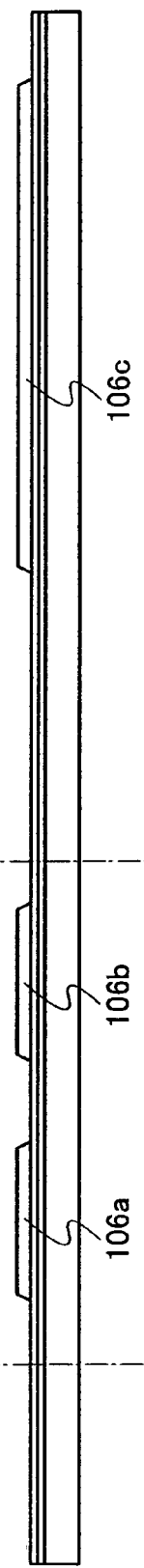
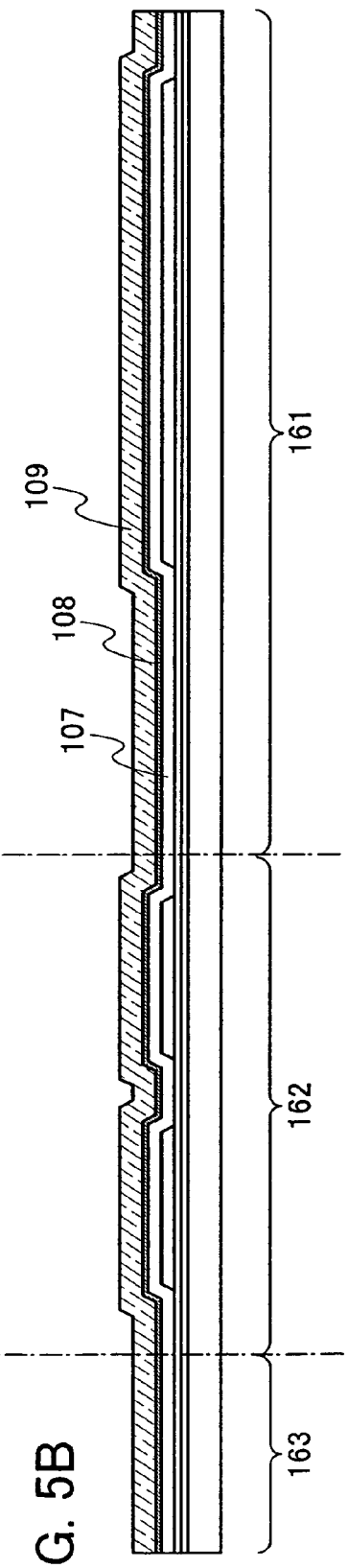

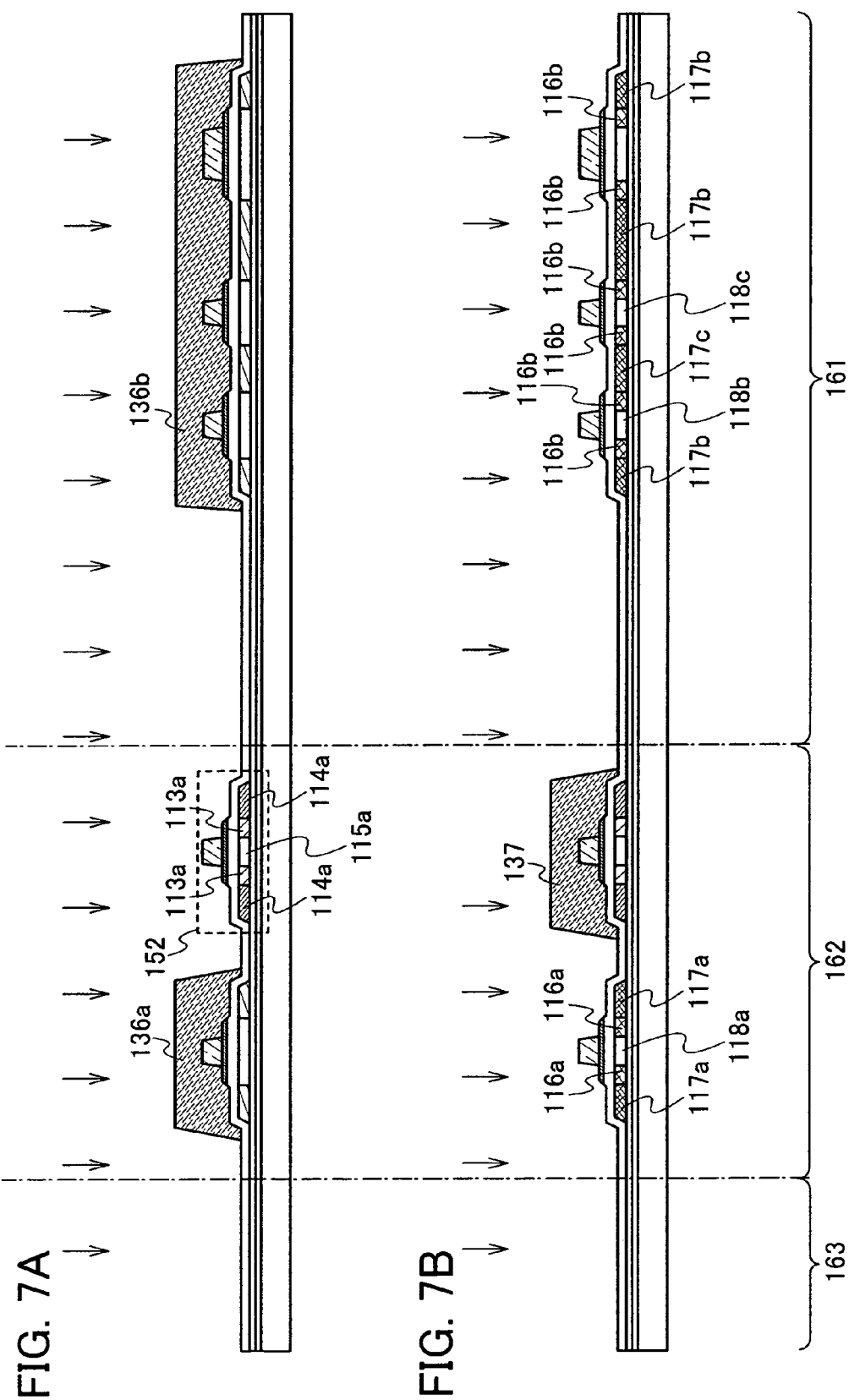

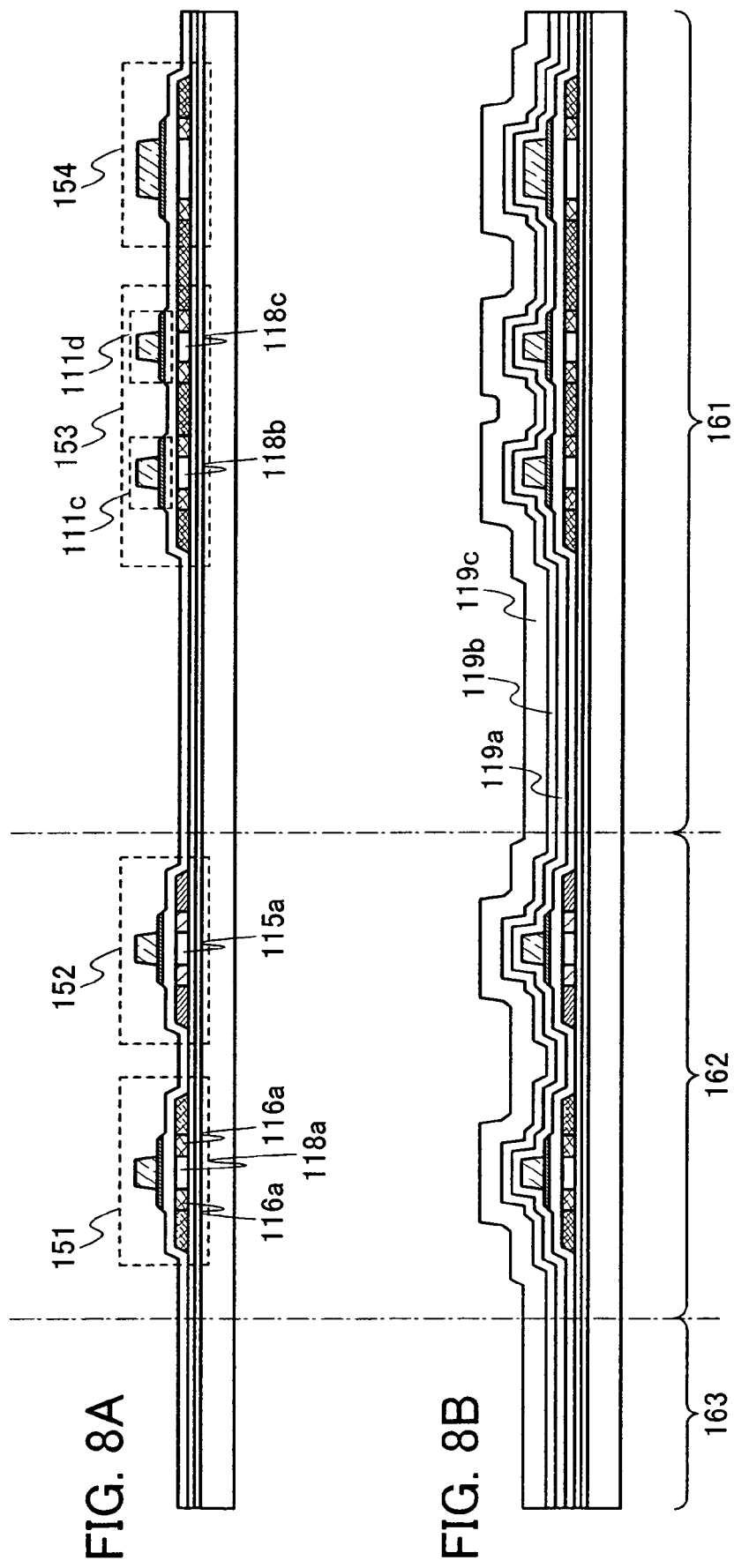

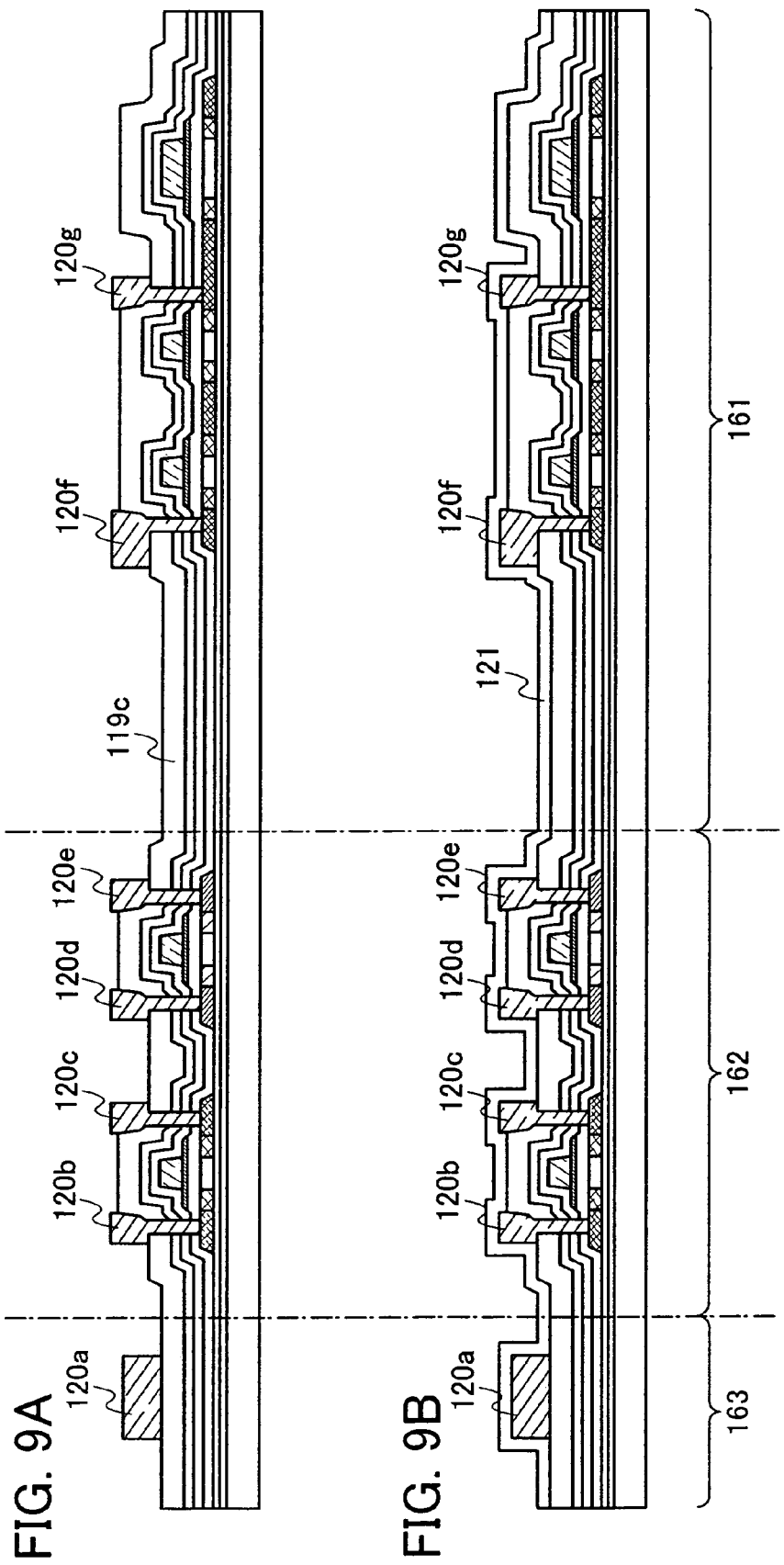

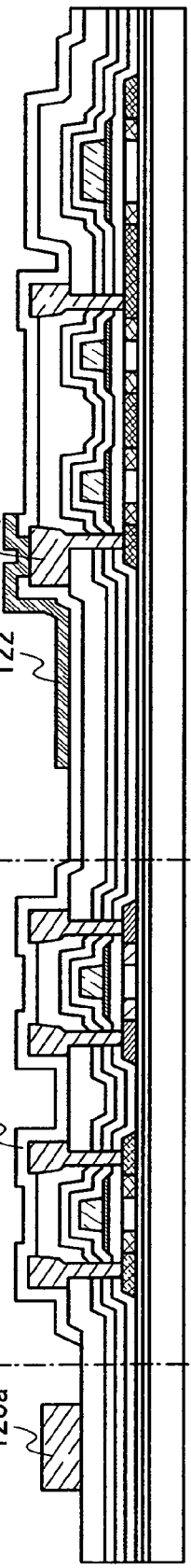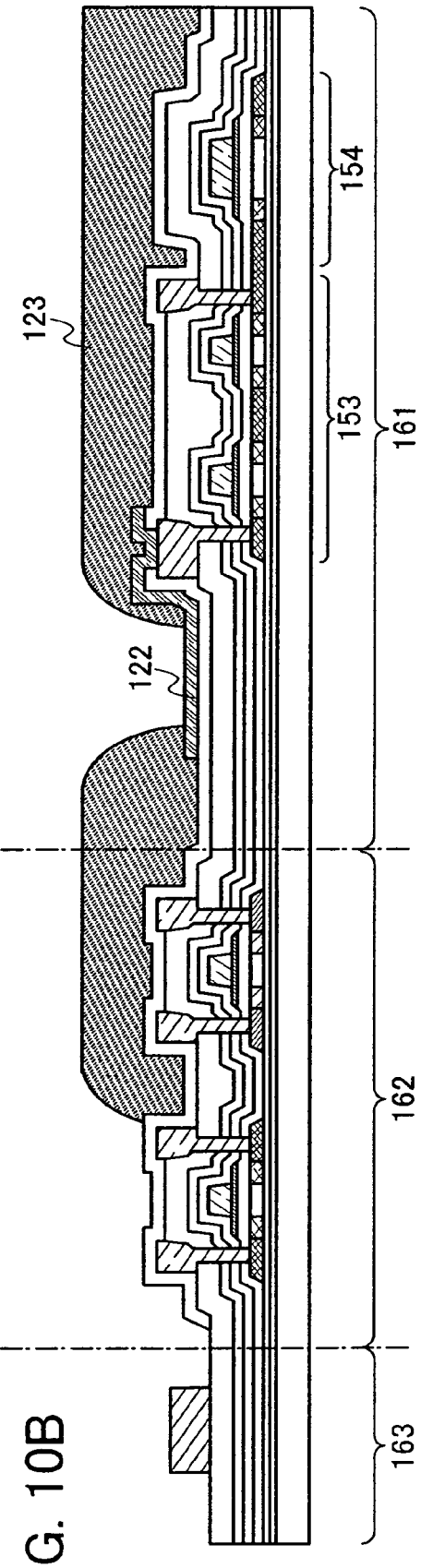

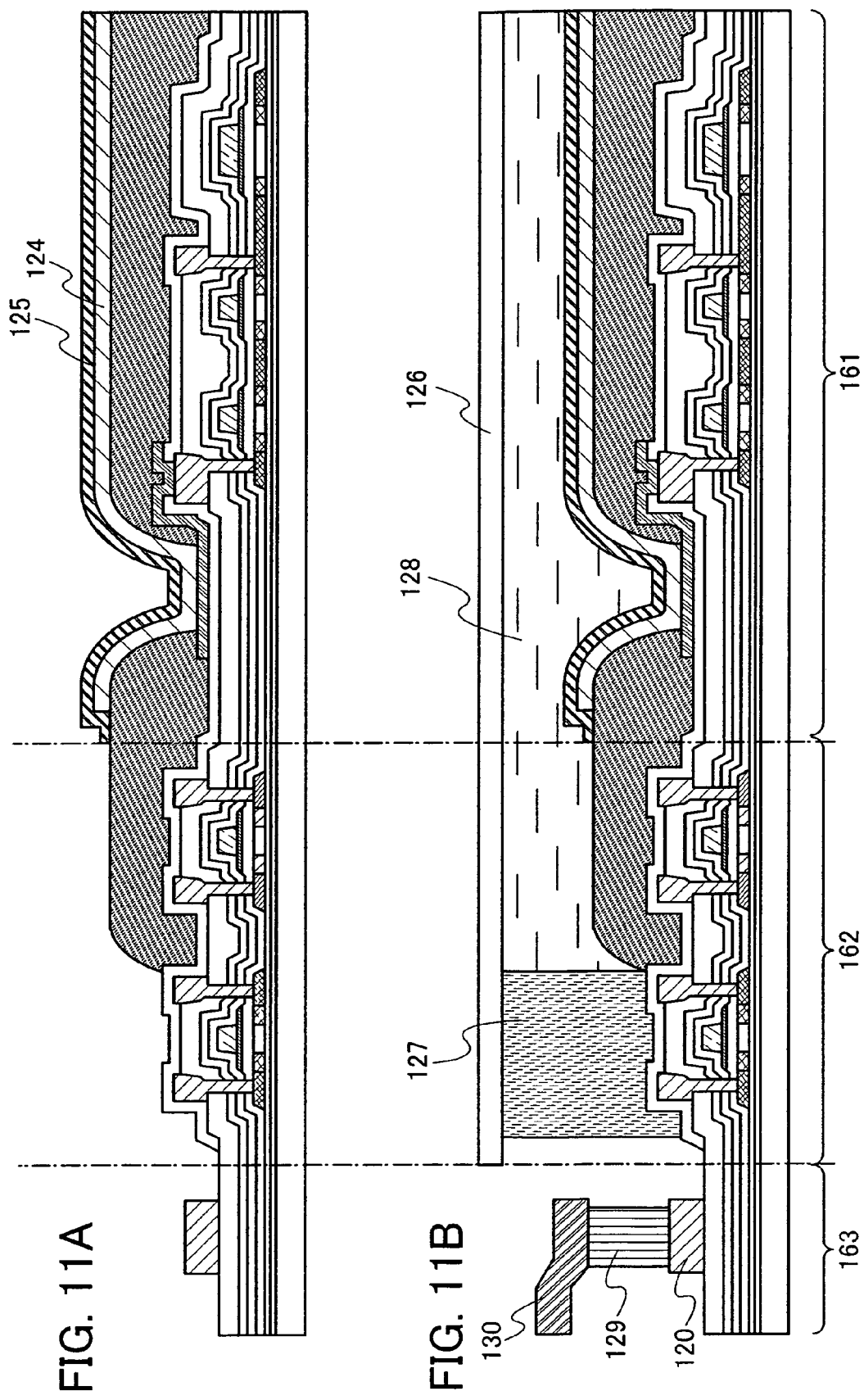

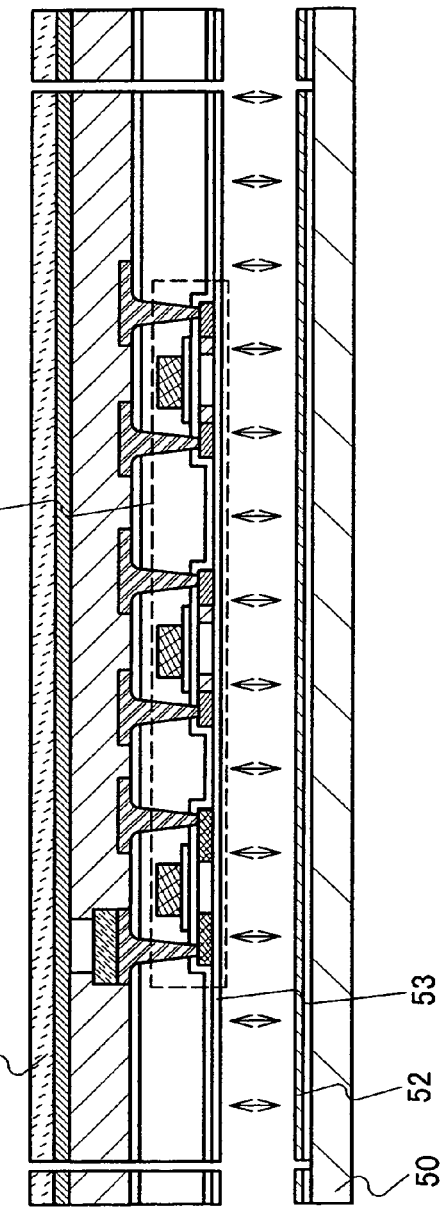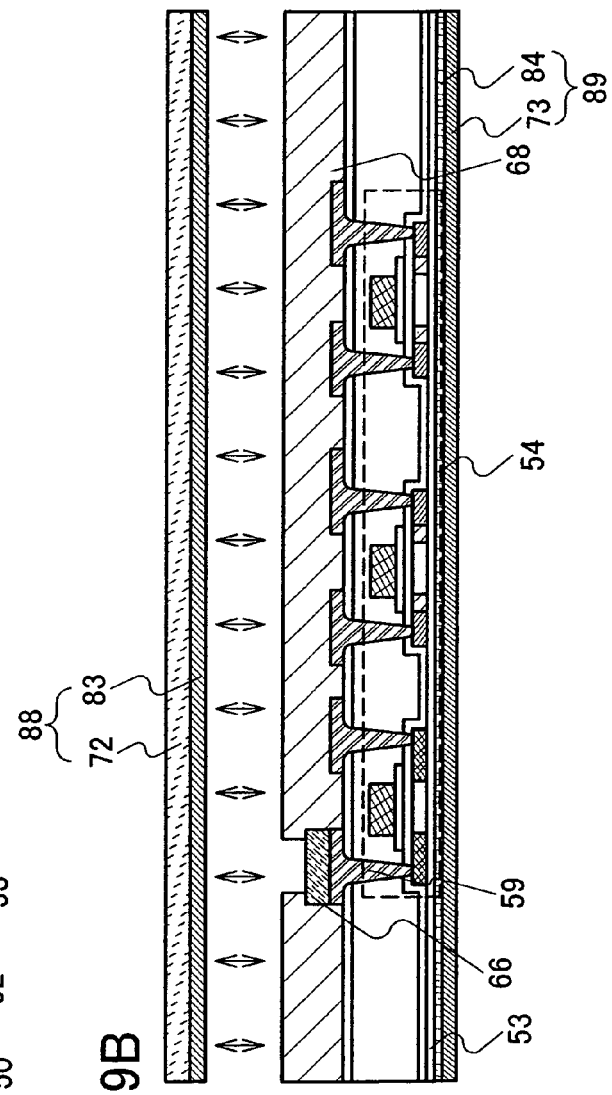
FIG. 19A
FIG. 19B

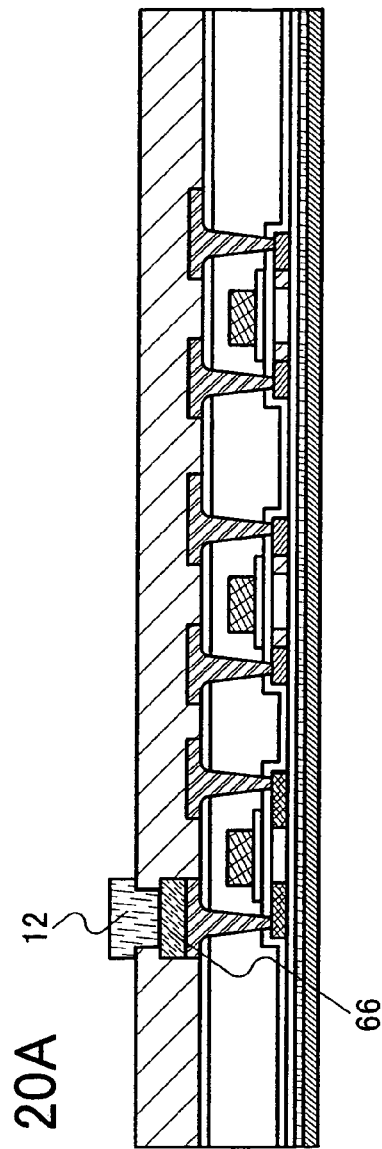
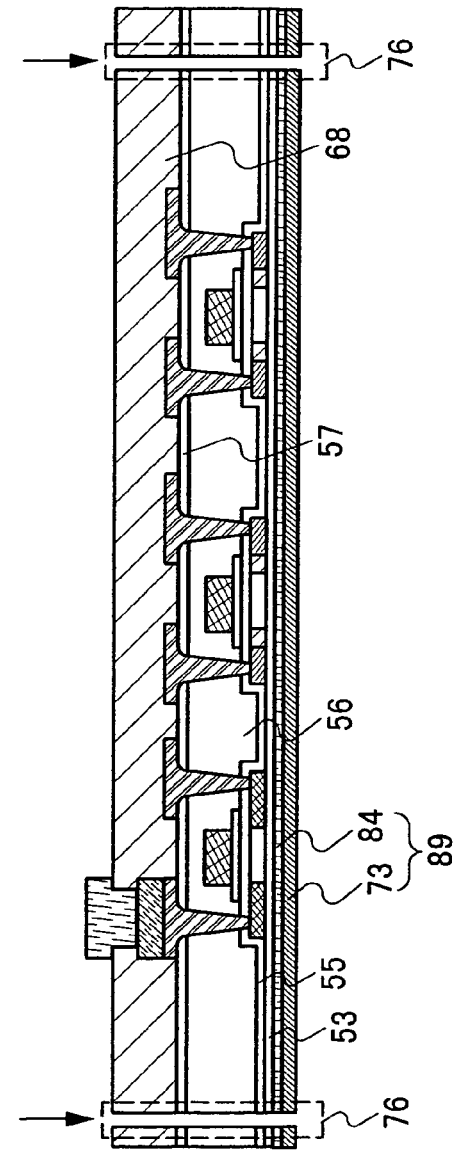
FIG. 20A
FIG. 20B

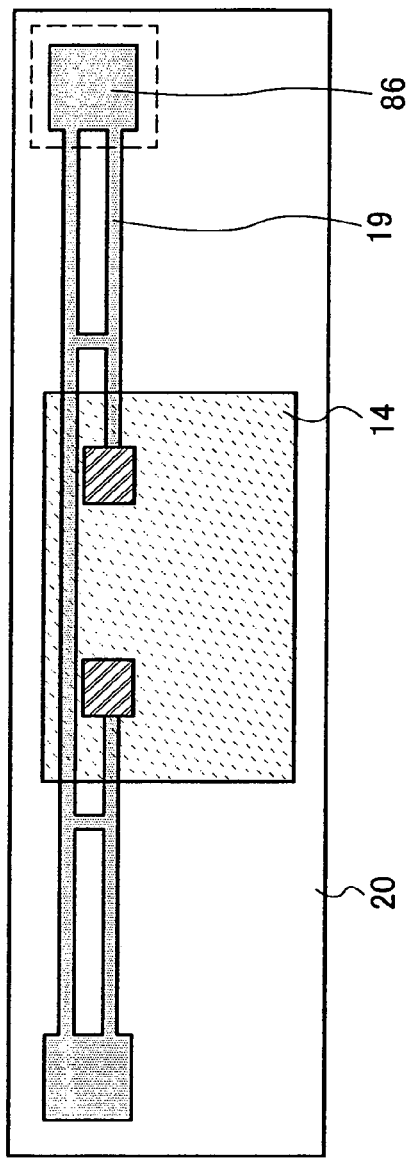
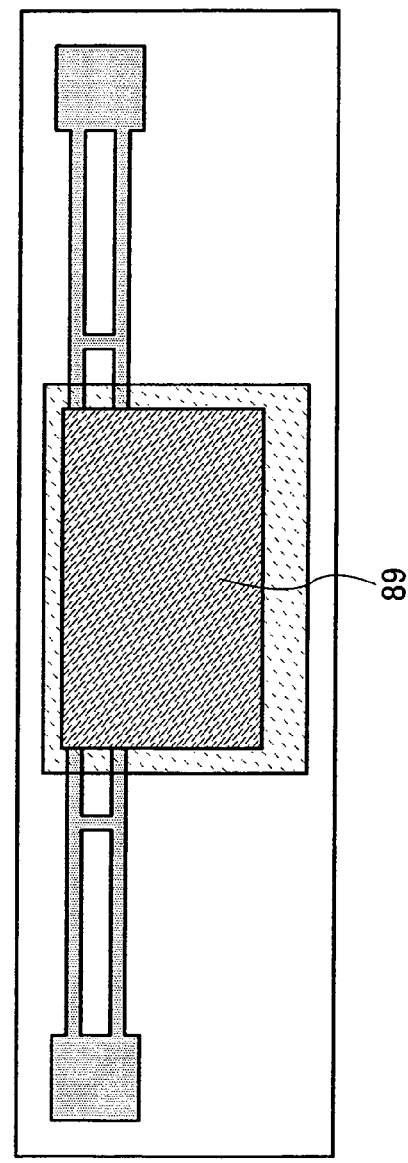
FIG. 22A
FIG. 22B

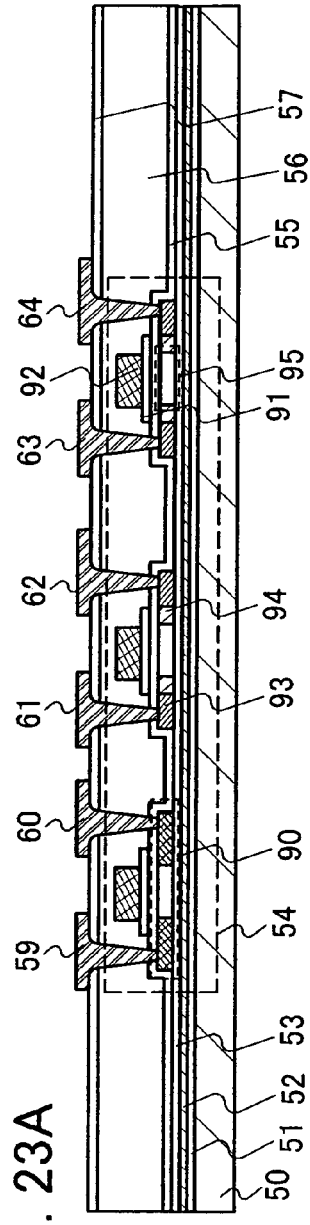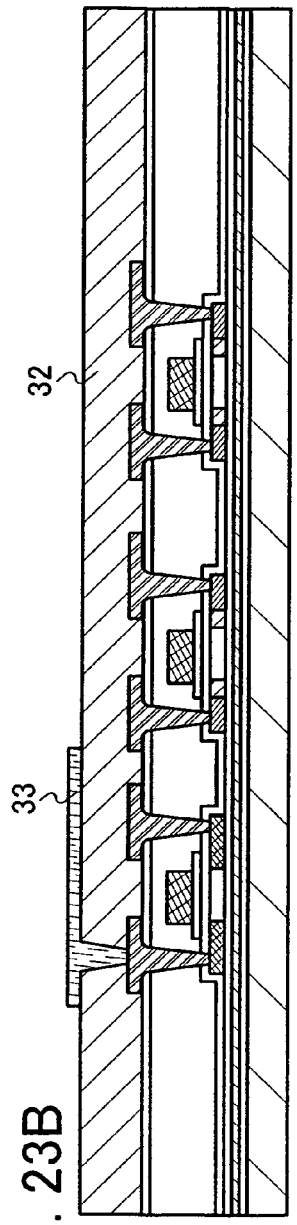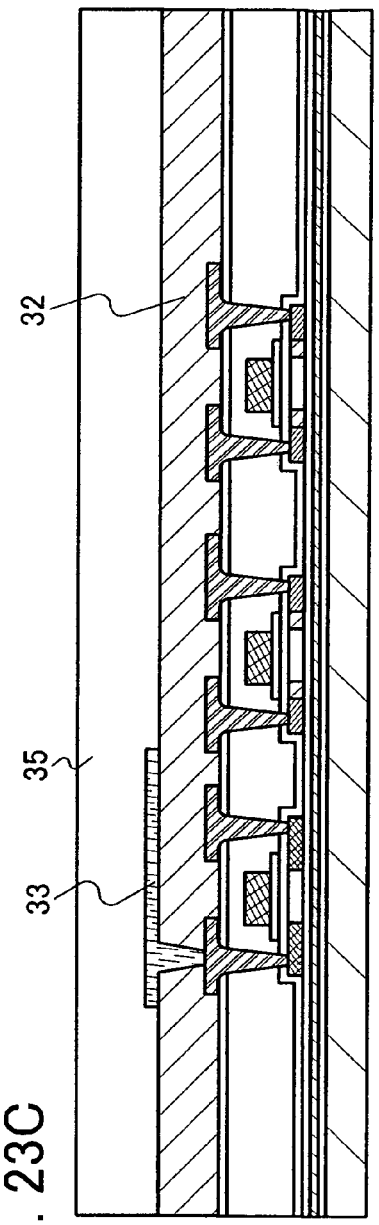

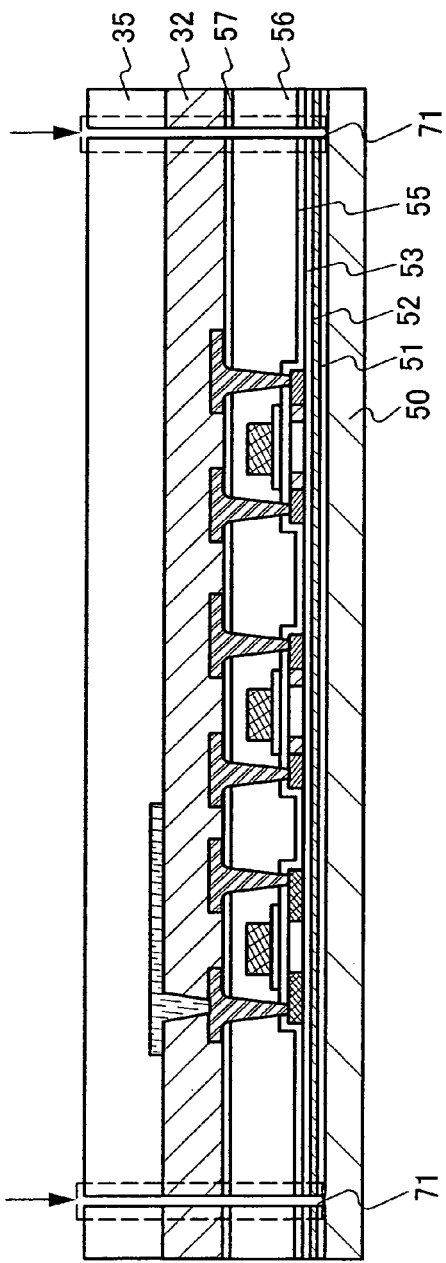
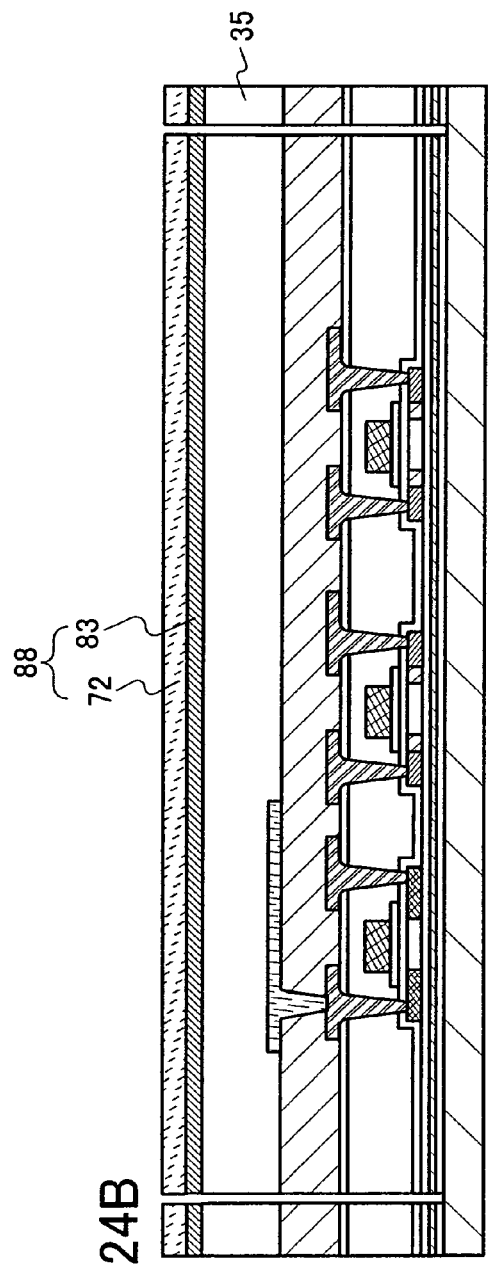
FIG. 24A
FIG. 24B

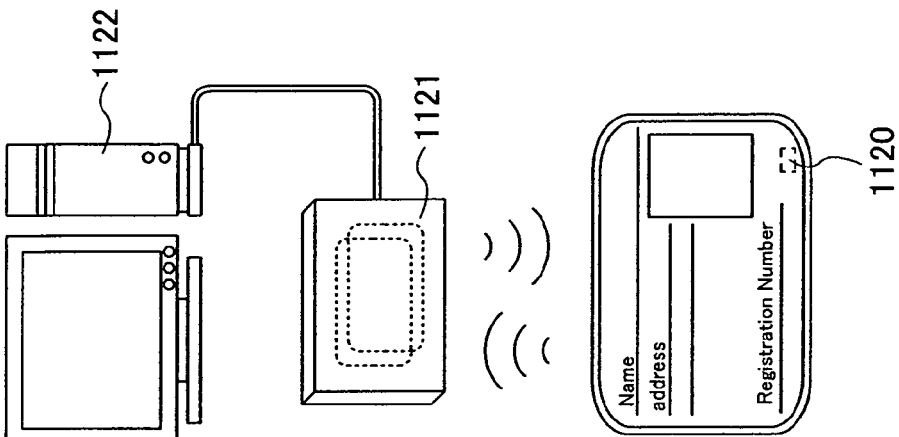
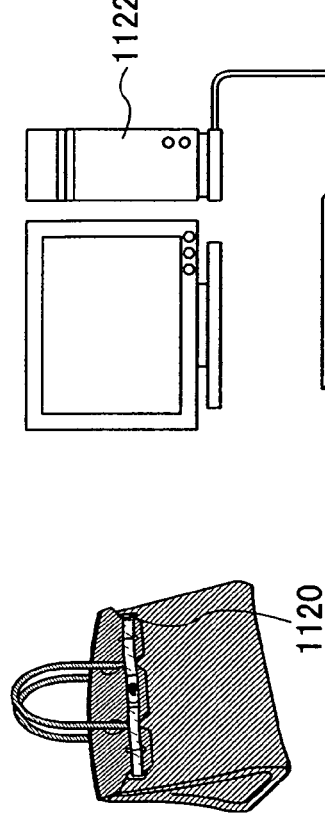
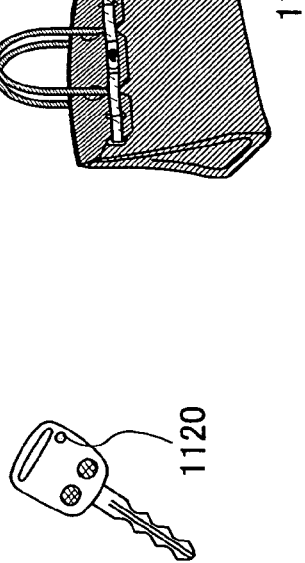
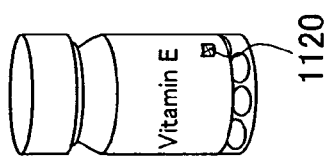
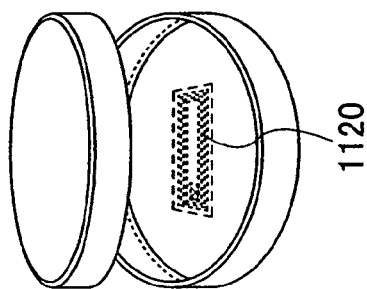

CRYSTALLIZATION METHOD FOR SEMICONDUCTOR FILM, MANUFACTURING METHOD FOR SEMICONDUCTOR DEVICE, AND LASER IRRADIATION APPARATUS

BACKGROUND OF THE INVENTION

1. Field of the Invention

The present invention relates to a semiconductor film crystallization method, a manufacturing method for a semiconductor device, and a laser irradiation apparatus. More specifically, the invention relates to a semiconductor film crystallization method, manufacturing method for a semiconductor device, and laser irradiation apparatus in which the generation of in-plane variations in the quality of a semiconductor film which has been crystallized can be suppressed.

2. Description of the Related Art

In recent years, extensive research has been conducted on laser crystallization methods used to crystallize a semiconductor film (for example, an amorphous semiconductor film) formed over a glass substrate through irradiation of the semiconductor film with a laser beam.

Crystallization of a semiconductor film is performed in order to increase carrier mobility through crystallization of the semiconductor film. The crystallized semiconductor film is used, for example, in a thin film transistor (hereinafter referred to as a TFT). For example, when a semiconductor film formed over a glass substrate has been crystallized, an active matrix display device (for example, a liquid crystal display device or an organic EL display device) can be manufactured through formation of a TFT for use in a pixel and TFT for use in a driver circuit, using the semiconductor films.

Methods for crystallizing a semiconductor film, other than the laser crystallization method, include a thermal annealing method which uses an annealing furnace and a rapid thermal annealing method (RTA method). However, these methods require processing at a high temperature of 600° C. or more. For this reason, use of a quartz substrate that can withstand processing at high temperature becomes necessary and causes manufacturing costs to increase. In comparison, with the laser crystallization method, absorption of heat can be restricted to absorption by the semiconductor film only, and a semiconductor film can be crystallized without any such increase in the temperature of the substrate. Because of this, a material with low heat resistance, such as glass or plastic, can be used for the substrate. As a result, an inexpensive glass substrate that can be easily processed with a large area can be used, and the production efficiency of the active matrix display device increases considerably.

Conventionally, a method using an excimer laser which is a pulsed laser has been used as a laser crystallization method. Because the wavelength of an excimer laser lies in the ultraviolet region, the laser can be efficiently absorbed by silicon and heat can be selectively applied to the silicon. When an excimer laser is used, a laser beam, for example, a laser beam with a rectangular cross section (for example, a rectangular cross section with an area of 10 mm×30 mm), emitted by a laser oscillator is processed by an optical system into a laser beam with a linear cross section (for example, a linear cross section with an area of several hundreds of micrometers by 300 mm). Then, the linearly processed laser beam irradiates the semiconductor film while scanning in relation to the semiconductor film, whereby the whole of the semiconductor film is crystallized sequentially. With the direction in which the beam spot is being scanned being perpendicular relative to the beam spot, crystallization efficiency increases.

In comparison, in recent years, the technology for manufacturing a semiconductor film with crystals of much larger grain size than crystals of a semiconductor film crystallized by an excimer laser has been developed, in which the semiconductor film is irradiated at a linear beam spot with a CW laser or a pulsed laser that has an oscillating frequency (repetition frequency) of 10 MHz or more processed into a laser beam with a linear cross section, scanning in relation to the semiconductor film. When the semiconductor film with crystals of large grain size is used in the channel region of a TFT, energy barriers against carriers (electrons or holes) decrease because fewer grain boundaries exist in the direction of the channel. As a result, the manufacture of a TFT that has a mobility of several hundreds of $cm^2/(V \cdot s)$ becomes possible. (For an example, refer to Patent Document 1: Japanese Published Patent Application No. 2003-332236 (Paragraph 4)).

FIG. 37 is a diagram used to explain a first conventional example of a crystallization method which uses a laser beam 801 emitted by a continuous wave laser or mode-locked laser for crystallization of a semiconductor film 802 formed over a substrate 800. In this example, the laser beam 801 is emitted in a direction perpendicular to the substrate 800 and scans relative to the substrate 800 in a direction along A-B in the diagram. Part of the laser beam 801 passes through the semiconductor film 802, reflects off the lower surface 800a of the substrate 800, and interferes with the incoming laser beam 801 at the semiconductor film 802. Because the thickness of the substrate 800 varies with location, the incident light and reflected light of the laser beam 801 are strengthened and weakened by each other, depending on the location. As a result, in-plane variations in the properties of the crystallized semiconductor film 802 are generated.

FIG. 38 is a diagram used for explaining a second conventional example of a crystallization method which uses the laser beam 801 for crystallization of the semiconductor film 802. In this example, the laser beam 801 irradiates the substrate 800 at a diagonal. The diagonal direction of the laser beam 801 is a direction along the scanning direction A-B of the laser beam 801.

In this example, although the incident light and reflected light of the laser beam 801 do not interfere, crystallization conditions differ, depending on the scanning direction of the laser beam 801. That is, when the laser beam 801 scans relative to a direction from B to A in the diagram, the semiconductor film 802 is irradiated with incident light after being irradiated with reflected light. In comparison, when the laser beam 801 scans relative to a direction from A to B in the diagram, the semiconductor film 802 is irradiated with reflected light after being irradiated with incident light. Because the incident light and reflected light of the laser beam 801 differ in intensity, there will be two regions in the semiconductor film 802, each crystallized under different conditions. The properties of each of these two regions differ from those of the other.

SUMMARY OF THE INVENTION

As described above, with a conventional crystallization method which uses a continuous wave laser or a mode-locked laser to crystallize a semiconductor film, in-plane variations in the properties of crystallized semiconductor films are generated.

Having been made in consideration of circumstances such as those described above, the present invention has the object of providing a crystallization method for a semiconductor film, manufacturing method for a semiconductor device, and laser irradiation apparatus capable of controlling the generation of in-plane variations in quality of a semiconductor film that has been crystallized.

For solving the above problems, a semiconductor film crystallization method of the present invention is a method in which, while a semiconductor film formed over a substrate is being irradiated by a first laser beam which is incident on the bottom surface of the substrate at an angle and by a second laser beam which is incident on the bottom surface of the substrate at an angle opposite the angle at which the first laser beam is incident on the bottom surface of the substrate and oscillated by an oscillator different from the oscillator of the first laser beam, part of the semiconductor film is melted, and the positions of irradiation of the first and the second laser beams are scanned approximately along the direction of slant for the first or the second laser beam so that the semiconductor film is crystallized through movement of the part of the semiconductor film being melted.

According to this semiconductor crystallization method, the semiconductor film is irradiated by the first laser beam and the second laser beam at a diagonal. The direction of slant of the second laser beam is opposite the direction of slant of the first laser beam and in a direction along the direction of travel of the position of irradiation. Because of this, when the positions of irradiation of the first laser beam and the second laser beam travel back and forth, the semiconductor film is irradiated, in order, by reflected light, incident light, and then reflected light on either the outward or return journey. For this reason, the crystallization conditions of the semiconductor film become approximately the same for both the outward and return journeys.

In addition, because the first laser beam and the second laser beam are each incident on the bottom surface of the substrate at an angle, reflected light and incident light do not overlap and mutual interference does not occur. For this reason, the generation of variations in the crystallization conditions of the semiconductor film due to interference between the reflected light and incident light can be prevented.

In addition, because each of the first laser beam and the second laser beam is oscillated by a different oscillator, interference between the two beams can be suppressed.

Consequently, the generation of in-plane variations in the properties of the crystallized semiconductor film can be suppressed. It is to be noted that use of a beam emitted by a pulsed laser oscillator with an oscillating frequency of 10 MHz or greater or a beam emitted by a CW laser oscillator is preferable.

Another semiconductor film crystallization method of the present invention is a method in which, while a semiconductor film formed over a substrate is being irradiated by a first laser beam which is incident on a bottom surface of the substrate at an angle and by a second laser beam which is incident on the bottom surface of the substrate at an angle opposite an angle of the first laser beam and has a the optical path length which is different from that of the first laser beam, part of the semiconductor film is melted, and the positions of irradiation of the first and the second laser beams are scanned along the direction of slant for the first or the second laser beam so that the semiconductor film is crystallized through movement of the part of the semiconductor film being melted.

According to this semiconductor film crystallization method, when the positions of irradiation of the first and the second laser beams travel back and forth, the semiconductor film is irradiated, in order, by reflected light, incident light, and then reflected light on either the outward or return journey. For this reason, the crystallization conditions of the semiconductor film become approximately the same for both the outward and return journeys. In addition, the reflected light of the first laser beam and the second laser beam does not overlap with the incident light and mutual interference does not occur. Consequently, the generation of variations in the crystallization conditions of the semiconductor film due to interference between the reflected light and incident light can be prevented.

Because optical path lengths for the first laser beam and the second laser beam differ, mutual interference can be suppressed.

Consequently, the generation of in-plane variations in the properties of the crystallized semiconductor film can be suppressed. It is to be noted that forming the first laser beam and the second laser beam through use of a beam splitter to divide the beam of a laser oscillated by the same oscillator is preferable. Furthermore, it is preferable that the first and second laser beams be beams emitted by a pulsed laser oscillator with a frequency of 10 MHz or more.

Another semiconductor film crystallization method of the present invention is a method in which, while a semiconductor film formed over a substrate is being irradiated by a first laser beam which is incident on a bottom surface of the substrate at an angle and by a second laser beam which is incident on the bottom surface of the substrate at an angle opposite an angle of the first laser beam, part of the semiconductor film is melted, and the positions of irradiation of the first and the second laser beams are scanned along a direction of slant for the first or the second laser beam so that the semiconductor film is crystallized through movement of the part of the semiconductor film being melted.

According to this semiconductor film crystallization method, when the positions of irradiation of the first and the second laser beams travel back and forth, the semiconductor film is irradiated, in order, by reflected light, incident light, and then reflected light on either the outward or return journey. For this reason, the crystallization conditions of the semiconductor film become approximately the same for both the outward and return journeys. In addition, the reflected light of the first laser beam and the second laser beam does not overlap with the incident light, and mutual interference does not occur. For this reason, the generation of variations in the crystallization conditions of the semiconductor film due to interference between the reflected light and incident light can be prevented. Consequently, the generation of in-plane variations in the properties of the crystallized semiconductor film can be suppressed.

For each of the semiconductor film crystallization methods described above, having beam spot intensities for the first and the second laser beams be substantially the same is preferable, and having the first and the second laser beams intersect at the semiconductor film is preferable, as well. In addition, it is preferable that the beam spots of the first and second laser beams be long and thin and extend in a direction substantially perpendicular to the scanning direction. The first laser beam is incident on the semiconductor film at a first angle with respect to a plane, the plane including the longitudinal axis of the first laser beam and being perpendicular to the semiconductor film, while the second laser beam is incident on the semiconductor film at a second angle opposite the angle of the first laser beam with respect to the plane. Furthermore, it is preferable that the absolute value of the angle of inclination of the first laser beam be equal to the absolute value of the angle of inclination of the second laser beam.

A manufacturing method for the semiconductor device of the present invention includes the following steps: forming a semiconductor film over a substrate; crystallizing the semiconductor film by a method in which, while the semiconductor film formed over the substrate is being irradiated by a first laser beam which is incident on the bottom surface of the substrate at an angle and by a second laser beam which is incident on the bottom surface of the substrate at an angle opposite an angle of the first laser beam and oscillated by an oscillator differing from an oscillator of the first laser beam, part of the semiconductor film is melted, and the positions of irradiation of the first and the second laser beams are scanned along the direction of slant for the first or the second laser beam so that the semiconductor film is crystallized through movement of the part of the semiconductor film being melted; and removing a selected portion of the semiconductor film so as to form the semiconductor film into an island shape.

According to this manufacturing method for a semiconductor device, because in-plane variations in the crystallized semiconductor film are suppressed, the generation of variations in quality of the island-shaped semiconductor film is suppressed.

Another manufacturing method for a semiconductor device of the present invention includes the following steps: forming a semiconductor film over a substrate; crystallizing the semiconductor film by a method in which, while the semiconductor film is being irradiated by a first laser beam which is incident on the bottom surface of the substrate at an angle and by a second laser beam which is incident on the bottom surface of the substrate at an angle opposite that of the first laser beam and the length of the optical path through which light travels differs from that of the first laser beam, part of the semiconductor film is melted, and the positions of irradiation of the first and the second laser beams are scanned in a direction along the direction of slant for the first laser beam or the second laser beam so that the semiconductor film is crystallized through movement of the part of the semiconductor film being melted; and removing a selected portion of the semiconductor film so as to form the semiconductor film into an island shape.

Another manufacturing method for a semiconductor device of the present invention includes the following steps: forming a semiconductor film over a substrate; crystallizing the semiconductor film by a method in which, while the semiconductor film is being irradiated by a first laser beam which is incident on a bottom surface of the substrate at an angle and by a second laser beam which is incident on the bottom surface of the substrate at an angle opposite an angle of the first laser beam, part of the semiconductor film is melted, and positions of irradiation of the first and the second laser beams are scanned in a direction along the direction of slant of the first laser beam or the second laser beam so that the semiconductor film is crystallized through movement of the part of the semiconductor film being melted; and removing a selected portion of the semiconductor film so as to form the semiconductor film into an island shape.

A source, channel region, and drain of a thin-film transistor, for example, may be formed with the island-shaped semiconductor film.

A laser irradiation apparatus of the present invention includes a first oscillator used for oscillating a first laser beam; a second oscillator used for oscillating a second laser beam; an optical system used for irradiating a semiconductor film formed over a substrate, in which the semiconductor film is irradiated by the first laser beam which is oriented at a diagonal from the bottom surface of the substrate and by the second laser beam which is oriented at a diagonal from the bottom surface of the substrate at an angle opposite the angle at which the first laser beam is incident on the bottom surface of the substrate; and a movement mechanism for moving the relative position of the substrate and the optical system in a direction along a direction of slant for each of the first and the second laser beams.

Another laser irradiation apparatus of the present invention includes an oscillator used for oscillating a laser beam; a beam splitter used for splitting the laser beam into a first laser beam and a second laser beam; an optical system used for irradiating a semiconductor film formed over a substrate in which the semiconductor film is irradiated by the first laser beam which is oriented at a diagonal from a bottom surface of the substrate and by the second laser beam, which is incident on the bottom surface of the substrate at an angle opposite the angle at which the first laser beam is incident on the bottom surface of the substrate after traveling along an optical path differing in length from that of the first laser beam; and a movement mechanism for moving the relative position of the substrate and the optical system in a direction along the direction of slant for each of the first and the second laser beams.

Another laser irradiation apparatus of the present invention includes an oscillator used for oscillating a laser beam; a beam splitter used for splitting the laser beam into a first laser beam and a second laser beam; an optical system used for irradiating a semiconductor film formed over a substrate in which the semiconductor film formed over the substrate is irradiated by the first laser beam which is oriented at a diagonal from the bottom surface of the substrate and by the second laser beam which is oriented at a diagonal from the bottom surface of the substrate at a direction opposite the direction of the first laser beam; and a movement mechanism for moving the relative position of the substrate and the optical system in a direction along the direction of slant for each of the first and the second laser beams.

In each of the laser irradiation apparatuses described above, the optical system includes a cylindrical lens, and the first and second laser beams may enter the cylindrical lens while a distance between the two beams is maintained and then irradiate the semiconductor film after passing through the cylindrical lens.

According to the present invention as described above, the generation of in-plane variations in the properties of a crystallized semiconductor film can be suppressed. In addition, the generation of variations in the quality of an island-shaped semiconductor layer using this semiconductor film can be suppressed, as well.

BRIEF DESCRIPTION OF THE DRAWINGS

In the accompanying drawings:

FIGS. 3A to 3D are diagrams used to explain a manufacturing method of a semiconductor device and a light-emitting device related to Embodiment 1.

FIGS. 5A and 5B are diagrams used to explain a manufacturing method of a semiconductor device and a light-emitting device related to Embodiment 1.

FIGS. 7A and 7B are diagrams used to explain a manufacturing method of a semiconductor device and a light-emitting device related to Embodiment 1.

FIGS. 8A and 8B are diagrams used to explain a manufacturing method of a semiconductor device and a light-emitting device related to Embodiment 1.

FIGS. 9A and 9B are diagrams used to explain a manufacturing method of a semiconductor device and a light-emitting device related to Embodiment 1.

FIGS. 10A and 10B are diagrams used to explain a manufacturing method of a semiconductor device and a light-emitting device related to Embodiment 1.

FIGS. 11A and 11B are diagrams used to explain a manufacturing method of a semiconductor device and a light-emitting device related to Embodiment 1.

FIGS. 19A and 19B are diagrams used to explain a manufacturing method of a semiconductor device related to Embodiment 4.

FIGS. 20A and 20B are diagrams used to explain a manufacturing method of a semiconductor device related to Embodiment 4.

FIGS. 22A and 22B are diagrams used to explain a manufacturing method of a semiconductor device related to Embodiment 4.

FIGS. 23A to 23C are diagrams used to explain a manufacturing method of a semiconductor device related to Embodiment 5.

FIGS. 24A and 24B are diagrams used to explain a manufacturing method of a semiconductor device related to Embodiment 5.

FIGS. 28A to 28E are diagrams used to explain a semiconductor device related to Embodiment 7.

DETAILED DESCRIPTION OF THE INVENTION

Embodiment Mode 1

Figure 1:
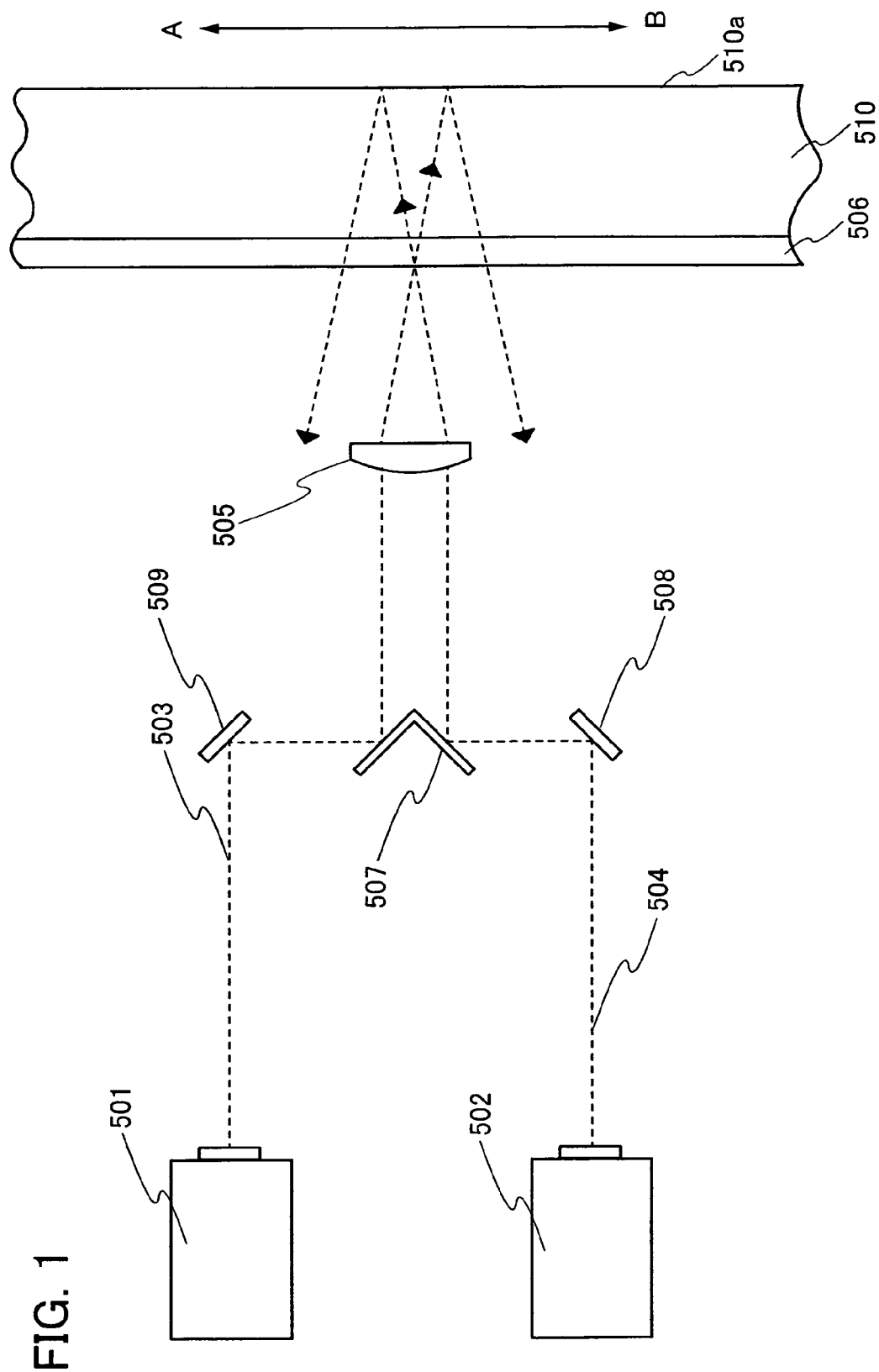
FIG. 1 is a diagram used to explain a crystallization method of a semiconductor film related to Embodiment Mode 1.

FIG. 1 is a diagram used to explain a crystallization method of a semiconductor film related to Embodiment Mode 1 of the present invention. This embodiment mode is a method in which a semiconductor film 506 is melted and crystallized through use of a laser irradiation apparatus. The semiconductor film 506 is formed over a substrate 510. The laser irradiation apparatus moves the substrate 510 back and forth in a direction along A-B in the diagram so that the position of irradiation by the laser beam relative to the semiconductor film 506 is moved.

The semiconductor film 506 is, for example, an amorphous or microcrystalline semiconductor film (an amorphous silicon film or a polysilicon film, for example). The substrate 510 is, for example, a glass substrate, a quartz substrate, a substrate formed of an insulator such as alumina, a plastic substrate with enough heat resistance to withstand post-process processing temperatures, a silicon substrate, or a metal plate. Furthermore, the substrate 510 may be a substrate with an insulating film such as a film of silicon oxide or silicon nitride formed over the surface of a metal substrate such as a stainless steel substrate or over the surface of a semiconductor substrate. In addition, when a plastic substrate for the substrate 510 is used, use of a plastic with a comparatively high glass transition point, such as PC (polycarbonate), PES (polyethersulfone), PET (polyethylene terephthalate), PEN (polyethylene naphthalate), or the like, is preferable. Note that an insulating film to be used as a base may be placed between the semiconductor film 506 and the substrate 510.

The semiconductor film 506 is irradiated by a first laser beam 503 oscillated by a first oscillator 501 and a second laser beam 504 oscillated by a second oscillator 502 after each laser beam is processed so as to have a linear cross section. The first oscillator 501 and the second oscillator 502 have the same structure, and the first laser beam 503 and the second laser beam 504 have the same output.

Here, "linear shape" does not strictly refer to a "line"; rather, "linear shape" here refers to a rectangular or oblong shape of a large aspect ratio. For example, the shape of an aspect ratio greater than or equal to 2 (preferably, greater than or equal to 10 and less than or equal to 10000) is considered a linear shape; however, the linear shape may be considered rectangular all the same. The linear beam spot has, for example, a minor axis with length greater than or equal to 5 µm and less than or equal to 15 µm and a major axis with length greater than or equal to 500 µm and less than or equal to 1000 µm.

The first laser beam 503 and the second laser beam 504 are CW laser beams or pulsed wave laser beams (for example, mode-locked laser beams, hereinafter referred to as mode-locked laser beams) with oscillating frequencies (repetition frequencies) of 10 MHz or more. When the first laser beam 503 and the second laser beam 504 are pulsed laser beams, the oscillating frequencies of the pulsed laser beams are set to the lower limit value so that, after the semiconductor film 506 is melted by being irradiated with the pulsed laser beam, the next pulse is emitted before the melted part is solidified. If the process is carried out as described above, a region irradiated by a laser beam can be maintained in a melted state.

For an example of a continuous wave laser, any of the following may be considered: a gas laser such as an Ar laser, a Kr laser, a $CO_2$ laser, or the like; a solid-state laser such as a YAG laser, an $YVO_4$ laser, an YLF laser, an $YAlO_3$ laser, a $GdVO_4$ laser, an alexandrite laser, a Ti:sapphire laser, an $Y_2O_3$ laser, or the like; and a metal vapor laser such as a helium cadmium laser or the like. For a solid-state laser, there is a ceramic laser of which the laser crystal is polycrystalline, for example, an $Y_2O_3$ laser or a YAG laser, which can be applied to the present invention. Examples of a mode-locked laser include an $YVO_4$ laser, a titanium sapphire laser, and a YAG laser. In addition, a disk laser may also be used. When a disk laser is used, because the shape of the laser medium is a disk shape, the laser has the characteristic of a favorable cooling efficiency; in other words, the laser has the characteristics of high energy efficiency and high laser quality.

In addition, the first laser beam 503 and the second laser beam 504 may be oscillated by the first oscillator 501 and the second oscillator 502 in $TEM_{00}$ mode. In this case, for the surface of the semiconductor film 506 to be irradiated, uniformity in energy of the linear beam spot can be improved. However, laser beams oscillated in other modes (for example, laser beams oscillated at the second harmonic) may be used for the first laser beam 503 and the second laser beam 504.

After the first laser beam 503 has been oscillated by the first oscillator 501, the first laser beam 503 reflects off of a mirror 509 and a V-shaped mirror 507 and is then incident on a cylindrical lens 505. After the second laser beam 504 has been oscillated by the second oscillator 502, the second laser beam 504 reflects off of a mirror 508 and the mirror 507 and is then incident on the cylindrical lens 505. After the lengths of the optical paths have been changed by the mirror 507, the first laser beam 503 and the second laser beam 504 become parallel with each other, and the distance between the two laser beams at which both beams can enter the cylindrical lens 505 is maintained.

The first laser beam 503 and the second laser beam 504 are processed by the cylindrical lens 505 so as to have a linear cross section and incident on the bottom surface of the substrate 510 at a diagonal. At this time, it is preferable that the first laser beam 503 and the second laser beam 504 be emitted so as to intersect at the semiconductor film 506, but if the same part of the semiconductor film 506 is to be melted in the step for crystallization of the semiconductor film 506 described below, the two laser beams may irradiate the semiconductor film while being isolated from each other.

The directions of slant for the first laser beam 503 and the second laser beam 504 are in a direction along the direction of movement of the substrate 510 (a direction along A-B in the diagram), and the direction of slant for the second laser beam 504 is opposite the direction of slant for the first laser beam 503. It is preferable that the absolute value of the angle of inclination for the first laser beam 503 with respect to the bottom surface of the substrate 510 be equal to the absolute value of the angle of inclination for the second laser beam 504 with respect to the bottom surface of the substrate 510. Furthermore, it is preferable that the beam spot intensities for the first laser beam 503 and the second laser beam 504 be approximately equal, as well.

In addition, the lengths of the optical paths from the oscillator to where the laser beams are incident upon the semiconductor film 506 are approximately equal for the first laser beam 503 and the second laser beam 504, but because the two laser beams are oscillated by different oscillators, the phases of the two laser beams when the two laser beams intersect at the semiconductor film 506 are different. As a consequence, mutual interference between the first laser beam 503 and the second laser beam 504 when the two laser beams intersect at the semiconductor film 506 is suppressed.

The first laser beam 503 and the second laser beam 504 irradiating the semiconductor film 506 are absorbed by the semiconductor film 506. Part of the laser beams is incident on the substrate 510 and then reflects off a bottom surface 510a of the substrate 510. Because the first laser beam 503 and the second laser beam 504 are each oriented at a diagonal with respect to the bottom surface 510a of the substrate 510, the reflected light and incident light do not overlap, and mutual interference does not occur.

When the semiconductor film 506 is crystallized, a laser irradiation apparatus moves a stage (not shown in the drawing) on which the substrate 510 is mounted in a direction along A-B in the drawing, in other words, in a direction along the direction of slant of the first laser beam 503 and the second laser beam 504. The part of the semiconductor film 506 irradiated by the first laser beam 503 and the second laser beam 504 is melted, and this melted part moves continuously without interruption as the substrate 510 moves in the A-B direction in the diagram. Because of this, the solid-liquid interfaces continuously move, and the semiconductor film 506 is crystallized. These crystal grains extend in the scanning direction of the first laser beam 503 and the second laser beam 504, that is to say, in the direction along A-B in the diagram.

In order to crystallize the entire surface of the semiconductor film 506, it is necessary to repeat the following movements of which, after a laser irradiation apparatus moves the substrate 510 from A to B in the diagram, the substrate 510 is moved in a direction orthogonal to the A-B direction in the diagram and then further moved from B to A in the diagram. In Embodiment Mode 1, the direction of slant for the second laser beam 504 is opposite that of the first laser beam 503 and in a direction along the direction of movement of the substrate 510 (in a direction along the direction of A-B in the diagram). Because of this, when the substrate 510 is moved either from A to B in the diagram or from B to A in the diagram, the semiconductor film 506 is irradiated, in order, by reflected light, incident light, and reflected light. As a consequence, the crystallization conditions of the semiconductor film 506 are approximately equal, with no dependence on the direction of movement of the substrate 510. In particular, when the absolute value of the angle of slant of the first laser beam 503 is equal to that of the second laser beam 504, the crystallization conditions of the semiconductor film 506 become even more uniform.

Furthermore, as described above, because the first laser beam 503 and the second laser beam 504 are each oriented at a diagonal relative to the bottom surface of the substrate 510, the reflected light and the incident light do not overlap, and mutual interference does not occur. As a consequence, the generation of variations in crystallization conditions of the semiconductor film 506 due to mutual interference between the reflected light and the incident light can be suppressed.

Thus, according to the present embodiment mode, the generation of in-plane variations in the quality of a crystallized semiconductor film can be suppressed.

It is to be noted that, in the present embodiment mode, laser beams for irradiating the semiconductor film 506 may be added by adding additional laser emission sources in even-numbered units (for example, two). In this case, the added laser beams are oriented so as to slant in the same direction as the first laser beam 503 and second laser beam 504; one set of the added laser beams (for example, one of the added laser beams) is emitted in the same direction as the first laser beam 503, and the other set of the added laser beams (for example, the remaining added laser beam) is emitted in the same direction as the second laser beam 504. When two laser emission sources have been added, it is preferable that the angles of inclination of the added laser beams be equal to each other.

Embodiment Mode 2

Figure 2:
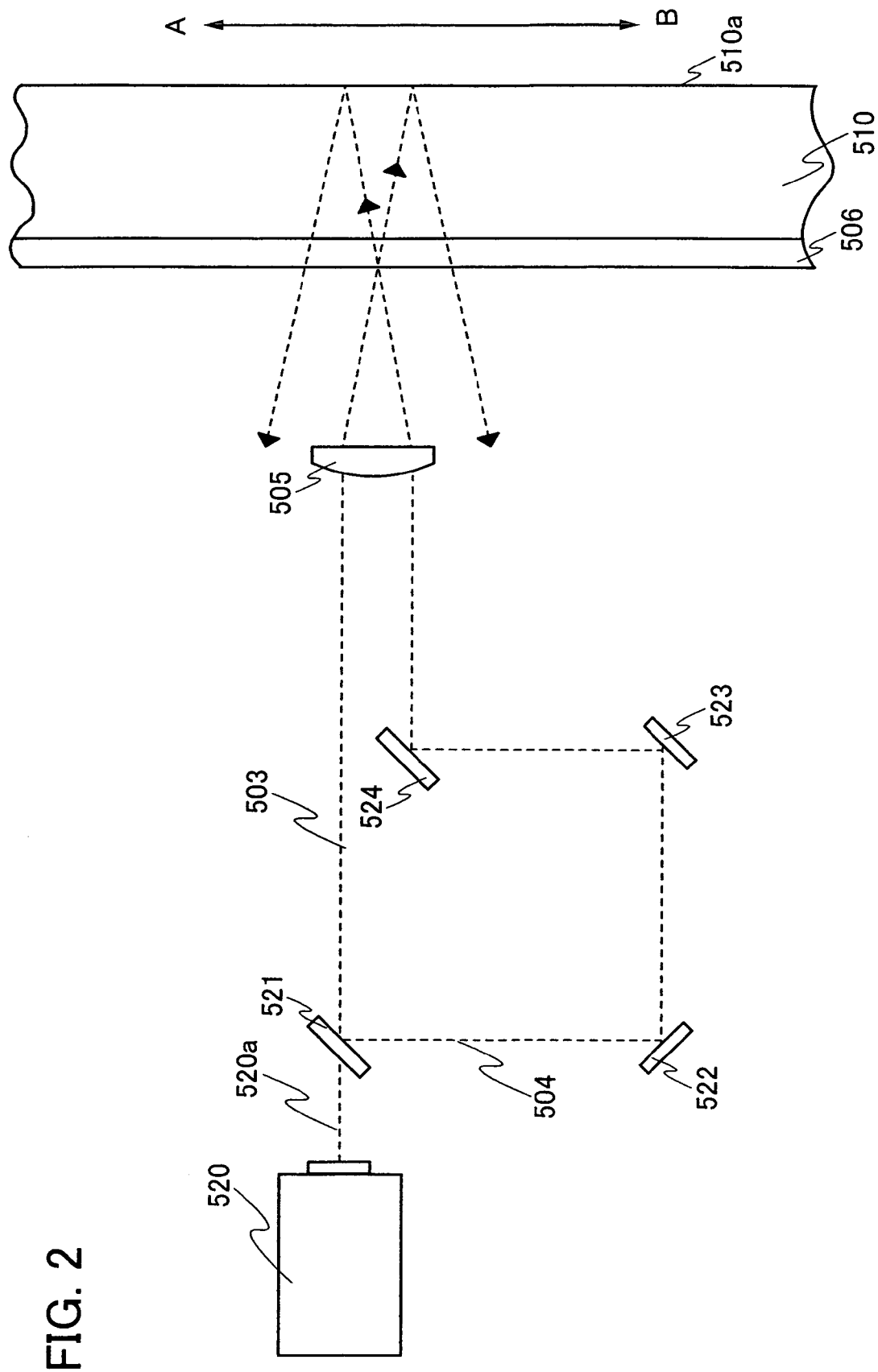
FIG. 2 is a diagram used to explain a crystallization method of a semiconductor film related to Embodiment Mode 2.

FIG. 2 is a diagram used to explain a crystallization method of a semiconductor film related to Embodiment Mode 2 of the present invention. The present Embodiment Mode 2 is the same as Embodiment Mode 1 except for the point that the laser irradiation apparatus has one oscillator and the beam of a mode-locked laser 520*a* oscillated by this oscillator 520 is split into two beams by a beam-splitter 521, generating a first laser beam 503 and a second laser beam 504; and the optical system up to where the first laser beam 503 and the second laser beam 504 are incident on a cylindrical lens 505. Specific examples of the mode-locked laser beam 520*a* are the same as the examples of the mode-locked laser given in Embodiment Mode 1. Hereinafter, the structures that are the same as those in Embodiment Mode 1 are referred to by the same numerals, and so, any explanation of these structures will be omitted.

The lengths of the optical paths of the first laser beam 503 and the second laser beam 504 up to where the beams are incident on the cylindrical lens 505 differ from each other. Specifically, the first laser beam 503 is incident on the cylindrical lens 505 directly after passing through the beam splitter 521, whereas the second laser beam is incident on the cylindrical lens 505 after passing through the beam splitter 521 and reflecting off of each of a mirror 522, a mirror 523, and a mirror 524. The difference in optical path length between that of the first laser beam 503 and that of the second laser beam 504 is greater than or equal to 1 cm and less than or equal to 30 m, for example.

Because of this, there is a lag between the pulse timing of the first laser beam 503 and the pulse timing of the second laser beam 504 when each beam is incident upon the cylindrical lens 505. As a consequence, mutual interference between the two laser beams when the first laser beam 503 and the second laser beam 504 intersect at the semiconductor film 506 can be suppressed.

Similar to that of Embodiment Mode 1, when the substrate 510 is moved either from A to B in the diagram or from B to A in the diagram, the semiconductor film 506 is irradiated, in order, by reflected light, incident light, and reflected light. As a result, the crystallization conditions of the semiconductor film 506 are equal, regardless of the direction of movement of the substrate 510.

In addition, as in Embodiment Mode 1, because the first laser beam 503 and the second laser beam 504 are each oriented at a diagonal with respect to the bottom surface of the substrate 510, reflected light and incident light do not overlap, and mutual interference does not occur. Consequently, the generation of variations in the crystallization conditions of the semiconductor film 506 due to interference between the reflected light and the incident light can be suppressed.

Furthermore, in this Embodiment Mode 2, as well, the generation of in-plane variations in the properties of a crystallized semiconductor film can be suppressed. It is to be noted that, in the present embodiment mode, the laser beam oscillated by the oscillator 520 may be a CW laser beam; however, the difference in optical path lengths should be a coherent length or greater. Specific examples of a CW laser are the same as those given in Embodiment Mode 1.

Furthermore, in Embodiment Modes 1 and 2, the optical system can be made to move in the direction of A-B in the diagram, that is to say, in the direction at which the first laser beam 503 or the second laser beam 504 is slanted, whereby the positions of irradiation of the first laser beam 503 and the second laser beam 504 are moved with respect to the semiconductor film 506.

In addition, the portion of the semiconductor film 506 that does not require high crystallinity need not be irradiated by the first laser beam 503 or the second laser beam 504. Alternatively, the portion not requiring high crystallinity may be irradiated under conditions through which high crystallinity is not produced, such as conditions in which the scanning speeds of the first laser beam 503 and second laser beam 504 are increased.

Embodiment 1

One mode of a manufacturing method for a semiconductor device and a light-emitting device using the semiconductor device of Embodiment 1 will be explained with reference to FIGS. 3A to 3D, 4A to 4D, 5A and 5B, 6A to 6C, 7A and 7B, 8A and 8B, 9A and 9B, 10A and 10B, 11A and 11B, 12, and 13A to 13C.

First, after an insulating layer 101*a* is formed over a substrate 100, an insulating layer 101*b* is formed so as to be layered over the insulating layer 101*a*. It is preferable that the insulating layer 101*a* be formed so that the dispersion of impurities from the substrate 100 can be prevented, and it is preferable that the insulating layer 101*a* be formed using, for example, silicon nitride, silicon nitride that includes oxygen, or the like. Furthermore, it is preferable that the insulating layer 101*b* be formed as a layer in which the stress difference generated between the layer and a semiconductor film formed during a later step is decreased, and it is preferable that the insulating layer 101*b* be formed using, for example, silicon oxide, silicon oxide that includes a trace amount of nitrogen, or the like. There are no particular restrictions on the method of formation of the insulating layers 101*a* and 101*b*, and any one of a plasma CVD method, a low-pressure CVD method, a sputtering method, a PVD method, or the like may be used to form the insulating layers 101*a* and 101*b*. Furthermore, there are no particular restrictions on the substrate 100, and, in addition to a substrate with an insulating material such as glass or quartz, a substrate of silicon, stainless steel, or the like, over which an insulating layer is provided, may be used, or a plastic substrate having flexibility such as one of polyethylene terephthalate (PET), polyethylene naphthalate (PEN), or the like, may be used. Furthermore, when a substrate, like a substrate made of quartz, in which the content of impurities is very low is used, the insulating layers 101*a* and 101*b* need not necessarily be formed (FIG. 3A).

Next, a semiconductor layer to be used as the active layer (semiconductor layers 106*a* to 106*c* (refer to FIG. 5A)) of a TFT (thin film transistor) is formed over the insulating layer 101*b*. It is preferable that the semiconductor layer to be used as the active layer of a transistor be formed as a crystalline semiconductor layer. The manufacturing method of the crystalline semiconductor layer will be explained hereinafter.

First, an amorphous semiconductor layer 102a that includes a semiconductor of silicon, silicon germanium, or the like is formed over the insulating layer 101b. It is preferable that the thickness of the amorphous semiconductor layer 102a be from 40 to 80 nm. The same film formation apparatus that was used to form the insulating layer 101a and the insulating layer 101b may be used to form the insulating layer 101a, the insulating layer 101b, and the amorphous semiconductor layer 102a consecutively, that is, the amorphous semiconductor layer 102a may be formed in succession of the insulating layer 101a and the insulating layer 101b being formed, in the same film formation apparatus, without the insulating layer 101a or the insulating layer 101b being exposed to air. If the steps are carried out as thus described, the bonding of impurities in the air to the insulating layer 101b can be prevented.

Next, the surface of the amorphous semiconductor layer 102a is doped with a metallic element 103 that promotes crystallization. Metallic elements that promote crystallization include iron (Fe), nickel (Ni), cobalt (Co), ruthenium (Ru), rhodium (Rh), palladium (Pd), osmium (Os), iridium (Ir), platinum (Pt), copper (Cu), and gold (Au), any of which may be used. Out of these elements, one or a plurality is used, and a method for forming a thin film from the metallic element or from a silicide of the metallic element, such as a sputtering method, a PVD method, a low-pressure CVD method, a plasma CVD method, a vapor deposition method, or the like, or a method such as one in which a solution containing the metallic element is applied may be used to dope the amorphous semiconductor film 102 with the metallic element. Alternatively, a mask may be formed over the amorphous semiconductor film 102 and the metallic element may be added selectively.

In addition, it is preferable that a thin oxide film be formed over the amorphous semiconductor layer 102a when the metallic element 103 is being doped. After a thin oxide film of 1 to 10 nm has been formed over the surface of the amorphous semiconductor film 102a, for example, the metallic element 103 that promotes crystallization may be preserved over the oxide film. There are no particular limitations on the method used to form the oxide film, and the oxide film may be formed through a method in which the surface of the amorphous semiconductor layer 102a is treated with a solution with oxidizability such as with a solution of ozonated water or a solution of hydrogen peroxide or through a method in which ozone is generated by ultraviolet irradiation of oxygen in an oxygen atmosphere. Furthermore, there are no particular limitations on the method used to preserve the metallic element that promotes crystallization, and the metallic element that promotes crystallization may be preserved through bonding of the metallic element to the oxide film by treatment of the surface of the oxide film with a solution containing the metallic element that promotes crystallization or through use of a sputtering method or the like to form a layer or cluster containing the metallic element that promotes crystallization over the oxide film. For the solution containing the metallic element that promotes crystallization, a metallic salt solution, such as a nickel acetate solution, may be used (FIG. 3B).

Subsequently, the amorphous semiconductor layer 102a is crystallized by a rapid thermal annealing (RTA) method or by heat treatment using an annealing furnace or the like, and a crystalline semiconductor layer 102b containing an amorphous component and a crystal component is formed (FIG. 3C). The RTA method may be an RTA method in which a lamp method is used to heat by light irradiation or a gas method is used to heat by a high-temperature gas. It is preferable that heat treatment be performed under an atmosphere filled with a gas of low reactivity, such as under a nitrogen gas or noble gas atmosphere. In addition, when an RTA method is used, it is preferable that the heat treatment temperature come to be from 600 to 800° C. and that the heat treatment time be from 3 to 9 minutes. When heat treatment is performed using an annealing furnace, it is preferable that the heat treatment temperature come to be from 500 to 600° C. and that the heat treatment time be from 3 to 6 hours. In addition, when a large amount of hydrogen is included in the amorphous semiconductor layer 102a, it is preferable that heat treatment for crystallization be performed after hydrogen is forced out of the amorphous semiconductor layer 102a by heat treatment at a temperature of from 350 to 500° C. so that the concentration of hydrogen becomes less than or equal to $1 \times 10^{20}$ atoms/cm$^3$.

Subsequently, the crystalline semiconductor layer 102b in the atmosphere is once again crystallized by the methods described in Embodiment Mode 1 and Embodiment Mode 2, and a crystalline semiconductor layer 102c is formed (FIG. 3D). Specifically, a first laser beam and a second laser beam are each made to slant, irradiate the crystalline semiconductor layer 102b, and intersect. The first and second laser beams move relative to the substrate 100 over which the crystalline semiconductor layer 102b is formed so that the substrate 100 is scanned. Because of this, the crystal grains of the crystalline semiconductor layer 102c come to be developed continuously in a direction along the scanning direction. Furthermore, in-plane variations in the crystalline semiconductor layer 102c are suppressed. In addition, the channel direction of the TFT described below becomes approximately the same as the direction along which the crystal grains develop continuously.

Figure 4A:
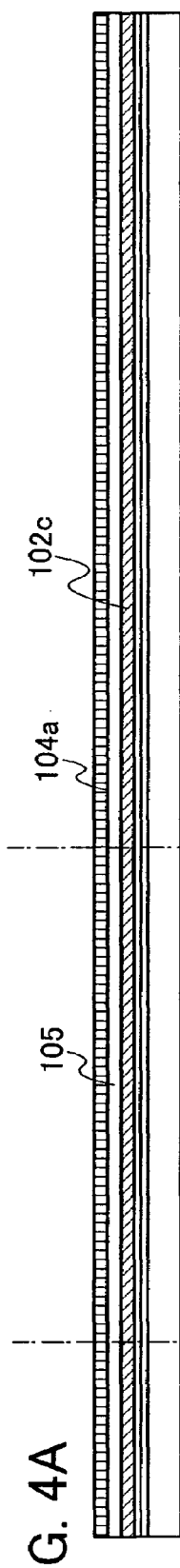
FIGS. 4A to 4D are diagrams used to explain a manufacturing method of a semiconductor device and a light-emitting device related to Embodiment 1.

Next, after an amorphous semiconductor layer 104a containing a semiconductor such as silicon or silicon germanium and a noble gas such as argon (Ar) is formed over the crystalline semiconductor layer 102c, heat treatment is performed (FIG. 4A). Here, providing a thin oxide film 105 of 1 to 10 nm between the crystalline semiconductor layer 102c and the amorphous semiconductor layer 104a is preferable. This oxide film 105 may be an oxide film formed with the crystalline semiconductor layer 102c through irradiation by the previous laser beam or an oxide film formed through treatment of the surface of the crystalline semiconductor layer 102c with ozonated water or the like after the surface has been irradiated with a laser beam. In addition, there are no particular limitations on the method used to form the amorphous semiconductor layer 104a, and a plasma CVD method, a low-pressure CVD method, a sputtering method, a PVD method, or the like may be used. Furthermore, it is preferable that the thickness of the amorphous semiconductor layer 104a be from 20 to 40 nm. In addition, when an RTA method is used for heat treatment, it is preferable that the heat treatment temperature come to be from 600 to 800° C. and that the heat treatment time be from 3 to 9 minutes. When an annealing furnace is used for performing heat treatment, it is preferable that the heat treatment temperature come to be from 500 to 600° C. and that the heat treatment time be from 3 to 6 hours.

Figure 4B:
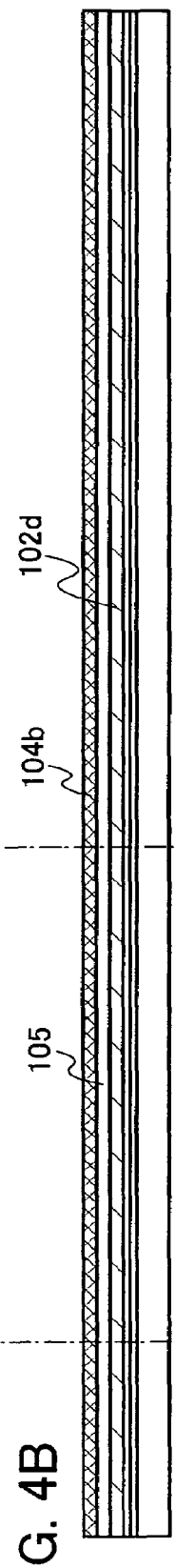

The metallic element that promotes crystallization included in the crystalline semiconductor layer 102c is gettered from the crystalline semiconductor layer 102c to the amorphous semiconductor layer 104a by heat treatment (the crystalline layer 102c is called a crystalline layer 102d after gettering has been performed). Furthermore, with the metallic element that promotes crystallization being gettered to the amorphous semiconductor layer 104a, the amorphous semiconductor layer 104a becomes a semiconductor layer 104b that contains a crystalline component (FIG. 4B).

Figure 4C:
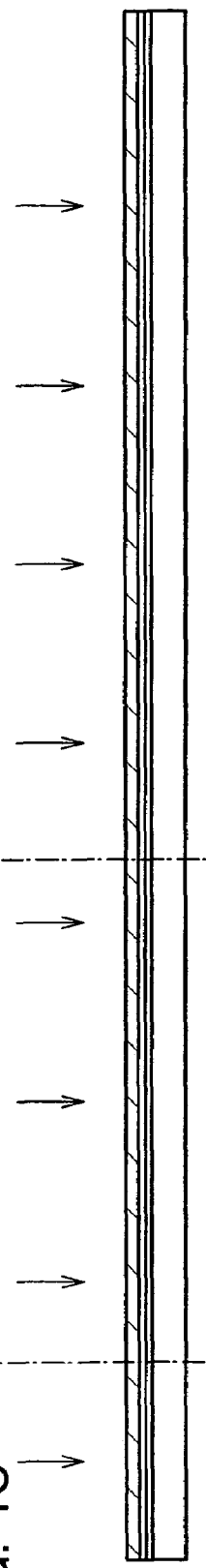

After gettering has been performed, the semiconductor layer 104b is selectively removed by etching. There are no particular limitations on the method used to etch the semiconductor layer 104b, and etching can be performed with a high selection ratio, relative to the oxide film 105, in particular, with tetramethylammonium hydroxide (TMAH) or with a solution such as a choline solution. In this manner, the oxide film 105 functions as a stopper to prevent the crystalline semiconductor layer 102d from being etched when the semiconductor film 104b is etched. When an oxide film such as a natural oxide film is formed over the surface of the semiconductor layer 104b, it is preferable that this oxide layer be removed in advance with a solution containing hydrofluoric acid and then etching of the semiconductor layer 104b be performed. After the semiconductor layer 104b has been removed, the oxide film 105 is removed with a solution containing fluoride or the like (FIG. 4C).

Figure 4D:
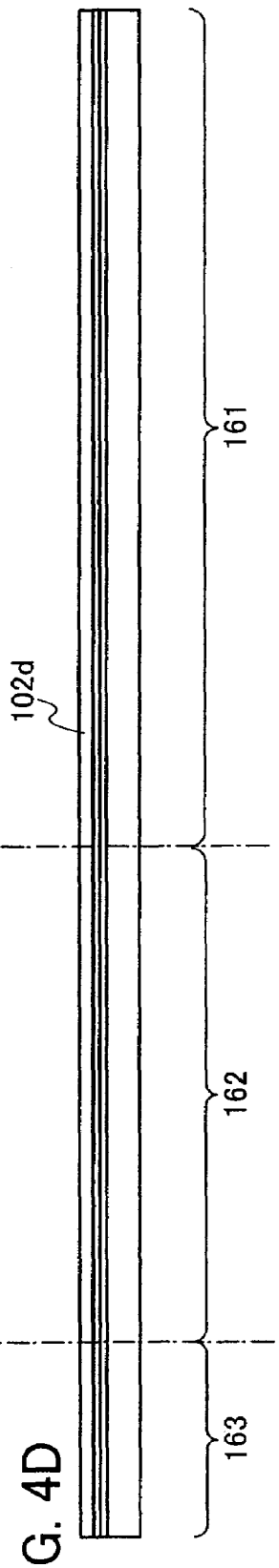

Through the above steps, the crystalline semiconductor layer 102d with extremely low average surface coarseness can be obtained (FIG. 4D). It is to be noted that crystallization of the semiconductor layer may be performed even if the semiconductor layer is not doped with the metallic element that promotes crystallization. In this case, because none of the metallic element is contained in the crystallized semiconductor layer, it is not necessary to perform the steps related to gettering.

In addition, the crystalline semiconductor layer 102c may be formed by omission of the heat treatment used for forming the crystalline semiconductor layer 102b and use of the method described in Embodiment Mode 1 or Embodiment Mode 2 to crystallize the amorphous semiconductor layer 102a. Furthermore, the step for doping with the metallic element 103 and the step for gettering the metallic element 103 may be omitted.

Subsequently, the crystalline semiconductor layer 102d is processed into a desired shape, and island-shaped semiconductor layers 106a to 106c are formed (FIG. 5A). There are no particular limitations on the method used to process the crystalline semiconductor layer 102d, and a method in which, for example, a resist mask is formed over the crystalline semiconductor layer 102d and then unnecessary sections are removed by etching can be used. Furthermore, there are no particular limitations on the method used to form the resist mask, and, in addition to a photolithography method, a method in which a mask of the desired shape is drawn while, as in an inkjet printing method, the timing and position of droplet discharge are being controlled may be used. Furthermore, there are no particular limitations on the method of etching, and etching may be performed using either a dry etching method or a wet etching method.

In addition, the semiconductor layers 106a to 106c may be doped with an impurity in order to control the threshold voltage of the TFT. There are no particular limitations on the impurity used, and an impurity imparting n-type conductivity, such as phosphorous or arsenic, may be used or an impurity imparting p-type conductivity, such as boron, may be used. In addition, there are no particular limitations on the timing of doping with the impurity for controlling the threshold voltage, and the impurity may be added after the crystalline semiconductor layer 102d is formed and before the semiconductor layers 106a to 106c are formed, or the impurity may be added after the semiconductor layers 106a to 106c are formed and before the subsequent step in which a gate insulating layer 107 is formed. Furthermore, the impurity in this step may be added to the whole of the semiconductor layers 106a to 106c (or to the whole of the crystalline semiconductor layer 102d), or the impurity may be added using a resist to mask a portion so that the impurity is added to a portion.

Subsequently, the gate insulating layer 107 is then formed so as to cover the semiconductor layers 106a to 106c (FIG. 5B). There are no particular limitations on the method used to form the gate insulating layer 107, and the gate insulating layer 107 may be formed using a film formation method such as a plasma CVD method, a low-pressure CVD method, a sputtering method, a PVD method, or the like. Moreover, the gate insulating layer 107 may be formed by oxidation of a surface of each of the semiconductor layers 106a to 106c. In addition, the gate insulating layer 107 may be formed using silicon oxide, silicon nitride, silicon oxide containing nitrogen, silicon nitride containing oxygen, or the like. Furthermore, the gate insulating layer 107 may be either a layer that is a single layer or a layer that is made up of different materials layered as a multi-layer.

Subsequently, gate electrodes 111a to 111d and a capacitor electrode 111e are formed over the gate insulating layer 107 (refer to FIG. 6B). There are no particular limitations on the structure or method of forming the gate electrodes; however, the method used in the present embodiment to form a first conductive layer and the gate electrodes 111a to 111d and capacitor electrode 111e made up of a stacked layer of the first conductive layer and a second conductive layer will be described below with reference to FIGS. 5B, 6A, and 6B.

First, a first conductive layer 108 is formed over the gate insulating layer 107, then, a second conductive layer 109 is formed over the first conductive layer 108 (FIG. 5B). It is preferable that the first conductive layer 108 and the second conductive layer 109 each be formed using a different conductive material. It is preferable that the first conductive layer 108 be formed of a conductive material having good adhesion to the gate insulating layer 107, and forming the first conductive layer 108 using, for example, titanium nitride, tantalum nitride, titanium, tantalum, or the like is preferable. In addition, it is preferable that the second conductive layer 109 be formed of a conductive material with low resistivity, and forming the second conductive layer 109 using, for example, tungsten (W), molybdenum (Mo), aluminum (Al), copper (Cu), an alloy containing one of these metals as the main component, a metallic compound, or the like is preferable. An alloy of aluminum and silicon, an alloy of aluminum and neodymium, or the like can be given for the alloy. In addition, tungsten nitride or the like can be given for the metallic compound. There are no particular limitations on the method used to form the first conductive layer 108 and the second conductive layer 109, and a sputtering method, a vapor deposition method, or the like may be used.

Figure 6A:
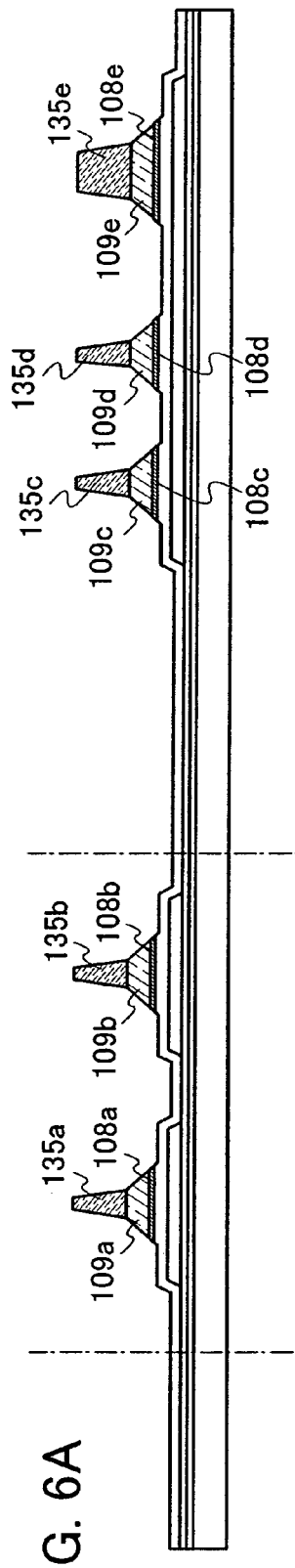
FIGS. 6A to 6C are diagrams used to explain a manufacturing method of a semiconductor device and a light-emitting device related to Embodiment 1.

Subsequently, a mask 135a, a mask 135b, a mask 135c, a mask 135d, and a mask 135e are formed over the second conductive layer 109. Then, the first conductive layer 108 and the second conductive layer 109 are etched, and a first conductive layer 108a, a first conductive layer 108b, a first conductive layer 108c, a first conductive layer 108d, a first conductive layer 108e, a second conductive layer 109a, a second conductive layer 109b, a second conductive layer 109c, a second conductive layer 109d, and a second conductive layer 109e are each formed so that the side walls of each conductive layer slant away from the horizontal surface of each conductive layer (FIG. 6A).

Figure 6B:
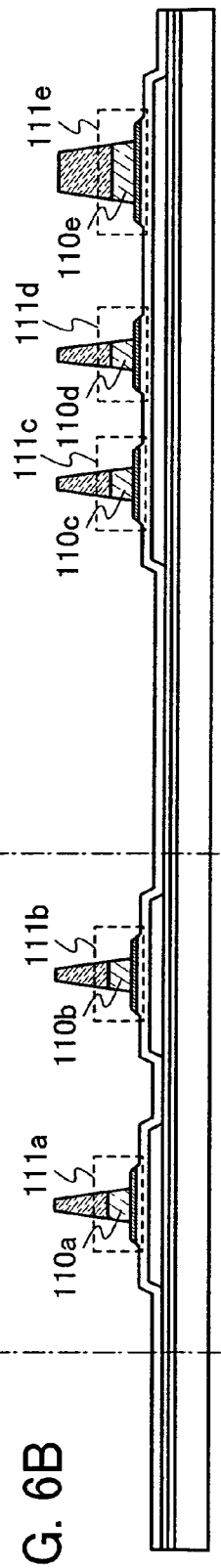

Subsequently, with the masks 135a through 135e left remaining, the second conductive layers 109a through 109e are etched as selected, and a second conductive layer 110a, a second conductive layer 110b, a second conductive layer 110c, a second conductive layer 110d, and a second conductive layer 110e are formed (FIG. 6B). At this time, it is preferable that the second conductive layers 110a through 110e be etched and processed so that the side walls of each conductive layer are perpendicular to the horizontal surfaces of each conductive layer under a highly anisotropic condition. In this way, the slanted portions of the side walls of the second conductive layers 109a through 109e are removed. In this way, each of the second conductive layers 110a to 110e, the width of each of which is shorter than the width of each of the first conductive layers 108a to 108e, respectively, are provided over each of the first conductive layers 108a to 108e, whereby the gate electrodes 111a to 111d and the capacitor electrode 111e made from the combination of each of the first conductive layers 108a to 108e with each of the second conductive layers 110a to 110e, respectively, can be formed.

In addition, after the masks 135a to 135e have each been formed into the desired shape, the masks can be made thinner through ashing. An electrode of more minute shape can be formed by the use of such a mask, and a TFT with a short channel length can be obtained, accordingly. A high-speed operating circuit can become attainable through the manufacture of a TFT with a short channel length.

Figure 6C:
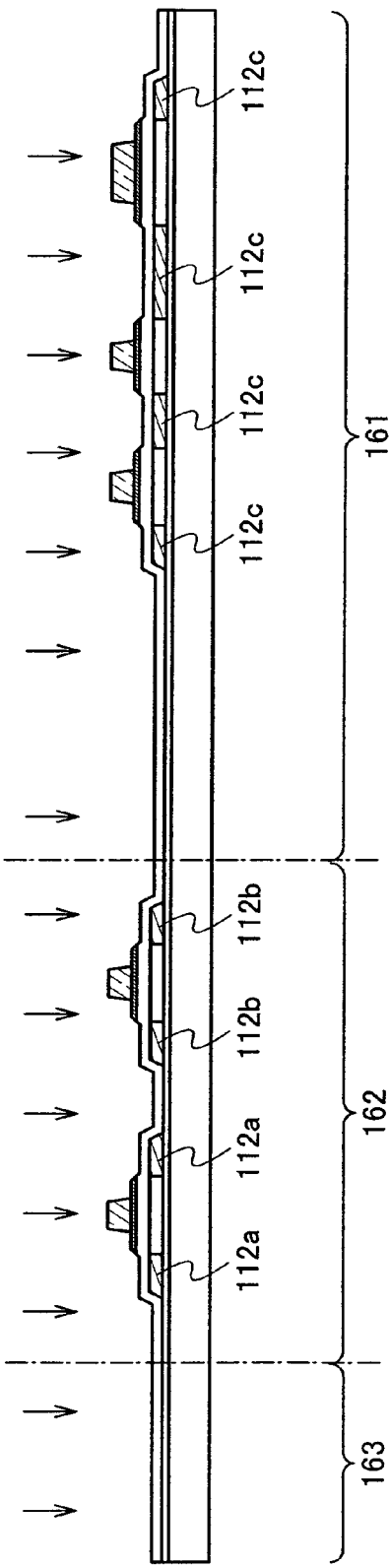

Next, the gate electrodes 111a to 111d and the capacitor electrode 111e are used as masks, an impurity element imparting n-type conductivity is added, and a first n-type impurity region 112a, a first n-type impurity region 112b, and a first n-type impurity region 112c are formed. There are no particular limitations on the impurity element imparting n-type conductivity, and phosphorus, arsenic, or the like can be used. After the first n-type impurity regions 112a to 112c have been formed, the masks 135a to 135e are removed (FIG. 6C).

After the masks 135a to 135e have been removed, a mask 136a used to cover the semiconductor layer 106a and a mask 136b used to cover the semiconductor layer 106c are formed. The mask 136a and mask 136b, the first conductive layer 108b, and the second conductive layer 110b act as masks, and the semiconductor layer 106b is further doped with an impurity element imparting n-type conductivity, whereby a second n-type impurity region 113a is formed in a region that overlaps the first conductive layer 108b and a third n-type impurity region 114a is formed in a region that does not overlap either the first conductive layer 108b or the second conductive layer 110b (FIG. 7A). The third n-type impurity region 114a formed in this way functions as a source or drain of a TFT or has the function of connecting a TFT to a capacitor. The second n-type impurity region 113a, which has the same conductivity type as the third n-type impurity region 114a but a lower concentration than the third n-type impurity region 114a, is formed between the third n-type impurity region 114a, which functions as a source or drain, and a channel forming region 115a, overlapping the gate electrode 111b, whereby an n-channel TFT 152 with excellent resistance to hot carrier deterioration can be obtained. In addition, a region sandwiched by the second n-type impurity regions 113a functions as the channel forming region 115a.

Figure 13A:
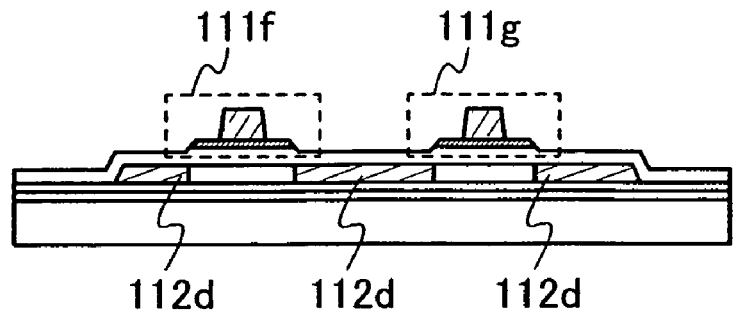
FIGS. 13A to 13C are diagrams used to explain a manufacturing method of a semiconductor device and a light-emitting device related to Embodiment 1.
Figure 13B:
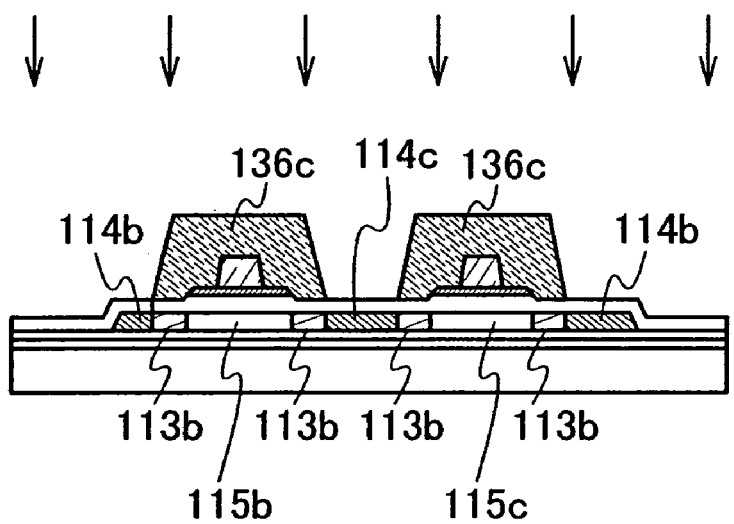
Figure 13C:
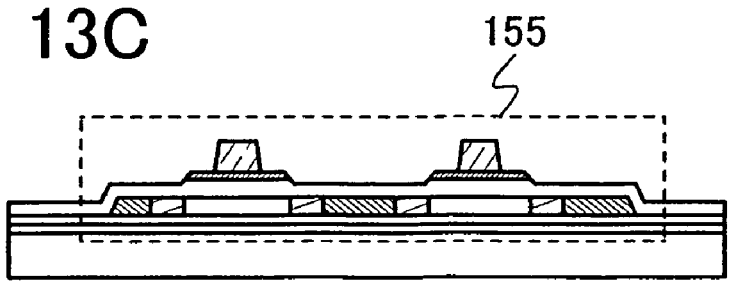

In addition, as shown in FIGS. 13A to 13C, a portion of the first n-type impurity region 112d that does not overlap the gate electrode may be covered with a mask 136c. If the process is performed as thus described, the second impurity region 113b, which has the same conductivity type as third n-type impurity regions 114b and 114c but a lower concentration than the third n-type impurity regions 114b and 114c, is formed between the third n-type impurity regions 114b and 114c, which each function as a source or drain, and channel forming regions 115b and 115c, overlapping gate electrodes 111f and 111g, can be formed. In this way, an n-channel TFT 155 capable of reducing off leak current can be obtained. It is to be noted that the gate electrode 111f and gate electrode 111g of the TFT 155 are connected to each other electrically so that the same voltage is applied to both with the same timing. That is to say, the TFT 155 is a double-gate TFT with two channel forming regions 115b and 115c.

Subsequently, as shown in FIG. 7B, after the masks 136a and 136b have been removed, a mask 137 used to cover the semiconductor layer 106b is formed. Next, the mask 137 and the second semiconductor layers 110a and 110c to 110e are used as masks, the semiconductor layers 106a and 106c are doped with an impurity element imparting p-type conductivity, and second p-type impurity regions 117a, 117b, and 117c are formed in regions not overlapping the first conductive layers 108a and 108c to 108e along with first p-type impurity regions 116a and 116b being formed in regions overlapping each of the first semiconductor layers 108a and 108c to 108e. The second p-type impurity regions 117a, 117b, and 117c that are provided in this way become a source or drain of a TFT or have the function of connecting a TFT to a capacitor.

In this way, p-channel TFTs 151 and 153 and a capacitor 154 can be obtained (refer to FIG. 8A). It is to be noted that a region sandwiched by the first p-type impurity region 116a of the TFT 151 functions as a channel forming region 118a. Furthermore, the gate electrode 111c and gate electrode 111d of the TFT 153 are connected to each other electrically so that the same voltage is applied to both with the same timing, making the TFT 153 a double-gate TFT with two channel forming regions 118b and 118c. In addition, for the step in which an impurity element imparting p-type conductivity is added, in order that an impurity element imparting p-type conductivity with a higher concentration than that of the impurity element contained in the first n-type impurity regions 112a and 112c formed previously be added, n-type conductivity is cancelled.

Next, the mask 137 is removed. The process is performed as above, and a semiconductor device which includes the TFT 153 and capacitor 154 used for a pixel portion 161 and the TFTs 151 and 152 used for a driver circuit portion 162 can be manufactured (FIG. 8A). In addition to the pixel portion 161 and the driver circuit portion 162, the semiconductor device also has a terminal portion 163, which is formed under the steps described below and used to input an external signal. In addition, there are no particular limitations on the structure of the TFT, and the TFT may be a multi-gate TFT which has a structure in which a semiconductor layer is sandwiched between two gate electrodes, for example, or the TFT may be a single-drain TFT in which an impurity region functioning as a source or drain is adjacent to a channel forming region (a region with a lower concentration than that of the impurity region functioning as a source or drain is not included between the impurity region and the channel forming region).

The channel directions of each of the channel forming regions 118a and 115a of the TFTs 151 and 152 and the channel forming regions 118b and 118c of the TFT 153 are arranged in approximately the same direction as the direction in which the crystal grains of a crystalline semiconductor layer extend. For this reason, the crystal grain boundaries of each of the channel forming regions 115a, 118a, 118b, and 118c become hardly included, and energy barriers against carriers, such as electrons or holes, become low. As a result, the mobility of the TFTs 151, 152, and 153 becomes several hundreds of $cm^2/(V \cdot s)$, for example. In addition, because in-plane variations in a crystalline semiconductor layer can be suppressed, the generation of variations in the properties of a TFT can be suppressed.

Subsequently, first interlayer insulating layers 119a, 119b, and 119c are sequentially formed so as to cover the TFTs 151, 152, and 153 and the capacitor 154 (FIG. 8B). The first interlayer insulating layer 119a can be formed using an insulator such as silicon oxide or silicon nitride. Here, nitrogen and oxygen may be included in silicon oxide and silicon nitride, respectively. Furthermore, in addition to being formed from inorganic insulators such as silicon oxide, silicon nitride, or the like, the first interlayer insulating layer 119a may be formed using a compound of one or two or more chosen from an organic insulator such as acryl or polyimide, an insulating film that includes an Si—O—Si combination formed using siloxane-based materials as starting materials, or the like. The skeleton structure of the siloxane may be formed of a combination of silicon (Si) and oxygen (O). A substituent is an organic group containing at least hydrogen (for example, an alkyl group or an aromatic hydrocarbon). The substituent may be a fluoro group. Alternatively, an organic group containing at least hydrogen and a fluoro group may be used as a substituent. The materials of the first interlayer insulating film are the same.

In addition, there are no particular limitations on the method used to form the first interlayer insulating layers 119a, 119b, and 119c, and a plasma CVD method, a low-pressure CVD method, a sputtering method, a PVD method, or the like may be used as a method for forming the first interlayer insulating layers 119a, 119b, and 119c. Furthermore, the first interlayer insulating layer of the present embodiment is multi-layered, stacked with the three layers of 119a, 119b, and 119c; however, there are no particular limitations on the number of stacked layers for the first interlayer insulating layer, and the first interlayer insulating layer may be single-layer or multilayer with two or more layers.

In addition, it is preferable that at least one of the first interlayer insulating layers 119a, 119b, and 119c be an insulating layer containing hydrogen. For the insulating layer containing hydrogen, a layer made up of silicon nitride formed using a plasma CVD method with a SiH$_4$ gas, a NH$_3$ gas, a N$_2$O gas, or an H$_2$ gas, for example, used as the source gas is given. In addition to hydrogen, oxygen may also be included in the silicon nitride formed as thus described. At least one of the layers of the first interlayer insulating layers 119a, 119b, and 119c is an insulating layer containing hydrogen, whereby hydrogenation used to terminate a dangling bond included in the semiconductor films 106a to 106c, which hydrogen contained in the insulating layer, is made possible. Thus, it is not necessary to perform hydrogenation in the hydrogen gas-filled atmosphere inside a furnace, for example, and so, hydrogenation becomes simple and easy to perform. Furthermore, when silicon nitride containing hydrogen is used for the first interlayer insulating layer, it is preferable that a layer formed of silicon oxide or silicon oxide containing nitrogen be formed between the layer formed of the silicon nitride containing hydrogen and the TFT. When the first interlayer insulating layer is made up of the three layers of 119a, 119b, and 119c, as in this embodiment, it is preferable that the first interlayer insulating layer 119a be formed of silicon oxide or silicon oxide containing nitrogen, the first interlayer insulating layer 119b be formed of silicon nitride containing hydrogen (oxygen may be further included), and the first interlayer insulating layer 119c be formed of silicon oxide or silicon oxide containing nitrogen. If light emitted from a light-emitting element passing through the first interlayer insulating layers 119a, 119b, and 119c is ejected to external, for example, the first interlayer insulating layers 119a, 119b, and 119c can be used for optical path length adjustment to regulate the length of the optical path of the emitted light.

In addition, either before any of the first interlayer insulating layers 119a, 119b, and 119c have been formed or else after, it is preferable that treatment be performed to activate the previously doped impurity element imparting n-type or p-type conductivity. There are no particular limitations on the treatment method used, and treatment may be performed using an annealing furnace or using an RTA method or laser irradiation.

Next, an opening reaching the semiconductor layers 106a through 106c is formed in the first interlayer insulating layers 119a, 119b, and 119c. Furthermore, after a conductive layer is formed to cover the opening and the interlayer insulating layer 119c, this conductive layer is processed into a desired shape, and wirings 120f and 120g are formed in the pixel portion 161, wirings 120b through 120e are formed in the driver circuit portion 162, and a wiring 120a is formed in the terminal portion 163 (FIG. 9A).

There are no particular limitations on the method used for forming the opening, and after a mask is formed over the interlayer insulating layer 119c using a resist or the like, the opening may be formed by etching of the first interlayer insulating layers 119a, 119b, and 119c. There are no particular limitations on the method used here for etching, and either a wet etching method or a dry etching method may be used.

In addition, the conductive layer may be single-layer or multilayer, but it is preferable that at least one layer be a layer formed of a metal that has high conductivity, such as aluminum or copper, or from an alloy, such as an alloy of aluminum and neodymium or the like. Here, the aluminum may contain silicon. In addition, when the conductive layer is multilayer, it is preferable that layers of a metal nitride such as titanium nitride or tantalum nitride formed so as to sandwich the layer formed from a metal with high conductivity be provided. Also, included in the wirings 120a through 120g is a conductive layer formed to function as a connector for connecting electrically to a wiring or an electrode formed in a different layer.

Subsequently, a second interlayer insulating layer 121 is formed so as to cover the wirings 120a through 120g (FIG. 9B). The second interlayer insulating layer 121 can be formed of a insulator such as silicon oxide or silicon nitride. Here, the silicon oxide and silicon nitride may each contain nitrogen and oxygen, respectively. Furthermore, in addition to being formed from inorganic insulators such as silicon oxide, silicon nitride, or the like, the second interlayer insulating layer 121 may be formed using a compound of one or two or more chosen from an organic insulator such as acrylic or polyimide, siloxane, or the like. In addition, there are no particular limitations on the method used to form the second interlayer insulating layer 121, and the second interlayer insulating layer 121 may be formed using a film formation method such as a plasma CVD method, a low-pressure CVD method, a sputtering method, a PVD method, or the like. Furthermore, the second interlayer insulating layer 121 in the present embodiment is single-layer, but the second interlayer insulating layer 121 is not limited to being single-layer and may be multilayer with two or more layers.

Subsequently, an opening is provided that passes through the second interlayer insulating layer 121 and reaches the wiring 120f, and the second interlayer insulating layer 121 is etched selectively so that the wiring 120a is exposed. After a mask formed from a resist or the like is formed over the second interlayer insulating layer 121, etching by a wet etching method or dry etching method or the like may be performed.

Next, an electrode 122 of a light-emitting element is formed over the second interlayer insulating layer 121 (FIG. 10A). There are no particular limitations on the material used to form the electrode 122 of a light-emitting element, and the electrode 122 of a light-emitting element may be formed of an oxide semiconductor such as indium tin oxide, indium zinc oxide, or zinc oxide or a conductor such as aluminum, gold, or platinum. There are no particular limitations on the method used to form the electrode 122 of a light-emitting element, and, for example, after a mask formed from a resist or the like is formed over a layer formed using the oxide semiconductor or conductor, which is formed over the second interlayer insulating layer 121, the layer formed using the oxide semiconductor or conductor is etched, and the layer may be processed into the desired shape.

Subsequently, an insulating layer 123 is formed to cover a terminal of the electrode 122 of a light-emitting element (FIG. 10B). The insulating layer 123 can be formed of an inorganic insulator such as silicon oxide, silicon nitride, or the like, an organic insulator such as acrylic, polyimide, resist, or the like, or a siloxane or the like, and it is preferable that, of those listed, a photo-sensitive resin such as a photo-sensitive acryl, a photo-sensitive polyimide, or a resist be used to form the insulating layer 123. By use of a photolithography method, the insulating layer 123 using the photo-sensitive resin can be formed into the desired shape, a shape with rounded edges; as a result, deterioration of a light-emitting element can be reduced. In addition, because the insulating layer 123 is not formed over the wiring 120a, the wiring 120a remains exposed.

Subsequently, a light-emitting layer 124 is formed over the electrode 122 of a light-emitting device and the insulating layer 123 (FIG. 11A). The light-emitting layer 124 may be formed of one of either an organic material or an inorganic material, or the light-emitting layer 124 may be formed of both an organic material and an inorganic material. Furthermore, the light-emitting layer 124 may be single-layer, or the light-emitting layer 124 may be multilayer made up of a layer including a material presenting light of the desired wavelength (a light-emitting material) as well as a hole-transporting layer, an electron-transporting layer, a hole-injecting layer, an electron-injecting layer, and the like. In addition, when the light-emitting layer is multilayer, after any one of a layer formed of an organic material with high conductivity such as PEDOT or the like, a layer in which a material with a high hole-transporting property and a material with an electron-accepting property with respect to the above material is mixed, or a layer in which a material with a high electron-transporting property and a material with a high electron-donating property with respect to the above material is provided over the electrode 122 of a light-emitting device, it is preferable that other layers, such as a layer containing a light-emitting material, a hole-transporting layer, an electron-transporting layer, or the like, be formed. Because it is difficult to invite an increase in drive voltage of a light-emitting element even if the thicknesses of the layer formed of an organic material with high conductivity such as PEDOT (polyethylene dioxythiophene) or the like, a layer in which a material with a high hole-transporting property and a material with an electron-accepting property with respect to the above material is mixed, or a layer in which a material with a high electron-transporting property and a material with a high electron-donating property are mixed are thick, unevenness in the surface of the electrode 122 of a light-emitting element is reduced and short-circuits between the electrodes of a light-emitting element can be prevented. In addition, the light-emitting material may emit light by fluorescence or by phosphorescence.

In addition, the light-emitting layer 124 may be formed so that there is a different light-emitting element for each color, or the light-emitting layer 124 may be formed so that the same luminescent color is presented, ranging across one layer. When the same luminescent color is presented, the light-emitting layer 124 may be combined with a color filter or the like in order that light drawn from the light-emitting device to external is a different color for each pixel.

Subsequently, an electrode 125 of a light-emitting element is formed over the light-emitting layer 124 (FIG. 11A). There are no particular limitations on the material used to form the electrode 125 of a light-emitting element, and the electrode 125 of a light-emitting element may be formed of an oxide semiconductor such as indium tin oxide, indium zinc oxide, or zinc oxide or of a conductor such as aluminum, gold, or platinum. It is preferable that at least one of either the electrode 122 of a light-emitting element or the electrode 125 of a light-emitting element be formed of a transparent conductor such as indium tin oxide, indium zinc oxide, zinc oxide, or the like so that light emitted from the light-emitting layer 124 can be transmitted.

Figure 12:
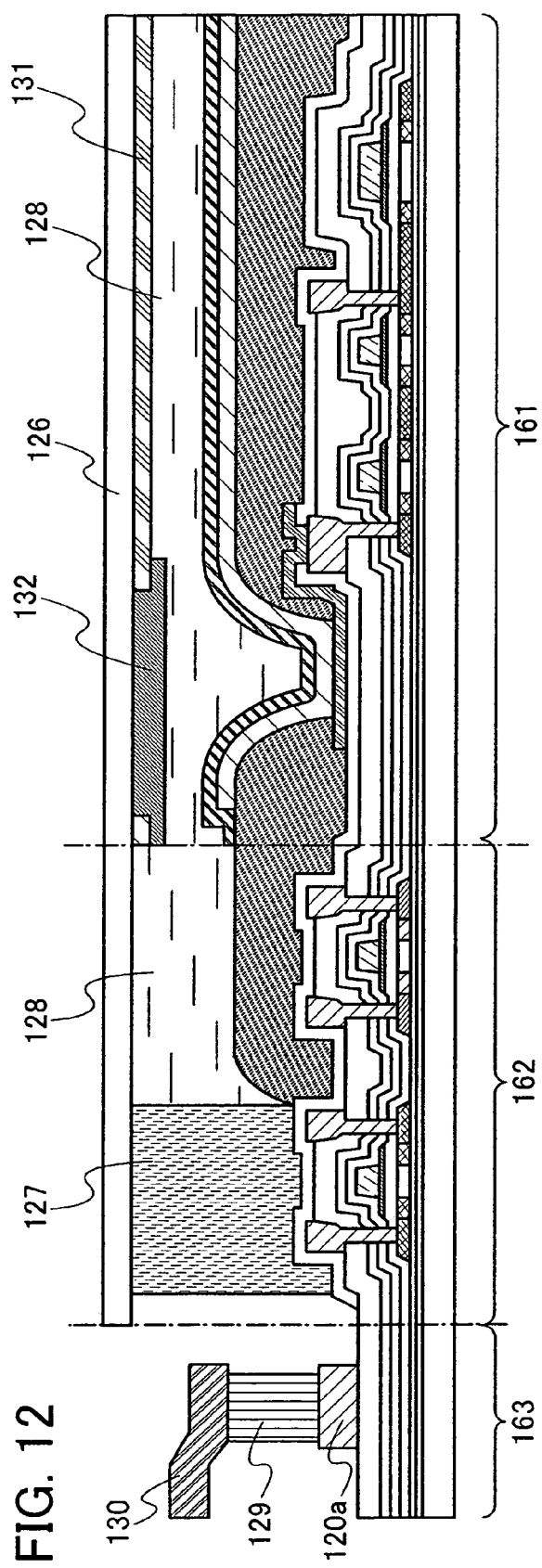
FIG. 12 is a diagram used to explain a manufacturing method of a semiconductor device and a light-emitting device related to Embodiment 1.

Subsequently, the substrate 100 and the substrate 126 are attached to each other using a sealant 127 so that the previously formed TFT and light-emitting element are encapsulated. As shown in FIG. 12, a light-shielding layer 131 and a color filter 132 may be provided on the substrate 126. Furthermore, an internal portion 128, sealed by the substrate 100 and the substrate 126, may be filled with an inert gas such as a nitrogen gas or an argon gas or filled with a resin material or the like. A desiccant may be included in the resin materials used to fill the internal portion 128.

Subsequently, a conductive adhesive 129 is used to connect an FPC (flexible printed circuit) 130 to the wiring 120a (FIG. 11B and FIG. 12).

If the above is performed, a light-emitting device can be manufactured. As described above, the channel direction of the TFT of the light-emitting device is approximately the same direction as the direction in which the crystal grains of the crystalline semiconductor layer 102c extend. Because of this, the mobility of the TFT increases. In addition, because in-plane variations in the crystalline semiconductor layer 102c can be suppressed, the generation of variations in the properties of the TFT can be suppressed, as well.

Thus, the response characteristic of the light-emitting device improves, and the generation of in-plane variations in light-emitting quality can be suppressed. In addition, in the present embodiment, the method of forming the light-emitting device was described; however, if the steps after the step of forming the electrode 122 of a light-emitting element and the circuit configuration are changed appropriately, a liquid crystal device or the like can also be manufactured.

Embodiment 2

One mode of a pixel portion of a light-emitting device which is manufactured by the manufacturing method described in Embodiment 1 will be described with reference to FIG. 14, which is a top view.

Figure 14:
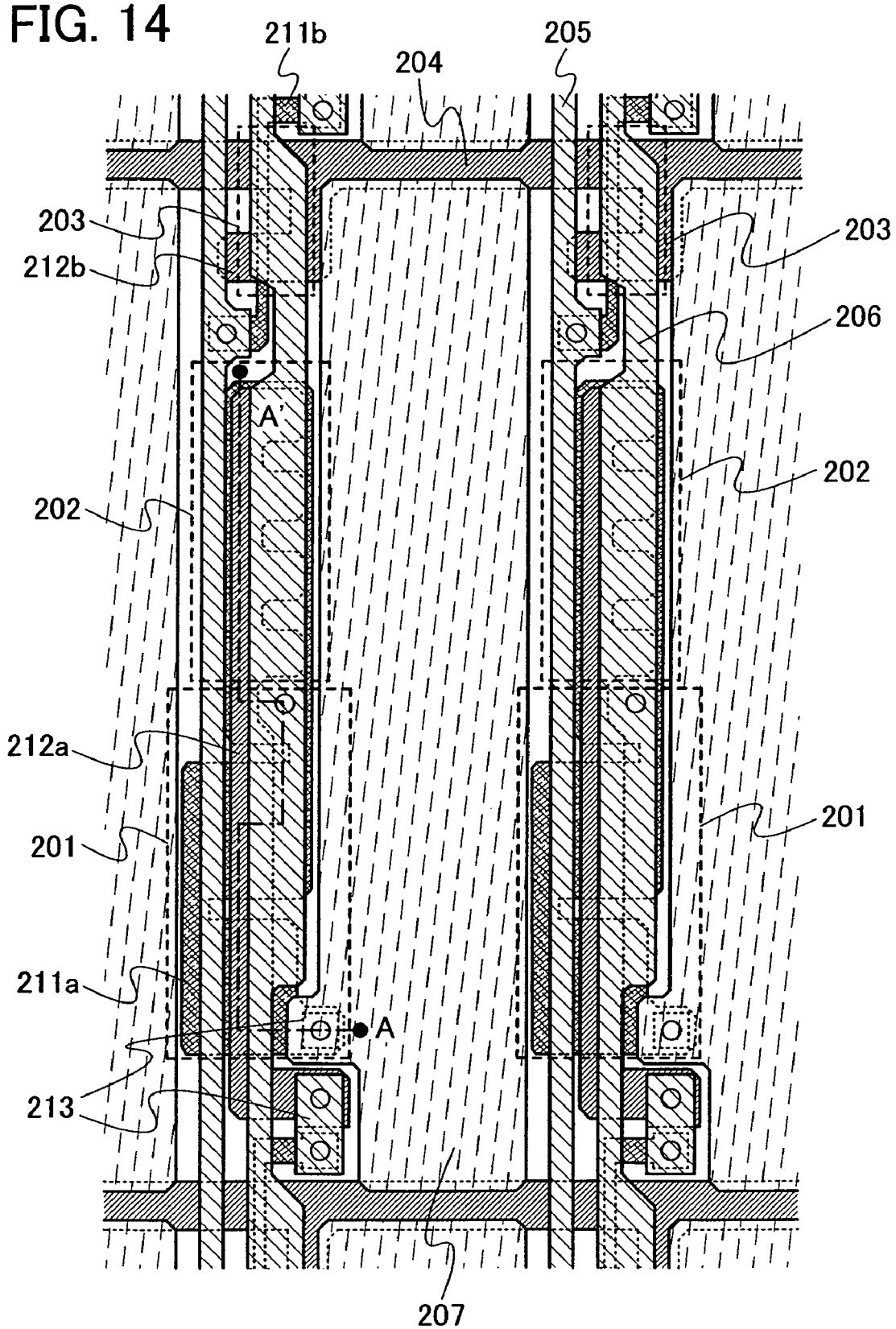
FIG. 14 is a top view showing a pixel portion of a light-emitting device related to Embodiment 2.

A cross section taken along a dashed line A-A' in FIG. 14 corresponds to a cross-sectional view of the pixel portion 161 in FIG. 10B. In FIG. 14, the insulating layer 123 covering an end portion of the electrode 122 of a light-emitting element is not shown; however, it is, in fact, provided. As shown in FIG.

14, a semiconductor layer 211a overlaps a first conductive layer 212a including a region serving as a gate electrode and a capacitor electrode, and a TFT 201 corresponding to the TFT 153 in FIG. 10B and a capacitor 202 corresponding to the capacitor 154 are provided.

The first conductive layer 212a is connected to an electrode 207 of a light-emitting element (corresponding to the electrode 122 of the light-emitting element of FIG. 10B) through a second conductive layer 213. In addition, a gate line 204 is formed in the same layer as the first conductive layer 212a. Furthermore, a source line 205 and a current supply line 206 are provided so as to intersect with the gate line 204. The source line 205 is connected to a source of a TFT 203 which includes each of a semiconductor layer 211b and a third conductive layer 212b. It is to be noted that the third conductive layer 212b is provided in the same layer as the gate line 204 and the first conductive layer 212a and connected to the gate line 204.

In addition, part of the gate line 204 is provided so as to serve as a gate electrode of the TFT 203. The current supply line 206 is connected to the semiconductor layer 211a so that a current is supplied to the light-emitting element when the TFT 201 is turned on. It is to be noted that, in this embodiment, components may also be electrically connected to each other through another conductive layer (in this embodiment, a fourth conductive layer 214) as in the case of a connection between the semiconductor layer 211b and the first conductive layer 212a. Furthermore, in this embodiment, a portion of the first conductive layer 212a, which serves as an electrode of the capacitor 202, has an uneven sawtooth-shape. With this portion formed into such a shape, electric charges are easily accumulated in the capacitor 202.

Figure 15:
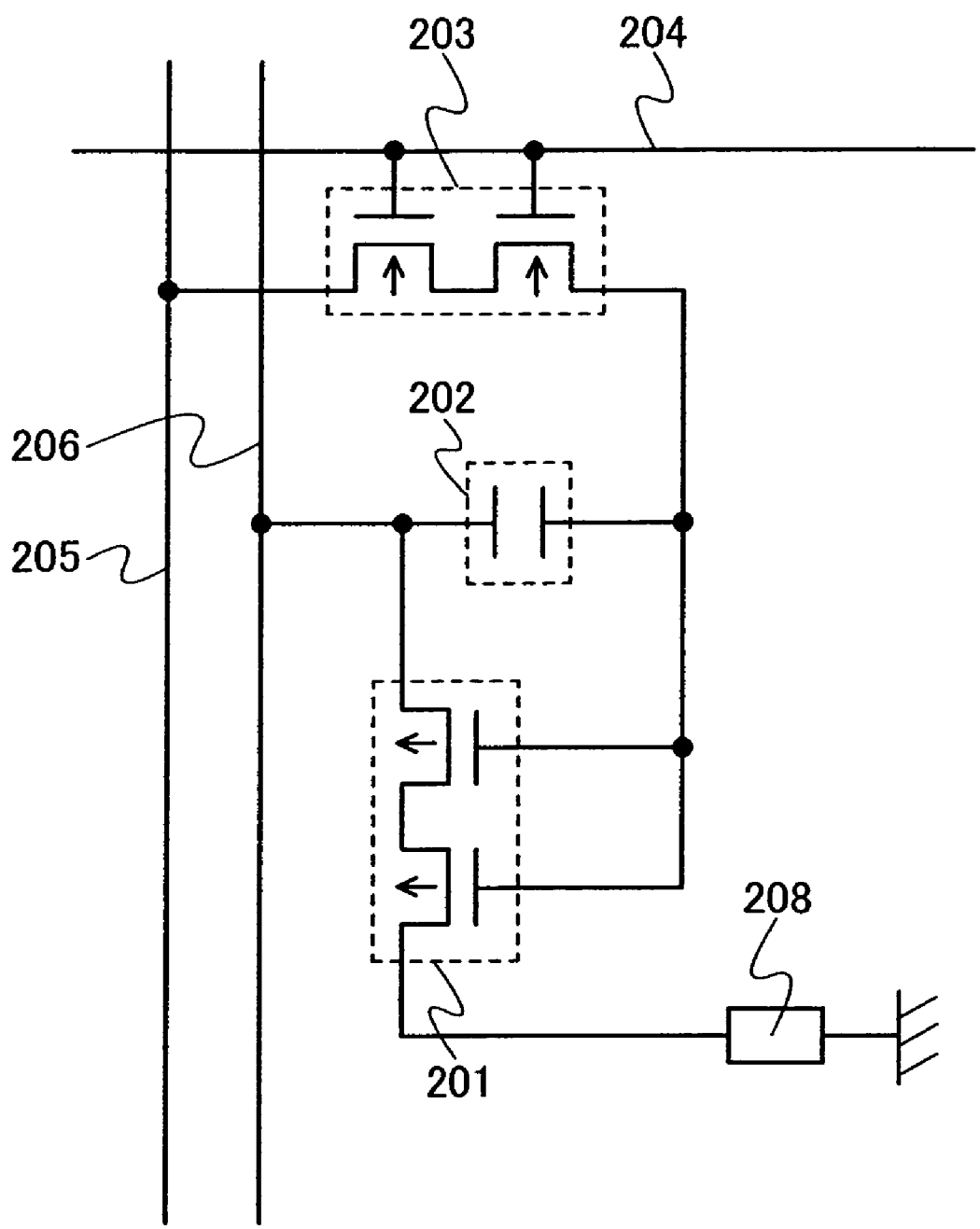
FIG. 15 is a circuit diagram of FIG. 14.

The TFTs 201 and 203, the capacitor 202, the gate line 204, the source line 205, and the current supply line 206 are connected as shown in FIG. 15, which is a circuit diagram. It is to be noted that a light-emitting element 208 includes the electrode 207 of the light-emitting element of FIG. 14. The light-emitting element 208 is a diode type element. When the TFT 201 connected in series with the light-emitting element 208 is a p-channel TFT as in this embodiment, the electrode 207 of the light-emitting element serves as an anode. On the other hand, when the TFT 201 is an n-channel TFT, the electrode 207 of the light-emitting element 208 serves as a cathode.

In a pixel portion of a light-emitting device of the present invention, a plurality of light-emitting elements, which are driven by a circuit as shown in FIG. 15, are provided in a matrix. A circuit for driving a light-emitting element is not limited to the circuit shown in FIG. 15, and, for example, a circuit having a configuration provided with an erasing TFT, which is used for an erasing line and erasing operation to forcibly erase an input signal, or the like may also be employed.

Embodiment 3

In this embodiment, electronic devices utilizing the structure described in Embodiment 1 or 2 will be explained with reference to FIGS. 16A to 16E.

Figure 16A:
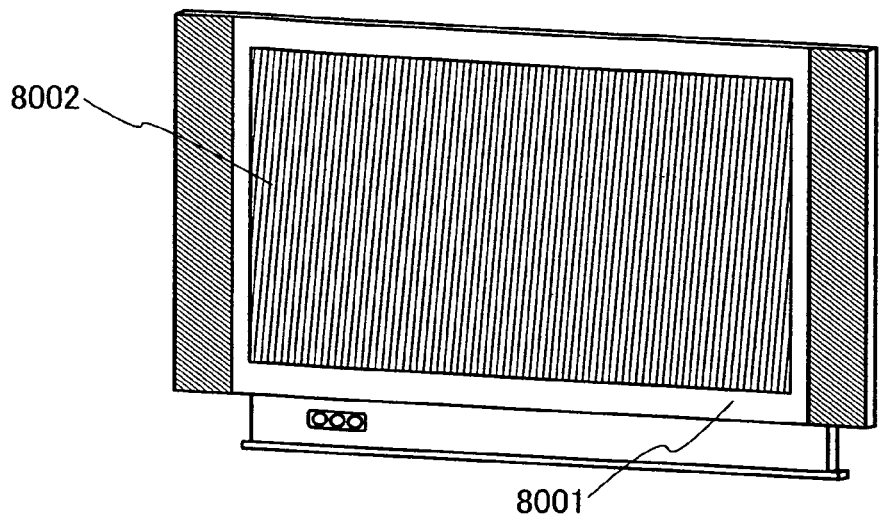
FIGS. 16A to 16E are perspective diagrams each showing an electronic device related to Embodiment 3.

A television shown in FIG. 16A includes a main body 8001, a display portion 8002, and the like. The display portion 8002 has the display device described in Embodiment 1 or 2. In this display device, variations in the properties of a TFT used for driving a pixel are suppressed. Accordingly, a television in which variations in the display are suppressed can be provided.

Figure 16B:
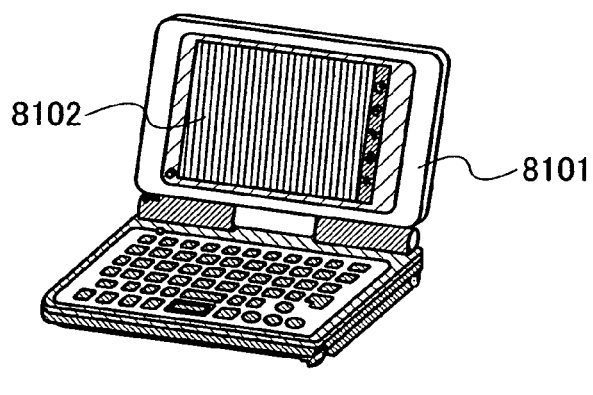

An information terminal device shown in FIG. 16B includes a main body 8101, a display portion 8102, and the like. The display portion 8102 has the display device described in Embodiment 1 or 2. In this display device, variations in the properties of a TFT used for driving a pixel are suppressed. Accordingly, an information terminal device in which variations in the display are suppressed can be provided.

Figure 16C:
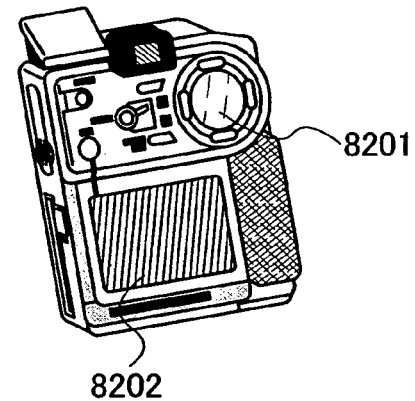

A video camera shown in FIG. 16C includes a main body 8201, a display portion 8202, and the like. The display portion 8202 has the display device described in Embodiment 1 or 2. In this display device, variations in the properties of a TFT used for driving a pixel are suppressed. Accordingly, a video camera in which variations in the display are suppressed can be provided.

Figure 16D:
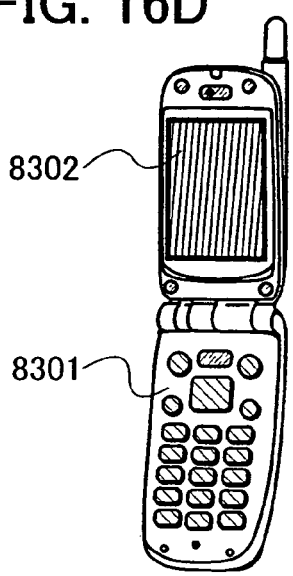

A telephone shown in FIG. 16D includes a main body 8301, a display portion 8302, and the like. The display portion 8302 has the display device described in Embodiment 1 or 2. In this display device, variations in the properties of a TFT used for driving a pixel are suppressed. Accordingly, a telephone in which variations in the display are suppressed can be provided.

Figure 16E:
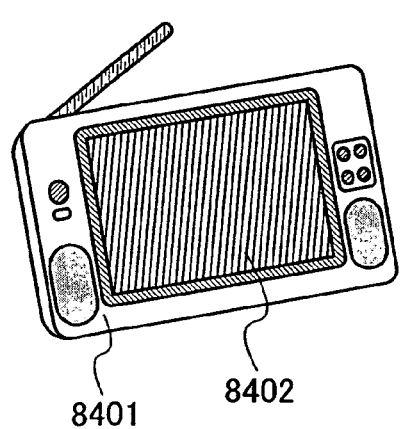

A portable television shown in FIG. 16E includes a main body 8401, a display portion 8402, and the like. The display portion 8402 has the display device described in Embodiment 1 or 2. In this display device, variations in the properties of a TFT used for driving a pixel are suppressed. Accordingly, a portable television in which variations in the display are suppressed can be provided. In addition, the light-emitting device of the present invention can be widely applied to various televisions such as a small sized one incorporated in a portable terminal such as a cellular phone handset, a medium sized one which is portable, and a large sized one (for example, one that is 40 inches or more in size).

It is to be noted that the electronic devices of Embodiment 3 are not limited to those in FIGS. 16A to 16E and may include various electronic devices including a display device having a TFT in the display portion or the like.

Embodiment 4

A method for manufacturing a semiconductor device of Embodiment 4 will be described with reference to FIGS. 17A to 17C, 18A and 18B, 19A and 19B, 20A and 20B, and 21A and 21B, which are cross-sectional views; and FIGS. 22A and 22B, which are top views.

Figure 17A:
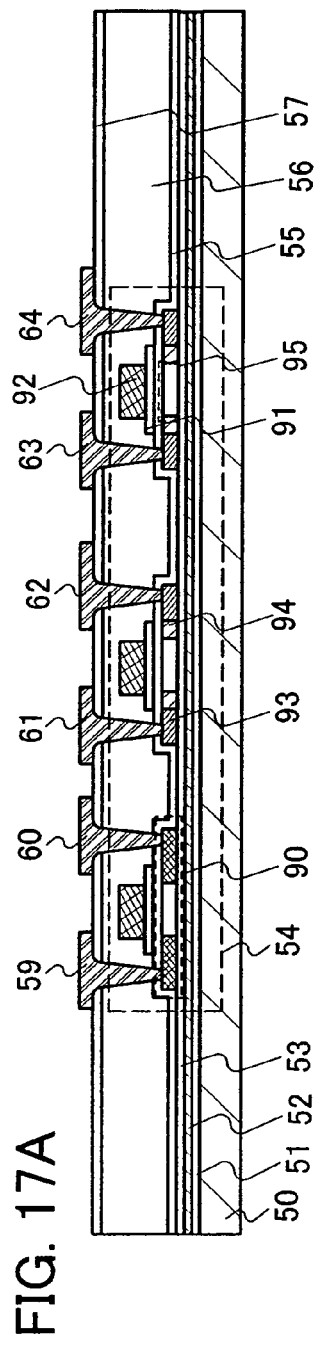
FIGS. 17A to 17C are diagrams used to explain a manufacturing method of a semiconductor device related to Embodiment 4.

First, an insulating layer 51 is formed over one surface of a substrate 50 (refer to FIG. 17A). Next, a peeling layer 52 is formed over the insulating layer 51. Then, an insulating layer 53 is formed over the peeling layer 52.

The substrate 50 is a substrate having an insulating surface and is, for example, a glass substrate, a plastic substrate, a quartz substrate, or the like. As the substrate 50, either a glass substrate or a plastic substrate is preferably used. This is because a glass substrate or a plastic substrate having a side with length of 1 meter or more and/or having a desired shape such as a square can be easily manufactured. Thus, when a glass substrate or a plastic substrate which has a square shape and has a side with length of 1 meter or more is used, for example, productivity can be drastically improved. This is a great advantage over the case of using a silicon substrate having a circular shape with a diameter of about 30 centimeters at maximum.

The insulating layers 51 and 53 are formed by a vapor deposition method (CVD method), a sputtering method, or the like by using an oxide or a nitride of silicon, an oxide of silicon containing nitrogen, a nitride of silicon containing oxygen, or the like. The insulating layer 51 prevents impurity elements from entering an upper layer from the substrate 50. However, the insulating layer 51 need not necessarily be formed if not required.

The peeling layer 52 is formed by a sputtering method or the like as a single layer or a multi-layered layer containing an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), or the like or an alloy material or compound material containing the above described element as its main component. It is to be noted that the layer containing silicon may have any of an amorphous, a microcrystalline, or a polycrystalline structure.

When the peeling layer 52 has a single-layer structure, a layer containing any one of the following may be preferably formed: tungsten, molybdenum, a mixture of tungsten and molybdenum, an oxide of tungsten, an oxynitride of tungsten, a nitride oxide of tungsten, an oxide of molybdenum, an oxynitride of molybdenum, a nitride oxide of molybdenum, an oxide of a mixture of tungsten and molybdenum, an oxynitride of a mixture of tungsten and molybdenum, and a nitride oxide of a mixture of tungsten and molybdenum.

When the peeling layer 52 has a multi-layer structure, a layer containing any of tungsten, molybdenum, or a mixture of tungsten and molybdenum may be preferably formed as a first layer. As a second layer, a layer containing any of an oxide of tungsten, an oxide of molybdenum, an oxide of a mixture of tungsten and molybdenum, an oxynitride of tungsten, an oxynitride of molybdenum, or an oxynitride of a mixture of tungsten and molybdenum may preferably be formed. In this case, the second layer can be formed by performing plasma treatment or nitrogen/oxygen plasma treatment on the surface of the first layer.

When a multi-layer structure of tungsten and an oxide of tungsten is formed as the peeling layer 52, a layer containing tungsten may be formed as the peeling layer 52 first, and then a layer containing an oxide of silicon may be formed thereover as the insulating layer 53 so that a layer containing an oxide of tungsten is formed at the interface between the layer containing tungsten and the layer containing an oxide of silicon. The same can be applied to the case of forming a layer containing a nitride of tungsten, an oxynitride of tungsten, or a nitride oxide of tungsten, or the like; after a layer containing tungsten is formed, a layer containing a nitride of silicon, a silicon nitride layer containing oxygen, or a silicon oxide layer containing nitrogen may be formed thereover.

Subsequently, a plurality of TFTs 54 are formed over the insulating layer 53. Each of the plurality of TFTs 54 includes an island-shaped semiconductor layer 90, a gate insulating layer (also simply referred to as an insulating layer) 55, a first conductive layer 91, and a second conductive layer 92 which is a gate (also referred to as a gate electrode). The semiconductor layer 90 includes impurity regions 93 and 94, functioning as a source or a drain, and a channel forming region 95. The impurity regions 93 and 94 are doped with an impurity element which imparts n-type conductivity (e.g., phosphorus (P) or arsenic (As)) or an impurity element which imparts p-type conductivity (e.g., boron (B)). The impurity region 94 is an LDD (Lightly Doped Drain) region.

The island-shaped semiconductor layer 90 is formed by a method similar to the one used to form the island-shaped semiconductor layers 106a to 106c in Embodiment 1, for example. Accordingly, crystal grains in the island-shaped semiconductor layer 90 grow in the channel direction, and few crystal grain boundaries are contained in the channel forming region 95, which lowers the energy barriers against carriers such as electrons and holes. As a result, the mobility of the TFT 54 becomes several hundreds of $cm^2/(V \cdot s)$, for example. In addition, variations in the semiconductor layer 90 are suppressed and the generation of variations in the properties of the TFT 54 can be suppressed.

Each of the plurality of TFTs 54 may have either a top-gate structure in which the gate insulating layer 55 is provided over the semiconductor layer 90, the first conductive layer 91 is provided over the gate insulating layer 55, and the second conductive layer 92 is provided over the first conductive layer 91 or a bottom-gate structure in which the gate insulating layer 55 is provided over the second conductive layer 92 and the semiconductor layer 90 is provided over the gate insulating layer 55. Furthermore, each of one or more of the plurality of TFTs 54 may be a multi-gate TFT in which two or more gate electrodes and two or more channel forming regions are provided.

Although only the plurality of TFTs 54 are formed over the substrate 50 here, the present invention is not limited to this structure. An element to be provided over the substrate 50 may be adjusted appropriately in accordance with the application of the semiconductor device. For example, in the case where a semiconductor device having a function of sending and receiving data without contact is formed, only a plurality of TFTs or a plurality of TFTs and a conductive layer functioning as an antenna may be formed over the substrate 50. In addition, in the case where a semiconductor device having a function of storing data is formed, a plurality of TFTs and a memory element (e.g., a transistor or a memory transistor) may be formed over the substrate 50. Furthermore, in the case where a semiconductor device having a function of controlling a circuit, generating a signal, or the like (e.g., a CPU or a signal generation circuit) is formed, a TFT may be formed over the substrate 50. In addition, another element such as a resistor or a capacitor may be formed, if necessary.

Then, over the plurality of TFTs 54, insulating layers 56 and 57 are formed. The insulating layers 56 and 57 are formed by a vapor deposition method, a sputtering method, an SOG (Spin On Glass) method, a droplet discharge method (e.g., an inkjet method), or the like using an oxide of silicon, a nitride of silicon, polyimide, acrylic, an insulating film containing an Si—O—Si bond which is formed using a siloxane-based material as a starting material (hereinafter referred to as a siloxane-based insulating film), oxazole resin, or the like. Oxazole resin is, for example, photosensitive polybenzoxazole. The oxazole resin which has a lower relative permittivity (which is about 2.9) than the relative permittivity of polyimide or the like (which is about 3.2 to 3.4) can be used to suppress the generation of parasitic capacitance and to perform high-speed operation.

In the above-described structure, two insulating layers (the insulating layers 56 and 57) are formed over the plurality of TFTs 54; however, the present invention is not limited thereto. There are no particular limitations on the number of insulating layers provided over the plurality of TFTs 54.

Then, openings are formed in the gate insulating layer 55 and the insulating layers 56 and 57, and conductive layers 59 to 64 each connected to a source (also referred to as a source region or a source electrode) or drain (also referred to as a drain region or a drain electrode) of each of the plurality of TFT's 54 (refer to FIG. 17A) are formed. The conductive layers 59 to 64 are provided in the same layer. In addition, each of the conductive layers 59 to 64 is a source or drain wiring. Signals supplied from an external are supplied to the plurality of TFTs 54 through the conductive layers 59 to 64.

By a sputtering method or the like, the conductive layers 59 to 64 are formed as a single layer or a multi-layered layer of the following: an element selected from titanium, tungsten, chromium, aluminum, tantalum, nickel, zirconium, hafnium, vanadium, iridium, niobium, lead, platinum, molybdenum, cobalt, rhodium, or the like; an alloy material containing the element as its main component; or a compound material of an oxide or a nitride containing the element as its main component. As examples of the multi-layer structure of the conductive layers 59 to 64, there are a three-layer structure of titanium, aluminum, and titanium, a five-layer structure of titanium, titanium nitride, aluminum, titanium, and titanium nitride, a five-layer structure of titanium, titanium nitride, aluminum doped with silicon, titanium, and titanium nitride, and the like.

Figure 17B:
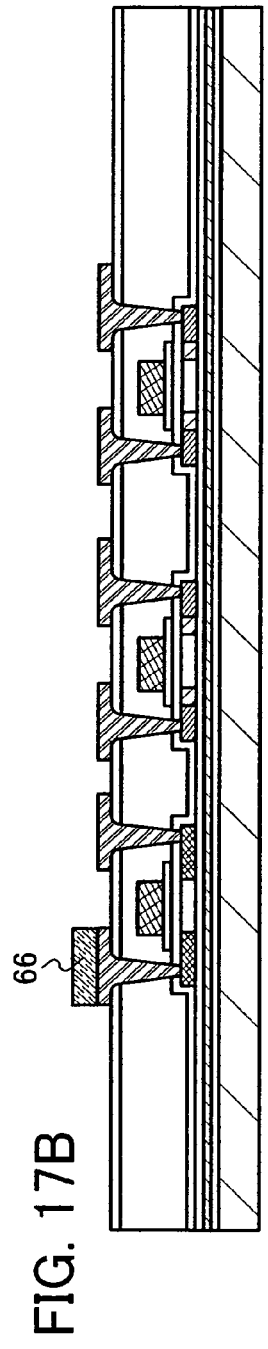

Next, a conductive layer 66 is formed over the conductive layer 59 (refer to FIG. 17B). A layer containing gold, silver, or copper is formed as the conductive layer 66 by a screen printing method, a droplet discharge method, or the like. Preferably, the conductive layer 66 may be formed using a paste containing fine particles of silver (a material in which fine particles of silver and resin are mixed) by a screen printing method. This is because the use of a screen printing method can reduce manufacturing time and apparatus costs. In addition, silver is used because the resistance thereof is low.

Then, laser beam irradiation is performed with a laser beam that can melt one or both of the conductive layers 66 and 59. Although the conductive layers 66 and 59 are partially in contact with each other before the laser beam irradiation is performed, the size of the portion where the conductive layers 66 and 59 are in contact with each other can be increased by the laser beam irradiation. Therefore, a more secure electrical connection between the conductive layers 66 and 59 can be obtained; thus, reliability can be improved. As the laser beam to be used here, when classified according to the medium used, there are a gas laser, a liquid laser, and a solid state laser; and, when classified according to the oscillation characteristics, there are a free electron laser, a semiconductor laser, and an X-ray laser; however, any of the lasers may be used in the present invention. Preferably, a gas laser or a solid state laser is used, and more preferably, a solid state laser is used. Furthermore, either a continuous wave laser beam or a pulsed laser beam may be used.

Figure 17C:
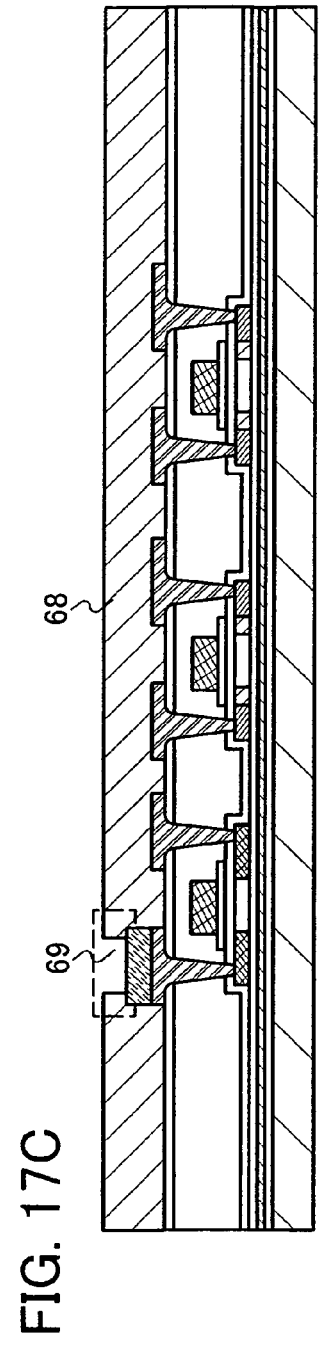

Next, an insulating layer 68 is selectively formed over the insulating layer 57 and the conductive layers 59 to 64 (FIG. 17C). The insulating layer 68 is provided with an opening 69. The conductive layer 66 is exposed through the opening 69.

It is to be noted that the opening 69 preferably does not have such a shape that the surface of the conductive layer 66 is entirely exposed but has a shape such that the surface of the conductive layer 66 is partially exposed. Specifically, the opening 69 preferably has a shape such that a center portion of the conductive layer 66 is exposed. This is in order that transposition be carried out accurately in a later step. If the opening 69 is formed so that one entire surface of the conductive layer 66 is exposed, a region where neither the conductive layer 66 nor the insulating layer 68 is provided may be formed. In the later transposition step, transposition is performed by adhesion between the insulating layer 68 and a substrate 88; therefore, when there is a region where neither the conductive layer 66 nor the insulating layer 68 is provided, transposition cannot be performed accurately in some cases. However, in the above-described step, the insulating layer 68 is selectively provided so as to expose the center portion of the conductive layer 66. Accordingly, there is no region where neither the conductive layer 66 nor the insulating layer 68 is provided; thus, transposition can be performed accurately.

The insulating layer 68 is formed using an insulating resin such as an epoxy resin, an acrylic resin, or a polyimide resin to have a thickness of 5 to 200 μm, preferably, a thickness of 15 to 35 μm. In addition, the insulating layer 68 is formed uniformly by using a screen printing method, a droplet discharge method, or the like. Preferably, the screen printing method is used. This is because using the screen printing method can reduce manufacturing time and apparatus costs. Next, heat treatment is performed, if necessary.

Figure 18A:
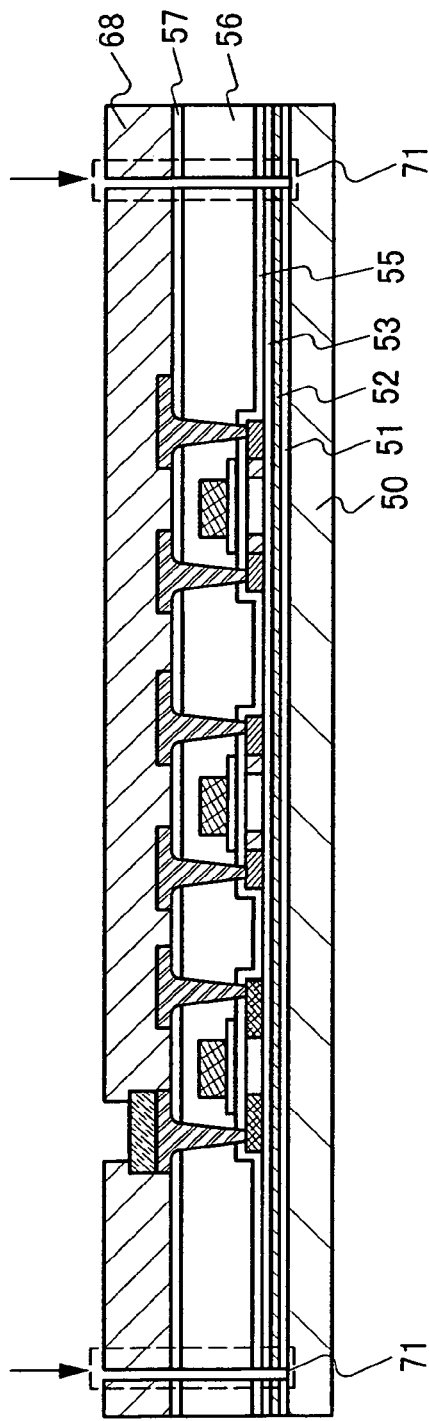
FIGS. 18A and 18B are diagrams used to explain a manufacturing method of a semiconductor device related to Embodiment 4.

Then, openings 71 are formed so as to expose at least part of the peeling layer 52 (refer to FIG. 18A). In terms of a short processing time, it is preferable that this step be carried out by laser beam irradiation. The substrate 50, the insulating layer 51, the peeling layer 52, the insulating layer 53, the gate insulating layer 55, the insulating layers 56, 57, and 68 are irradiated by the laser beam. The surface of the insulating layer 68 is the first to be irradiated by the laser beam. The opening 71 is formed so as to expose at least part of the peeling layer 52. Therefore, the opening 71 is provided at least in the gate insulating layer 55 and insulating layers 56, 57, and 68. The structure shown in the drawing is the case where the laser beam reaches through to the insulating layer 51, and the insulating layers 51 and 53, the gate insulating layer 55, and the insulating layers 56, 57, and 68 are sectioned. It is to be noted that the laser beam may reach through to the substrate 50.

In the above-described step of irradiation of the laser beam, ablation processing is used. In the ablation processing, a phenomenon is used in which a molecular bond in a portion irradiated by a laser beam, that is, a portion which has absorbed a laser beam, is cut, photolyzed, and vaporized. In other words, a molecular bond in a certain portion of the insulating layer 51, the peeling layer 52, the insulating layer 53, the gate insulating layer 55, and the insulating layers 56, 57, and 68 is cut, photolyzed, and vaporized by the laser beam irradiation, whereby the opening 71 is formed.

In addition, as a laser, a solid state laser with a wavelength of 150 to 380 nm, which is in the ultraviolet region, is preferably used. More preferably, an Nd:YVO$_4$ laser with a wavelength of 150 to 380 nm is used. This is because, as for the Nd:YVO$_4$ laser with a wavelength of 150 to 380 nm, light is easily absorbed by the substrate compared to light emitted by lasers at other harmonics, and ablation processing is possible. Moreover, the periphery of a processed portion is not affected and processability is good.

Figure 18B:
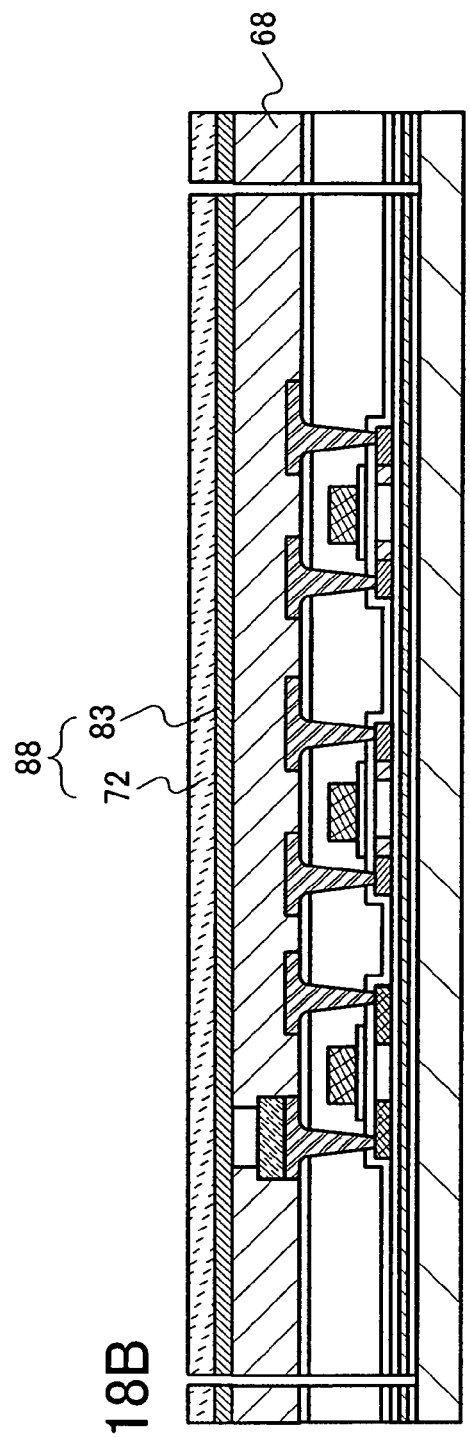

Next, the substrate 88 is provided over the insulating layer 68 (refer to FIG. 18B). The substrate 88 is a heat-peeling substrate in which an insulating layer 72 and an adhesive layer 83 are stacked. The adhesive layer 83 is a layer the adhesion of which is decreased by heat treatment, which is, for example, a layer formed of a material utilizing the softening of a thermoplastic adhesive at the time of heating, a layer formed of a material in which a microcapsule that expands by heating or a foaming agent is mixed, a layer formed of a material in which thermal fusibility or a thermal decomposition property is given to a thermosetting resin, or a layer using the deterioration of interface intensity because of penetration of moisture or the expansion of a water-absorbing resin because of the deterioration.

Then, using the substrate 88, the stack including the plurality of TFTs 54 is separated from the substrate 50 (refer to FIG. 19A). The separation of the stack including the plurality of TFTs 54 from the substrate 50 is performed either inside the peeling layer 52 or at the interface between the peeling layer 52 and the insulating layer 53. The structure shown in the drawing is the case where the separation is performed at the interface between the peeling layer 52 and the insulating layer 53. In this manner, the separation step can be performed easily in a short time by using the substrate 88. It is to be noted that any of the following may be used as a method for separating the stack from the substrate 50: (A) a method in which the stack is physically separated from the substrate by the application of stress; (B) a method in which the peeling layer 52 is removed with an etching material; and (C) a method in which the peeling layer 52 is partially removed with an etching material and then physically peeled off.

Next, a substrate 89 is provided on the surface of the insulating layer 53, and the stack including the plurality of TFTs 54 is separated from the substrate 88 by performing heat treatment (refer to FIG. 19B). The substrate 89 is a substrate in which an insulating layer 73 and an adhesive layer 84 are stacked. The adhesive layer 84 is a layer the adhesive strength of which is increased by heat treatment, which corresponds to a layer containing a thermoplastic resin. The thermoplastic resin corresponds to polyethylene, polystyrene, polypropylene, polyvinyl chloride, or the like, for example.

As described above, since the adhesive strength of the adhesive layer 83 located on the surface of the substrate 88 is decreased by heat treatment, the adhesion between the substrate 88 and the insulating layer 68 is decreased by the heat treatment; thus, the stack including the plurality of TF s 54 is separated from the substrate 88. At the same time, the adhesive layer 84 (thermoplastic resin) located on the surface of the substrate 89 is cured by the heat treatment; thus, the adhesion between the insulating layer 53 and the one surface of the substrate 89 is increased. In this manner, the step of separating the stack from the substrate 88 and the step of providing the stack over the substrate 89 can be carried out at the same time by using the two substrates 88 and 89 provided with adhesive layers having different properties. Consequently, the manufacturing time can be shortened.

Then, the conductive layer 66 is again irradiated by a laser beam, if necessary. This is performed in order to improve defective electrical connection between the conductive layer 59 and the conductive layer 66 that may be caused by the above separation step. Thus, the step of laser beam irradiation may not be performed if not necessary.

Next, a terminal 12 is formed so as to be in contact with the conductive layer 66 (refer to FIG. 20A). As the terminal 12, a layer containing gold, silver, or copper is formed by a screen printing method, a droplet discharge method, or the like. Preferably, it may be formed by the screen printing method using a paste containing fine particles of silver (a material in which fine particles of silver and resin are mixed). This is because using the screen printing method can reduce manufacturing time and costs of an apparatus thereof are low. In addition, silver has low resistance. Next, heat treatment is performed if necessary.

Then, laser beam irradiation is performed on the substrate 89, the insulating layer 53, the gate insulating layer 55, and the insulating layers 56, 57, and 68 so that an opening 76 is formed (refer to FIG. 20B). It is to be noted that the step of forming the opening 76 may be omitted.

Figure 21A:
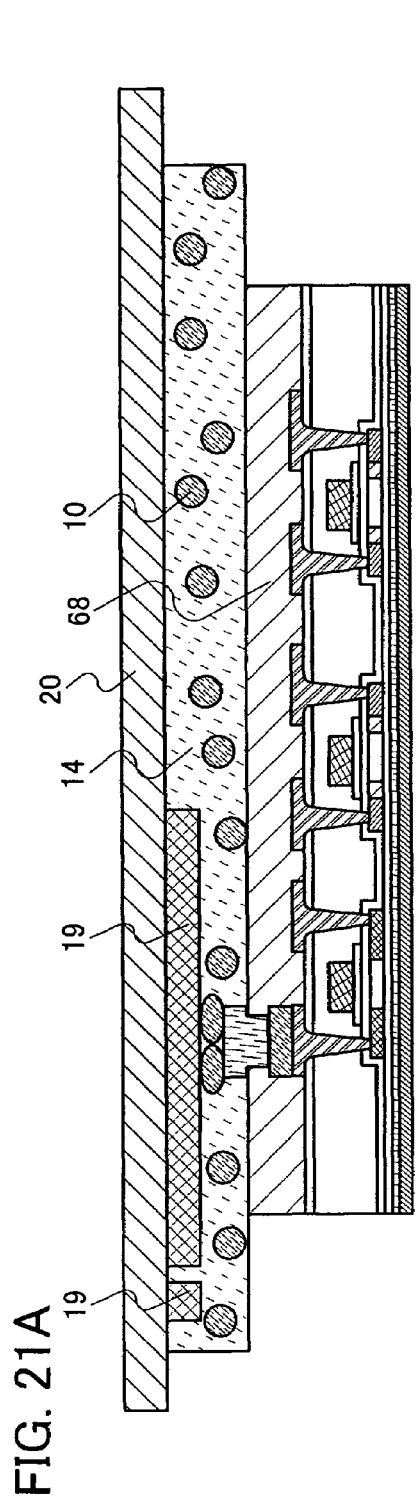
FIGS. 21A and 21B are diagrams used to explain a manufacturing method of a semiconductor device related to Embodiment 4.

Next, a substrate 20 provided with a conductive layer 19 functioning as an antenna is prepared (refer to FIG. 21A). The conductive layer functioning as an antenna has a capacitor 86 (refer to FIGS. 22A and 22B). Each of the conductive layer 19 functioning as an antenna and the capacitor 86 is formed by a screen printing method, a droplet discharge method, or the like. FIG. 21A shows the conductive layer 19 functioning as an antenna. A resin layer 14 is a material where a conductive particle 10 is provided in an adhesive, which is also referred to as an ACP (Anisotropic Conductive Paste). The resin layer 14 is uniformly formed by a screen printing method, a droplet discharge method, or the like.

Then, the substrates 89 and 20 are attached to each other using the resin layer 14 (refer to FIGS. 21A and 22B). Then, if necessary, the insulating layer 68 and the resin layer 14 are attached to each other. At this time, either pressure treatment, heat treatment, or both are performed using a flip-chip bonder, a die bonder, an ACF (Anisotropic Conductive Film) bonder, a pressure bonder, or the like.

Figure 21B:
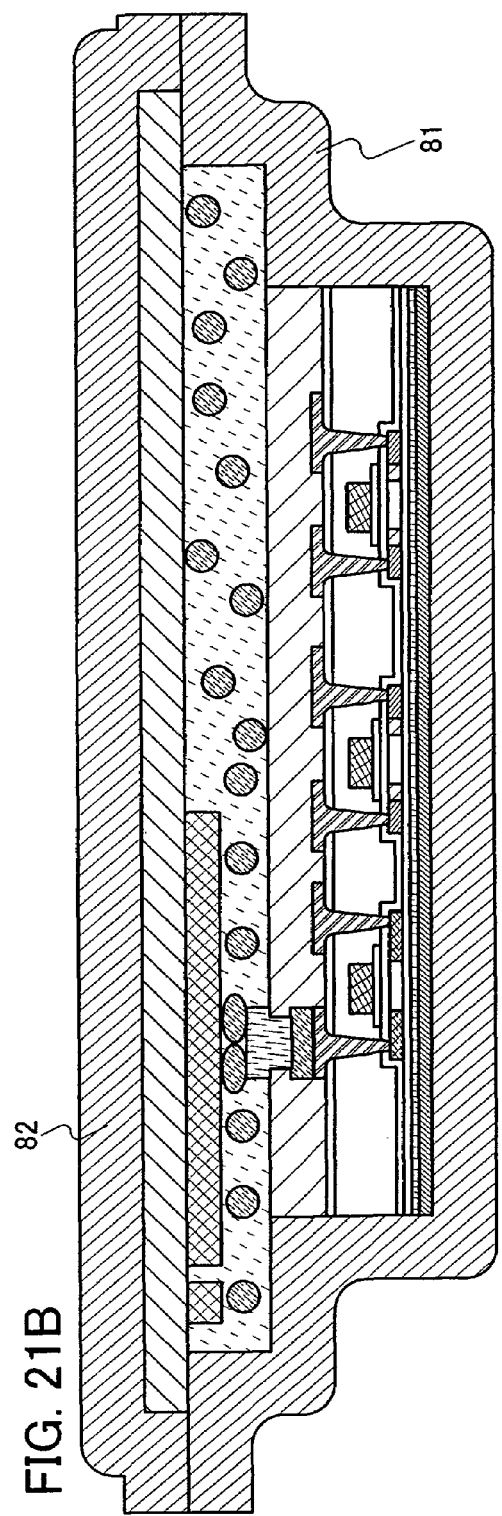

Furthermore, another substrate may also be provided on the surface of the stack including the plurality of TFTs 54 (refer to FIG. 21B). Specifically, a new substrate may be provided over the surface of substrate 89 or substrate 20 or over the surfaces of both substrate 89 and substrate 20. In the structure shown in the drawing, a substrate 81 is provided on the surface of the substrate 89, and a substrate 82 is provided on the surface of the substrate 20. By providing the substrates 81 and 82, strength thereof can be further improved. The stack including the plurality of TFTs 54 is sealed with the substrates 81 and 82 by melting the layer on each surface of the substrates 81 and 82, or an adhesive layer on each surface of the substrates 81 and 82 by heat treatment. In addition, pressure treatment is performed if necessary.

Although the stack including the plurality of TFTs 54 is separated from the substrate 50 in this embodiment (refer to FIG. 19A), the present invention is not limited to this mode; the substrate 50 may be thinned after the conductive layers 59 to 64 are formed (refer to FIG. 17A), as described below, for example.

In order to thin the substrate 50, a surface of the substrate 50 over which the plurality of TFTs 54 is not formed is ground using a grinding apparatus (e.g., a grinder). Preferably, the substrate 50 is ground so as to have a thickness of 100 µm or less. Next, the ground surface of the substrate 50 over which the plurality of TFTs 54 is not formed is polished using a polishing apparatus (e.g., a polishing pad or a polishing abrasive grain such as cerium oxide or the like). Preferably, the substrate 50 is polished so as to have a thickness of 50 µm or less, more preferably, 20 µm or less, and even more preferably, 5 µm or less. It is to be noted that, in order to thin the substrate 50, grinding, polishing, or both are preferably performed. Moreover, before the grinding step and the polishing step are performed, a layer for protection may be provided over the conductive layers 59 to 64, if necessary. Furthermore, after the grinding step and the polishing step are performed, a cleaning step for removing dust, a drying step, or both are preferably performed, if necessary.

The thickness of the thinned substrate 50 may be determined appropriately in consideration of the time required for the grinding step and the polishing step, time required for a cutting step which is performed later, application of a semiconductor device, the strength required for the application of the semiconductor device, and the like. For example, in the case where productivity is to be improved by shortening the times for the grinding step and the polishing step, the thickness of the substrate 50 after being polished is preferably set to be about 50 µm. In addition, in the case where productivity is to be improved by shortening the time required for the cutting step that is performed later, the thickness of the substrate 50 after being polished is preferably set to be 20 µm or less, more preferably 5 µm or less. Moreover, in the case where the semiconductor device is to be attached to or embedded in a thin product, the thickness of the substrate 50 after being polished is preferably set to be 20 µm or less, more preferably, to 5 µm or less. Furthermore, there are no particular limitations on the lower limit of the thickness of the thinned substrate 50; the substrate 50 may be thinned until the substrate 50 is removed (until the thickness of the substrate 50 becomes 0 μm).

Next, the conductive layer 66 is formed so as to be in contact with the conductive layer 59 (refer to FIG. 17B). Then, the conductive layer 66 is irradiated by a laser beam (refer to FIG. 17B). Then, the insulating layer 68 is selectively formed (refer to FIG. 17C). The opening 71 is formed by laser beam irradiation (refer to FIG. 18A). Although the substrate 50 is not cut in forming the opening 71 in the structure shown in the drawing, the substrate 50 is preferably cut in the case where the substrate 50 is thinned. Thus, the step of separating the stack including the plurality of TFTs 54 from the substrate 50 is preferably omitted. Subsequent steps are the same as those described above. In the case where the thinned substrate 50 is left without being separated from the stack including the plurality of TFTs 54 from the substrate 50, penetration of harmful gas, moisture, or an impurity element can be suppressed. Thus, deterioration or destruction can be suppressed and reliability can be improved. Moreover, a barrier property can be improved.

Embodiment 5

A manufacturing method of a semiconductor device of Embodiment 5 will be described with reference to FIGS. 23A to 23C, 24A and 24B, 25A and 25B, and 26. In this embodiment, the process up to the step of forming the TFT and the insulating layer 57 is the same as that of Embodiment 4, so that the description is omitted here. Furthermore, in the description below, the same structures as those of Embodiment 4 will be denoted by the same reference numerals, and any description thereof will be omitted.

After formation of the insulating layer 57, openings are formed in a gate insulating layer 55 and insulating layers 56 and 57, and conductive layers 59 to 64 which are connected to the source (also referred to as a source region or a source electrode) or drain (also referred to as a drain region or a drain electrode) of each of a plurality of TFTs 54 are formed (refer to FIG. 23A). The conductive layers 59 to 64 are provided in the same layer. In addition, the conductive layers 59 to 64 are source or drain wirings. Signals supplied from an external are supplied to the plurality of TFTs 54 through the conductive layers 59 to 64.

Next, an insulating layer 32 is formed as a single layer or a stacked layer so as to cover the conductive layers 59 to 64 as shown in FIG. 23B. Subsequently, a contact hole that is located over the conductive film 59 is formed in the insulating layer 32 covering the conductive layers 59 to 64, and a conductive layer 33 is formed. The conductive layer 33 is connected to the conductive film 59 through the contact hole and functions as an antenna. It is to be noted that the conductive layer 33 is formed by a screen printing method, a droplet discharge method, or the like.

Then, laser irradiation is performed with a laser that can melt one or both of the conductive layers 59 and 33. Although the conductive layers 59 and 33 are partially in contact with each other before the laser irradiation is performed, the size of the portion where the conductive layers 59 and 33 are in contact with each other can be increased by the laser irradiation. Accordingly, a more secure electrical connection between the conductive layers 59 and 33 can be obtained; thus, reliability can be improved. As the laser which can be used here, when classified according to the medium used, there are a gas laser, a liquid laser, and a solid state laser; and, when classified according to the oscillation characteristics, there are a free electron laser, a semiconductor laser, and an X-ray laser; however, any of the lasers may be used in the present invention. Preferably, a gas laser or a solid state laser is used, and more preferably, a solid state laser is used. Furthermore, either a continuous oscillation laser or a pulsed oscillation laser may be used in the present invention.

After that, over the insulating layer 32 and the conductive layer 33 functioning as an antenna, a protective layer, e.g., a layer containing carbon such as DLC (Diamond-Like Carbon), a layer containing silicon nitride, or a layer containing silicon nitride oxide, may be formed.

Next, as shown in FIG. 23C, an insulating layer 35 is formed by a screen printing method or the like over the insulating layer 32 and the conductive layer 33 functioning as an antenna. The insulating layer 35 that is provided as a protective layer for a later peeling step is preferably a planarizing layer.

Then, openings 71 that expose at least part of a peeling layer 52 are formed (refer to FIG. 24A). This step is preferably carried out by laser irradiation, since the processing time is short in that case. The laser irradiation is performed on the substrate 50, the insulating layer 51, the peeling layer 52, the insulating layer 53, the gate insulating layer 55, and insulating layers 56, 57, 32 and 35; and the surface of the insulating layer 35 is the first to be irradiated by the laser beam. The openings 71 are formed so as to expose at least part of the peeling layer 52; therefore, the openings 71 are provided in the insulating layer 53, the gate insulating layer 55, the insulating layers 56, 57, 32 and 35, at least. The structure shown in the drawing is the case where the laser beam reaches through to the insulating layer 51, and the insulating layer 51 and 53, the gate insulating layer 55, the insulating layers 56 57, 32 and 35 are separated. It is to be noted that the laser beam may reach through to the substrate 50.

In addition, as the laser, a solid state laser with a wavelength of 150 to 380 nm, which is in the ultraviolet region, is used. Preferably, an Nd:YVO$_4$ laser with a wavelength of 150 to 380 nm is used. This is because, as for the Nd:YVO$_4$ laser with a wavelength of 150 to 380 nm, light is easily absorbed in the substrate compared with other harmonic lasers, and ablation processing is possible. Moreover, the periphery of a processed portion is not affected and processability is good.

Next, a substrate 88 is provided over the insulating layer 35 (refer to FIG. 24B). The substrate 88 is a substrate in which an insulating layer 72 and an adhesive layer 83 are stacked.

Figures 25A, 25B:
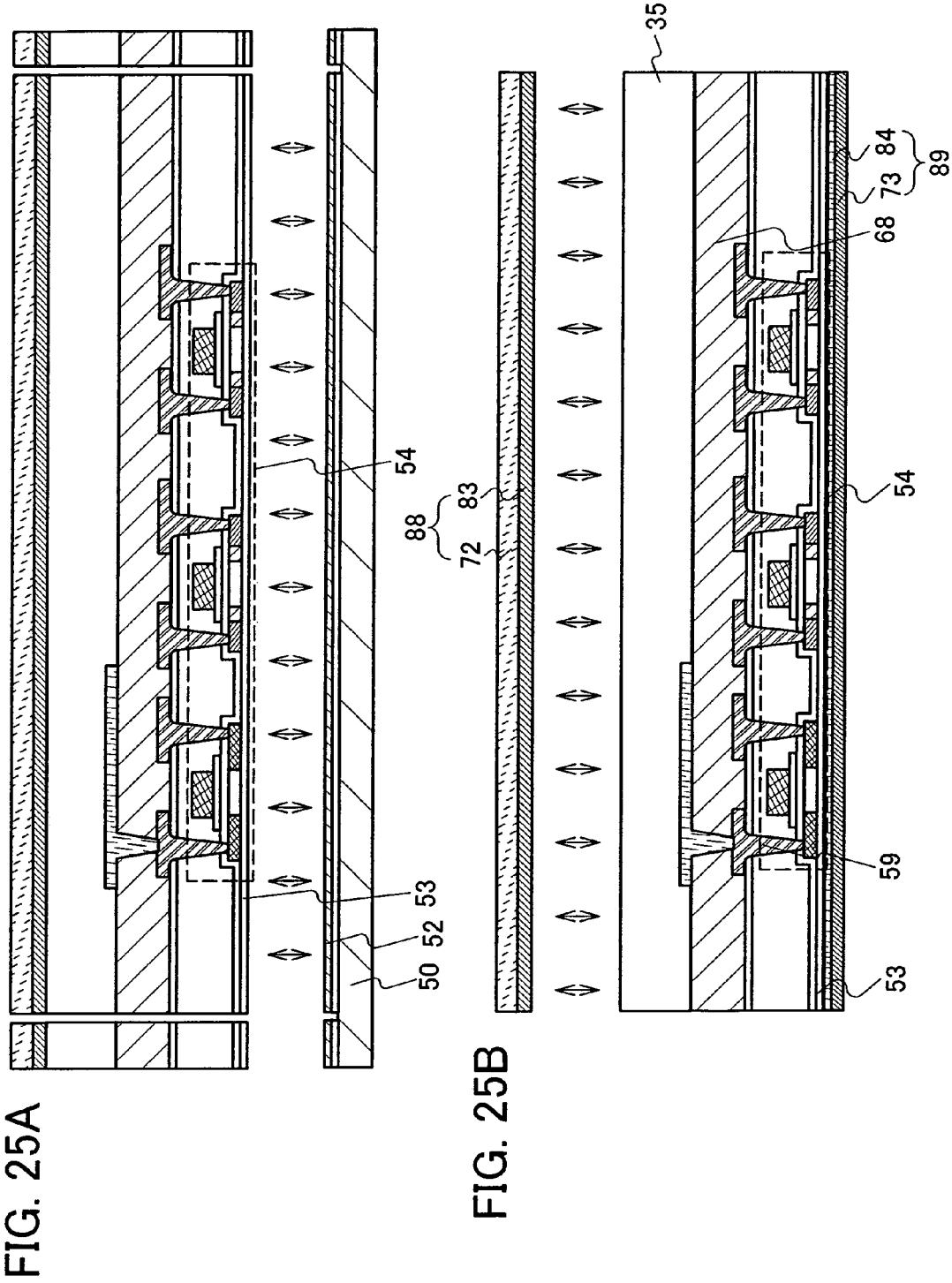
FIGS. 25A and 25B are diagrams used to explain a manufacturing method of a semiconductor device related to Embodiment 5.

Then, using the substrate 88, the stack including the plurality of TFTs 54 is separated from the substrate 50 (refer to FIG. 25A). The separation of the stack including the plurality of TFTs 54 from the substrate 50 is performed either inside the peeling layer 52 or at the interface between the peeling layer 52 and the insulating layer 53. The structure shown in the drawing is the case where the separation is performed at the interface between the peeling layer 52 and the insulating layer 53. In this manner, the separation step can be performed easily in a short time by using the substrate 88.

Next, a substrate 89 is provided over the surface of the insulating layer 53, and the stack including the plurality of TFTs 54 is separated from the substrate 88 by heat treatment (refer to FIG. 25B). The substrate 89 is a substrate in which the insulating layer 73 and an adhesive layer 84 are stacked.

As described above, since the adhesive strength of the adhesive layer 83 located on the surface of the substrate 88 decreases due to the heat treatment, the adhesive strength between the substrate 88 and the insulating layer 35 decreases through the heat treatment; thus, the stack including the plurality of TFTs 54 is separated from the substrate 88. At the same time, the adhesive layer 84 (the thermoplastic resin) located on the surface of the substrate 89 is cured by the heat treatment; thus, the adhesive strength between the insulating layer 53 and one surface of the substrate 89 increases. In this manner, the step of separating the stack from the substrate 88 and the step of providing the stack over the substrate 89 can be carried out at the same time by using the two substrates 88 and 89 provided with adhesive layers having different properties. Consequently, manufacturing time can be shortened.

Figure 26:
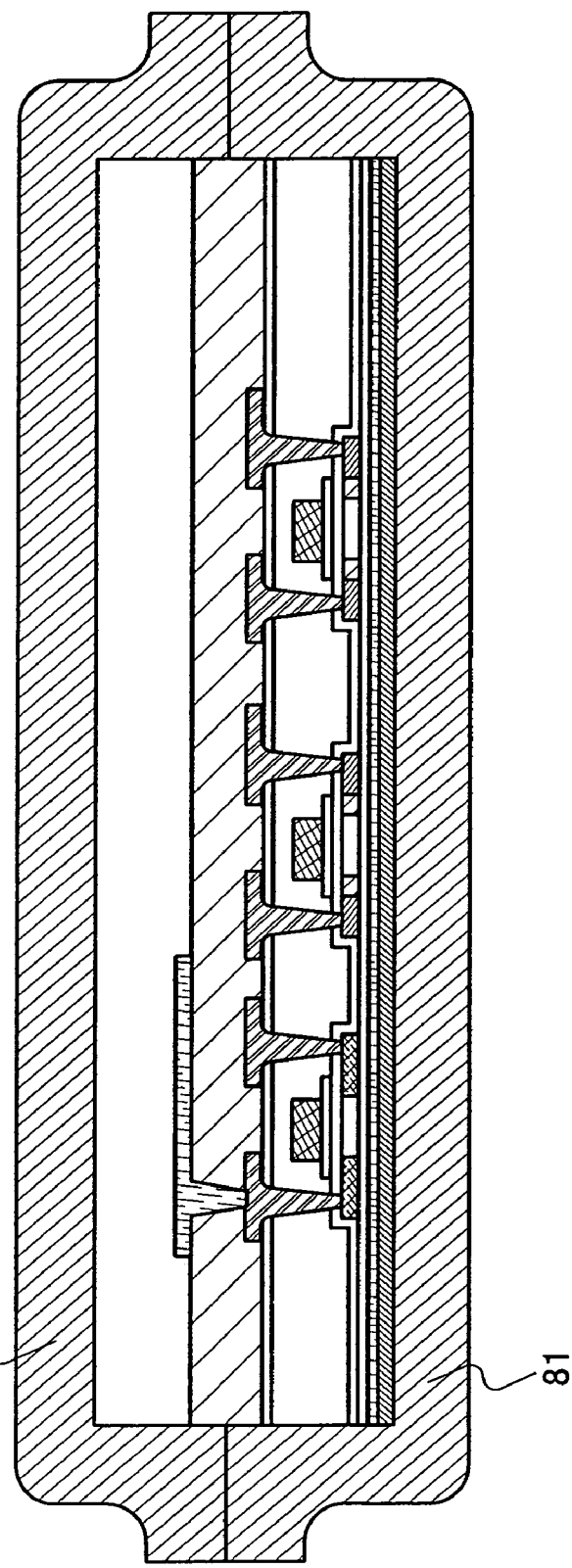
FIG. 26 is a diagram used to explain a manufacturing method of a semiconductor device related to Embodiment 5.

Furthermore, another substrate may also be provided on a surface of the stack including the plurality of TFTs 54 (refer to FIG. 26). Specifically, another substrate may be provided over one or both of the respective surfaces of the insulating layer 35 and the substrate 89. In the structure shown in the drawing, the substrate 81 is provided on the surface of the substrate 89, and the substrate 82 is provided on the surface of the insulating layer 35. By providing the substrates 81 and 82, strength can be further improved. The stack including the plurality of TFTs 54 is sealed by the substrates 81 and 82 by melting the layer on each surface of the substrates 81 and 82 or the adhesive layer on each surface of the substrates 81 and 82 by heat treatment. In addition, pressure treatment is performed, if necessary.

Although the stack including the plurality of TFTs 54 is separated from the substrate 50 in this embodiment, the present invention is not limited to this mode, and the substrate 50 may be thinned. The same step as that in Embodiment 4 is applied to a step thereof, thus, any description thereof is omitted here.

Embodiment 6

Figure 27:
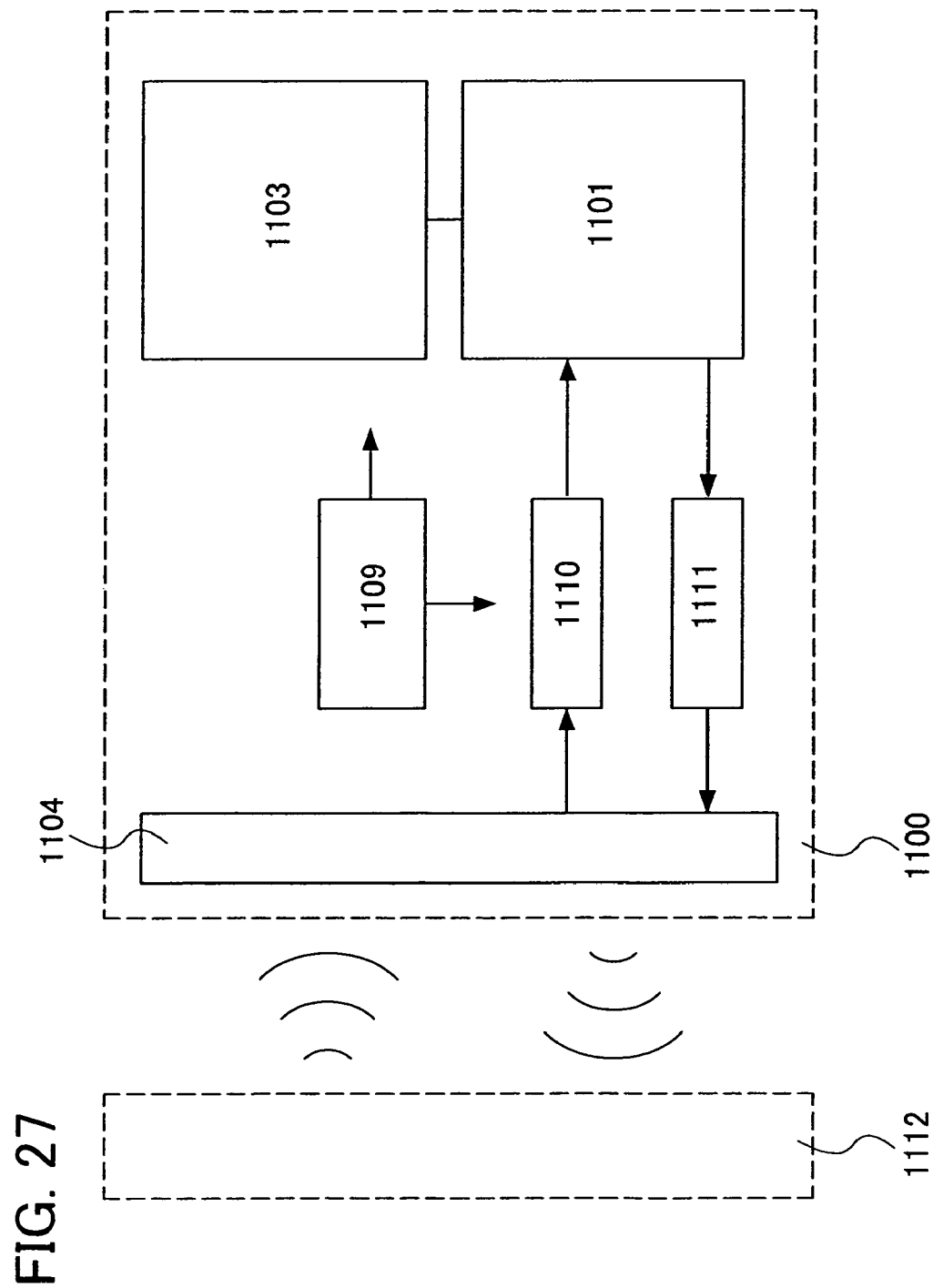
FIG. 27 is a diagram used to explain a semiconductor device related to Embodiment 6.

A structure of a semiconductor device of Embodiment 6 will be described with reference to FIG. 27. A semiconductor device 1100 of the present invention includes an arithmetic processing circuit 1101, a memory circuit 1103, an antenna 1104, a power supply circuit 1109, a demodulation circuit 1110, and a modulation circuit 1111. The semiconductor device 1100 includes the antenna 1104 and the power supply circuit 1109 as mandatory components, whereas the other components are arbitrarily provided according to application of the semiconductor device 1100. As the antenna 1104, the structure described in Embodiment 4 or 5 can be used, for example.

The arithmetic processing circuit 1101 analyzes commands, controls the memory circuit 1103, outputs data that is transmitted to an external, to the modulation circuit 1111, or the like, based on a signal input from the demodulation circuit 1110.

The memory circuit 1103 includes a circuit including a memory element and a control circuit for controlling the writing and reading of data. In the memory circuit 1103, at least an identification number of the semiconductor device itself is stored. The identification number is used for distinguishing the semiconductor device from other semiconductor devices. In addition, the memory circuit 1103 includes one or more kinds of memories selected from an organic memory, a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. Since the organic memory has such a simple structure, the manufacturing process can be simplified and costs can be reduced. In addition, because of the simple structure, the area of a stack can be easily reduced and high capacity can be easily achieved. Furthermore, there are advantages in that it is non-volatile and no battery is required to be incorporated. Thus, it is preferable to use an organic memory for the memory circuit 1103.

The antenna 1104 converts a carrier wave supplied by a reader/writer 1112 into an alternating current electrical signal. In addition, load modulation is applied by the modulation circuit 1111. The power supply circuit 1109 generates power supply voltage by using the alternating current electrical signal converted by the antenna 1104 and supplies the power supply voltage to each circuit.

The demodulation circuit 1110 demodulates the alternating current electrical signal converted by the antenna 1104 and supplies the demodulated signal to the arithmetic processing circuit 1101. The modulation circuit 1111 applies load modulation to the antenna 1104 based on a signal supplied from the arithmetic processing circuit 1101.

The reader/writer 1112 receives the load modulation applied to the antenna 1104 as a carrier wave. In addition, the reader/writer 1112 transmits the carrier wave to the semiconductor device 1100. It is to be noted that the carrier wave refers to an electromagnetic wave generated by the reader/writer 1112.

The structure of this embodiment can be used in combination with any structure of the other embodiments.

Embodiment 7

A semiconductor device of Embodiment 7 has a structure similar to that of Embodiment 6 and has a function capable of transmitting and receiving data without contact. Through the use of this function, the semiconductor device can be incorporated into various objects and various systems. The various objects include, for example, keys (refer to FIG. 28A), banknotes, coins, securities, bearer bonds, certificates (a driver's license, a resident's card, or the like), books, packing containers (a petri dish or the like; refer to FIG. 28B), personal accessories and ornaments (a bag, a pair of glasses, or the like; refer to FIG. 28C), packing containers (wrapping paper, a bottle, or the like; refer to FIG. 28D), recording media (a disk, a video tape, or the like), vehicles (a bicycle or the like), foods, clothing, everyday articles, and electronic devices (a liquid crystal display device, an EL display device, a television device, a portable terminal, or the like). The semiconductor device 1120 of the present invention is fixed by being attached to the surfaces of the objects having various forms as described above or by being embedded into the objects.

In addition, the various systems include a physical distribution and inventory management system, a certification system, a distribution system, a production record system, a book management system, and the like. By utilizing a semiconductor device 1120 having a structure similar to that of Embodiment 6, high-functionalization, multi-functionalization, and high-added value of the system can be achieved. For example, the semiconductor device 1120 is provided inside an identification card, and a reader/writer 1121 is provided at an entrance of a building or the like (refer to FIG. 28E). The reader/writer 1121 reads an identification number inside the identification card that each person possesses and supplies information related to the identification number that has been read to a computer 1122. The computer 1122 determines whether or not to permit the person's entrance or exit based on the information supplied from the reader/writer 1121. In this manner, by utilizing the semiconductor device of the present invention, an entrance and exit management system with improved convenience can be provided.

Embodiment 8

A semiconductor device of Embodiment 8 will be described with reference to FIGS. 29A and 29B, 30A to 30D, 31A to 31C, and 32A to 32C. The semiconductor device of this embodiment includes a photoelectric conversion element and is used as an optical sensor (a visible light sensor, for example).

Figure 29A:
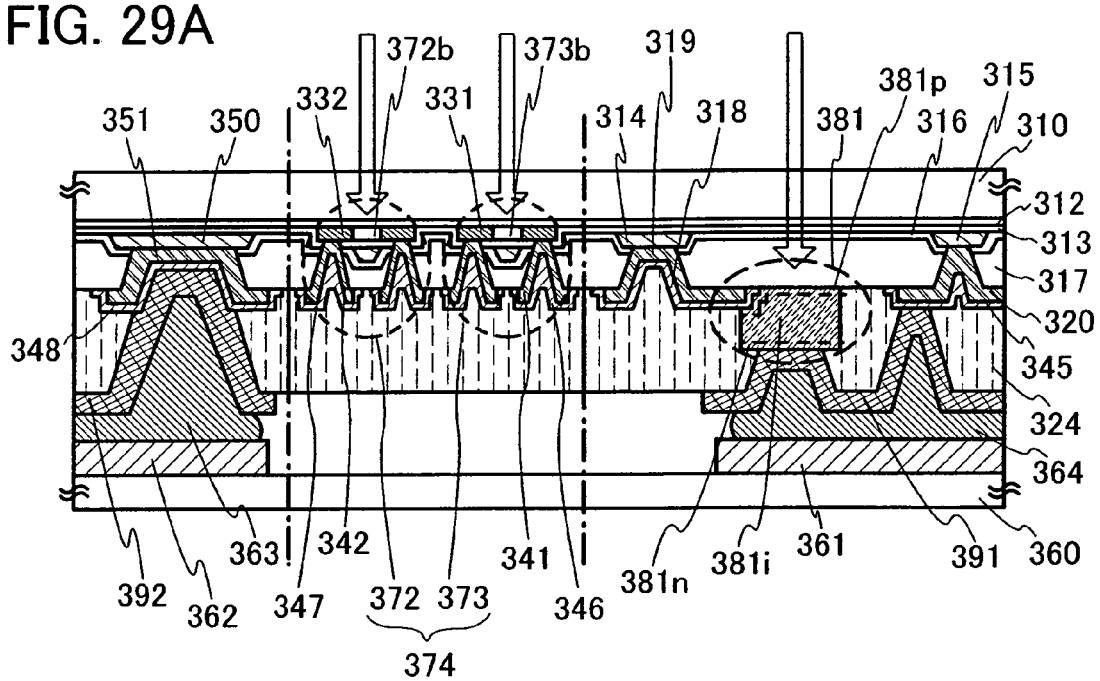
FIGS. 29A and 29B are diagrams used to explain a semiconductor device related to Embodiment 8.

In FIG. 29A, a reference numeral 310 denotes a substrate; 312, a base insulating film; and 313, a gate insulating film. Since light received by the photoelectric conversion element passes through the substrate 310, the base insulating film 312, and the gate insulating film 313, materials having a high light-transmitting property are preferably used as the material for each of these.

The photoelectric conversion element includes a wiring 319, a protective electrode 318, a photoelectric conversion layer 381, and a terminal electrode 391. The photoelectric conversion layer 381 includes a p-type semiconductor layer 381p, an n-type semiconductor layer 381n, and an intrinsic (i-type) semiconductor layer 381i which is interposed between the p-type semiconductor layer 381p and the n-type semiconductor layer 381n.

The p-type semiconductor layer 381p may be formed by depositing a semiamorphous silicon film containing an impurity element belonging to Group 13 of the periodic table, for example, boron (B), by a plasma CVD method.

It is to be noted that a semiamorphous semiconductor film includes a semiconductor which has a structure intermediate between that of an amorphous semiconductor and a semiconductor having a crystalline structure (including single crystal and polycrystal structures). The semiamorphous semiconductor film has a third state which is stable in terms of free energy and is a crystalline substance having short-range order and lattice distortion. The crystal grain of which the size is 0.5 to 20 nm can exist by being dispersed in a non-single crystal semiconductor film. The peak of the Raman spectrum of a semiamorphous semiconductor film is shifted to be lower than the wavenumber of 520 cm$^{-1}$, and the diffraction peaks of (111) and (220) that are thought to be caused by an Si crystal lattice are observed by X-ray diffraction. In addition, the semiamorphous semiconductor film contains hydrogen or a halogen of at least 1 atom % or more to terminate a dangling bond. In the present specification, a semiconductor film like this is referred to as a semiamorphous semiconductor (SAS) film for the sake of convenience. Moreover, a noble gas element such as helium, argon, krypton, or neon is contained therein to further promote lattice distortion so that stability is enhanced and a favorable semiamorphous semiconductor film is obtained. It is to be noted that a microcrystalline semiconductor film (microcrystal semiconductor film) is also included in the semiamorphous semiconductor film.

Also, the semiamorphous semiconductor film can be obtained by glow discharge decomposition of gas containing a silicide. As a typical gas containing a silicide, SiH$_4$ is given, and, in addition, Si$_2$H$_6$, SiH$_2$Cl$_2$, SiHCl$_3$, SiCl$_4$, SiF$_4$, or the like can also be used. The gas containing a silicide may be diluted with hydrogen, or with a gas in which one or more of the noble gas elements selected from helium, argon, krypton, and neon are added to hydrogen; thereby, the SAS film can be formed easily. It is preferable that the gas containing a silicide be diluted at a dilution ratio set to be in a range of 2 to 1000 times. Moreover, a carbide gas such as CH$_4$ or C$_2$H$_6$, a germanium gas such as GeH$_4$ or GeF$_4$, F$_2$, or the like may be mixed into the gas containing a silicide to adjust the energy band width to be from 1.5 to 2.4 eV or 0.9 to 1.1 eV.

After the p-type semiconductor layer 381p is formed, a semiconductor layer which does not contain an impurity imparting a conductivity type (referred to as an intrinsic semiconductor layer or an i-type semiconductor layer) 381i and the n-type semiconductor layer 381n are sequentially formed. Accordingly, the photoelectric conversion layer 381 including the p-type semiconductor layer 381p, the i-type semiconductor layer 381i, and the n-type semiconductor layer 381n is formed.

It is to be noted that, in the present specification, the i-type semiconductor layer indicates a semiconductor layer in which the concentration of an impurity imparting p-type or n-type conductivity is 1×10$^{20}$ cm$^{-3}$ or less, the concentration of oxygen and nitrogen is 5×10$^{19}$ cm$^{-3}$ or less, and photoconductivity compared to dark conductivity is 1000 times or greater. In addition, 10 to 1000 ppm of boron (B) may be added to the i-type semiconductor layer.

As the i-type semiconductor layer 381i, for example, a semiamorphous silicon film may be formed by a plasma CVD method. In addition, as the n-type semiconductor layer 381n, a semiamorphous silicon film containing an impurity element belonging to Group 15 of the periodic table, for example, phosphorus (P), may be formed, and alternatively, an impurity element belonging to Group 15 of the periodic table may be introduced after the semiamorphous silicon film is formed.

As the p-type semiconductor layer 381p, the intrinsic semiconductor layer 381i and the n-type semiconductor layer 381n, not only semiamorphous semiconductor films but also amorphous semiconductor films may be used.

Furthermore, impurity regions to be channel forming regions 372b and 373b and a source and drain of TFTs 372 and 373 are formed in island-shaped semiconductor layers 332 and 331. The island-shaped semiconductor layers 332 and 331 are formed by a method similar to that used to form the island-shaped semiconductor layers 106a to 106c in Embodiment 1, for example. Therefore, crystal grains in the island-shaped semiconductor layers 332 and 331 grow in the channel direction, and few crystal grain boundaries are contained in the channel forming regions 372b and 373b, which lowers the energy barriers against carriers such as electrons and holes. As a result, the mobility of the TFTs 372 and 373 becomes several hundreds of cm$^2$/(V·s), for example. In addition, variations in the properties of the island-shaped semiconductor layers 332 and 331 are suppressed and the generation of variations in the properties of the TFTs 372 and 373 can be suppressed.

Furthermore, each of the wiring 319, a connection electrode 320, a terminal electrode 351, a source or drain electrode 341 of a TFT 373 and a source or drain electrode 342 of a TFT 372 has a stacked layer structure of a refractory metal film and a low resistance metal film (such as an aluminum alloy or pure aluminum). Here, the wiring 319 has a three-layer structure in which a titanium film (Ti film), an aluminum film (Al film) and a Ti film are sequentially stacked.

Moreover, protective electrodes 318, 345, 348, 346 and 347 are formed so as to cover the wiring 319, the connection electrode 320, the terminal electrode 351, the source or drain electrode 341 of the TFT 373 and the source or drain electrode 342 of the TFT 372, respectively.

In etching the photoelectric conversion layer 381, the wiring 319 is protected by the protective electrode 318. As a material for the protective electrode 318, a conductive material having a slower etching speed than that of the photoelectric conversion layer with respect to a gas (or etchant) used to etch the photoelectric conversion layer 381 is preferable. In addition, a conductive material which does not react with the photoelectric conversion layer 381 to become an alloy is preferable as the material for the protective electrode 318. It is to be noted that the other protective electrodes 345, 348, 346 and 347 are also formed using a material and manufacturing process similar to that of the protective electrode 318.

Figure 29B:
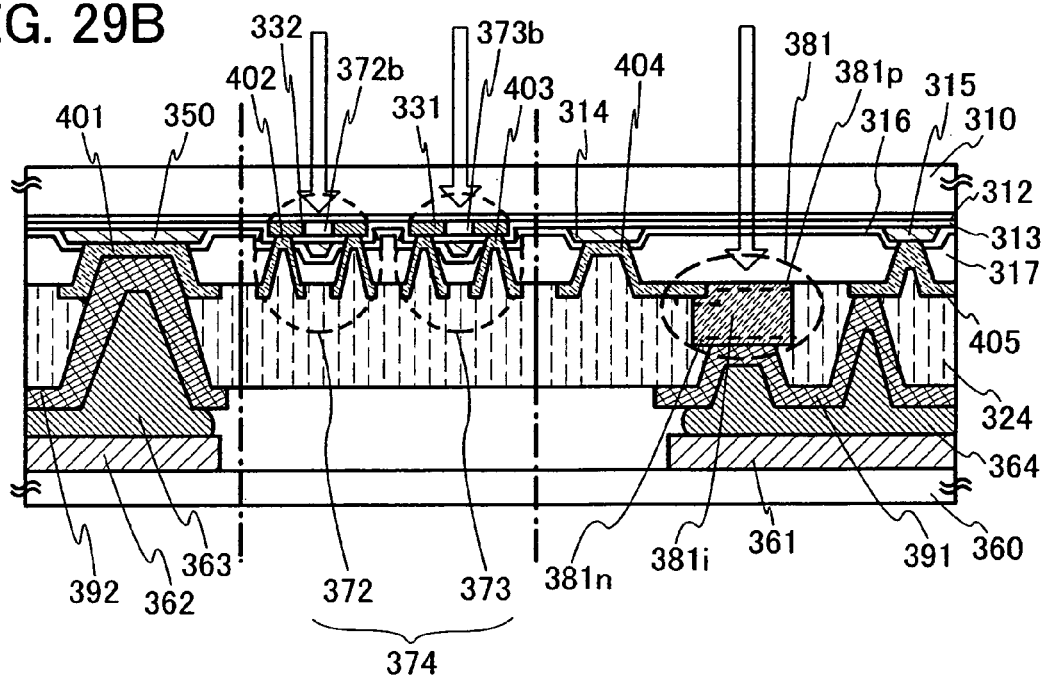

Also, a structure in which the protective electrodes 318, 345, 348, 346 and 347 are not provided over the wiring 319, the connection electrode 320, and the terminal electrode 351 may be employed. An optical sensor having such a structure is shown in FIG. 29B. In FIG. 29B, each of a wiring 404, a connection electrode 405, a terminal electrode 401, a source or drain electrode 402 of a TFT 372, and a source or drain electrode 403 of a TFT 373 is formed using a single-layer conductive film, and as such a conductive film, a titanium film (Ti film) is preferable. In addition, a single-layer film formed using an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), an alloy material or compound material containing the above element as its main component, or a single-layer film formed using nitride of these elements, for example, titanium nitride, tungsten nitride, tantalum nitride, or molybdenum nitride, can be used instead of the titanium film. The number of film formations can be reduced for a manufacturing process by forming each of the wiring 404, the connection electrode 405, the terminal electrode 401, the source or drain electrode 402 of the TFT 372, and the source or drain electrode 403 of the TFT 373 as a single-layer film.

In FIGS. 29A and 29B, an example of a top gate TFT having a structure in which each of the n-channel TFTs 372 and 373 includes one channel forming region (in the present specification, referred to as a single gate structure) is shown; however, a structure having a plurality of channel forming regions may also be used to reduce variations in the ON current value. In order to reduce the OFF current value, a lightly doped drain (LDD) region may be provided in the n-channel TFTs 372 and 373. The LDD region is a region to which an impurity element is added at low concentration between a channel forming region and a source or drain region which is formed by being doped with an impurity element at high concentration. By providing the LDD region, the effects of reducing the electric field in the vicinity of the drain region and preventing deterioration due to hot carrier injection can be obtained. In addition, in order to prevent deterioration of the ON current value due to hot carriers, the n-channel TFTs 372 and 373 may have a structure in which an LDD region and a gate electrode are placed so as to overlap each other with a gate insulating film therebetween (in the present specification, referred to as a GOLD (Gate-drain Overlapped LDD) structure).

When the GOLD structure is used, the effects of reducing the electric field in the vicinity of a drain region and preventing deterioration due to hot carrier injection are more enhanced than in the case where an LDD region and a gate electrode do not overlap each other By employing the GOLD structure like this, electric field intensity in the vicinity of a drain region is reduced and hot carrier injection can be prevented; therefore, it is effective for prevention of deterioration phenomenon.

The TFTs 372 and 373 included in the current mirror circuit 374 may be bottom gate TFTs, for example, inversely staggered TFTs, instead of top gate TFTs. In this case, it is preferable that a gate electrode have a light-transmitting property so as not to block received light.

In addition, a wiring 314 is connected to the wiring 319 (the wiring 404 in FIG. 29B) and also becomes a gate electrode extending to an upper side of the channel forming region 373b of the TFT 373 of an amplifier circuit.

In addition, a wiring 315 is connected to the n-type semiconductor layer 381n and connected to a drain wiring (also referred to as a drain electrode) or source wiring (also referred to as a source electrode) of the TFT 372. Reference numerals 316 and 317 denote insulating films and 320 denotes a connection electrode. Since light which is received passes through the insulating films 316 and 317, a material having a high light-transmitting property is preferably used as the materials for all of these. It is to be noted that, as the insulating film 317, a silicon oxide (SiOx) film which is formed by a CVD method is preferably used. When the insulating film 317 is formed using a silicon oxide film by a CVD method, fixing strength is improved.

In addition, a terminal electrode 350 is formed by the same process as the wirings 314 and 315, and a terminal electrode 351 is formed by the same process as the wiring 319 and the connection electrode 320.

A terminal electrode 391 is connected to the n-type semiconductor layer 381n, and mounted on an electrode 361 of a substrate 360 by a solder joint 364. A terminal electrode 392 is formed by the same process as the terminal electrode 391 and mounted on an electrode 362 of the substrate 360 by a solder joint 363 (refer to FIG. 29A).

In FIGS. 29A and 29B, as shown by arrows in the drawings, light enters the photoelectric conversion layer 381 and island-shaped semiconductor layers 332 and 331 of the TFTs 372 and 373 from the substrate 310 side. Accordingly, a photoelectric current is generated, and light can be detected.

Although not shown in the drawings, light enters not only from the direction of the arrow but also from the opposite side, that is, from the substrate 360 side. The entering light goes through a sealing layer 324, goes around the electrode or wiring which blocks light, and enters the photoelectric conversion layer 381 and the island-shaped semiconductor layers 332 and 331 of the TFTs 372 and 373, whereby, a photoelectric current can be generated.

Next, a manufacturing method of the semiconductor device shown in FIGS. 29A and 29B will be described. First, a semiconductor element is formed over a substrate (a first substrate 310) in the following way. Here, a glass substrate AN100 (trade name) is used as the substrate 310.

First, a silicon oxide film containing nitrogen which serves as a base insulating film 312 (100 nm thick) is formed by a plasma CVD method, and a semiconductor film e.g., an amorphous silicon film containing hydrogen (66 nm thick), is stacked thereover without being exposed to air. In addition, a silicon oxide film, a silicon nitride film, and a silicon oxide film containing nitrogen may be stacked to form the base insulating film 312. For example, a silicon nitride film containing oxygen with a thickness of 50 nm, and further, a silicon oxide film containing nitrogen with a thickness of 100 nm may be stacked to form the base insulating film 312. It is to be noted that the silicon oxide film containing nitrogen or the silicon nitride film serves as a blocking layer for preventing the diffusion of impurities such as an alkali metal from a glass substrate.

Subsequently, the amorphous silicon film is crystallized using a laser apparatus so as to form a semiconductor film having a crystal structure, for example, a polycrystalline silicon film. A method similar to that of the first or second embodiment mode can be used for this process; therefore, a detailed description is omitted here.

Figure 30A:
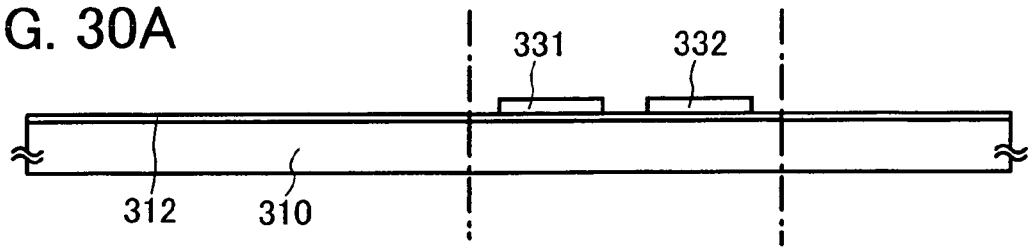
FIGS. 30A to 30D are diagrams used to explain a manufacturing method of a semiconductor device related to Embodiment 8.

Then, after a thin oxide film is formed with ozonated water on the surface of the obtained semiconductor film having a crystal structure (such as a crystalline silicon film), a mask made of resist is formed by using a first photomask, and etching treatment is conducted so that a desired shape is obtained, whereby semiconductor films separated into island shapes 331 and 332 are formed (referred to as island-shaped semiconductor layers in the present specification) (refer to FIG. 30A). With the island-shaped semiconductor layers 331 and 332, TFTs 373 and 372 are formed. After the island-shaped semiconductor layers 331 and 332 are formed, the mask made of resist is removed.

As described above, the semiconductor film having a crystal structure is formed by a method similar to that of the first or second embodiment mode. Therefore, crystal grains in the island-shaped semiconductor layers 331 and 332 grow in the channel direction, and few crystal grain boundaries are contained in the channel forming regions 373b and 372b of the TFTs 373 and 372, which lowers the energy barriers against carriers such as electrons and holes. As a result, the mobility of the TFTs 373 and 372 becomes several hundreds of cm$^2$/(V·s), for example. In addition, variations in the properties of the island-shaped semiconductor layers 331 and 332 are suppressed and the generation of variations in the properties of the TFTs 373 and 372 can be suppressed.

Subsequently, if necessary, doping of a slight amount of an impurity element (boron or phosphorus) is performed to control the threshold value of a TFT. Here, an ion doping method is used, in which diborane ($B_2H_6$) is not separated by mass but is excited by plasma.

Next, the oxide film is removed with an etchant containing hydrofluoric acid, and at the same time, the surface of the island-shaped semiconductor layers 331 and 332 is washed. Then, an insulating film containing silicon as its main component, which serves as a gate insulating film 313, is formed. Here, a silicon oxide film containing nitrogen (composition ratio: Si=32%, O=59%, N=7%, H=2%, for example) is formed to have a thickness of 115 nm by a plasma CVD method.

Figure 30B:
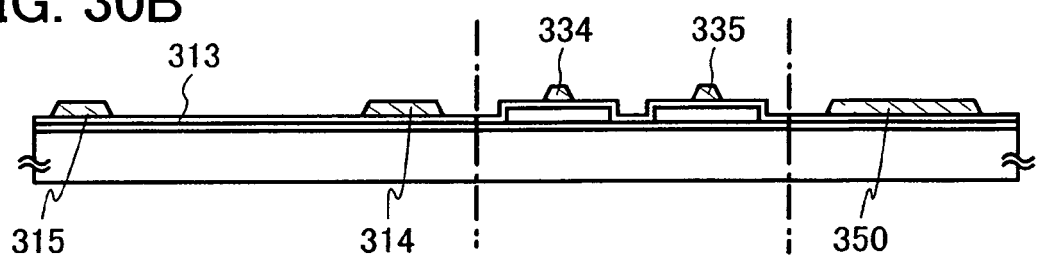

Then, after a metal film is formed over the gate insulating film 313, patterning using a second photomask is performed so as to form gate electrodes 334 and 335, wirings 314 and 315, and a terminal electrode 350 (refer to FIG. 30B). For example, as the metal film, a film which is formed by stacking tantalum nitride (TaN) and tungsten (W) to be 30 nm and 370 nm, respectively, is used.

In addition to the above-described materials, as the gate electrodes 334 and 335, the wirings 314 and 315, and the terminal electrode 350, a single-layer film formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) and copper (Cu), or an alloy material or compound material containing the element as its main component; or a single-layer film formed using a nitride thereof, such as titanium nitride, tungsten nitride, tantalum nitride or molybdenum nitride, can be used.

Figure 30C:
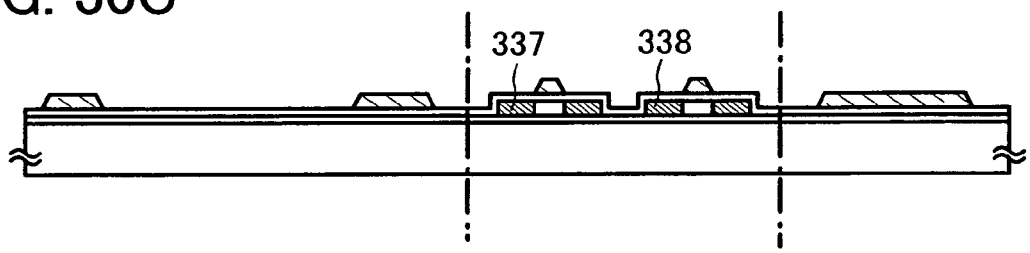

Then, introduction of an impurity imparting one conductivity type to the island-shaped semiconductor layers 331 and 332 is performed so as to form a source or drain region 337 of the TFT 373 and a source or drain region 338 of the TFT 372 (refer to FIG. 30C). In this embodiment, an n-type impurity, such as phosphorus (P) or arsenic (As), is introduced into the island-shaped semiconductor layers 331 and 332 so that n-channel TFTs are formed.

Subsequently, after a first interlayer insulating film including a silicon oxide film (not illustrated) is formed so as to be 50 nm thick by a CVD method, an activation step of an impurity element added to each island-shaped semiconductor layer is conducted. The activation step is conducted by a rapid thermal annealing method (RTA method) using a lamp light source, a method of irradiation by a YAG laser or an excimer laser from the back side, heat treatment using a furnace, or a combination of the foregoing methods.

Next, a second interlayer insulating film 316 including a silicon nitride film containing hydrogen and oxygen is formed to have a film thickness of, e.g., 10 nm.

Figure 30D:
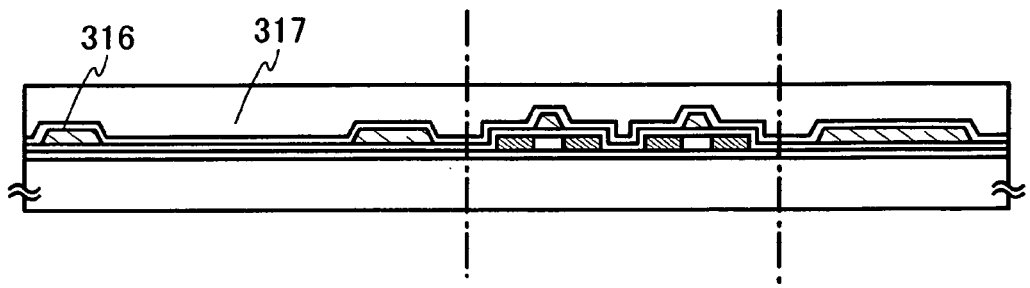

Subsequently, a third interlayer insulating film 317 is formed using an insulator material over the second interlayer insulating film 316 (refer to FIG. 30D). An insulating film obtained by a CVD method can be used for the third interlayer insulating film 317. In this embodiment, in order to improve adhesiveness, a silicon oxide film containing nitrogen is formed to have a film thickness of 900 nm as the third interlayer insulating film 317.

Then, heat treatment (heat treatment at 300 to 550° C. for 1 to 12 hours, for example, at 410° C. for 1 hour in a nitrogen atmosphere) is conducted in order to hydrogenate the island-shaped semiconductor layers. This step is conducted to terminate dangling bonds in the island-shaped semiconductor layers caused by hydrogen contained in the second interlayer insulating film 316. The island-shaped semiconductor layers can be hydrogenated regardless of the existence of the gate insulating film 313.

In addition, as the third interlayer insulating film 317, an insulating film using siloxane and a stacked structure thereof can also be used.

In the case where an insulating film using siloxane or a stacked structure thereof is used as the third interlayer insulating film 317, after the second interlayer insulating film 316 is formed, heat treatment for hydrogenating the island-shaped semiconductor layers may be conducted, and then, the third interlayer insulating film 317 may be formed.

Then, a mask made of resist is formed by using a third photomask, and the first interlayer insulating film, the second interlayer insulating film 316, and the third interlayer insulating film 317 or the gate insulating film 313 are selectively etched so as to form contact holes. Then, the mask made of resist is removed.

It is to be noted that the third interlayer insulating film 317 may be formed if necessary. When the third interlayer insulating film 317 is not formed, after the second interlayer insulating film 316 is formed, the first interlayer insulating film, the second interlayer insulating film 316, and the gate insulating film 313 are selectively etched so as to form contact holes.

Subsequently, after stacked metal films are formed by a sputtering method, a mask made of resist is formed by using a fourth photomask, and then, the metal films are selectively etched so as to form the wiring 319, the connection electrode 320, the terminal electrode 351, a source or drain electrode 341 of the TFT 372, and a source or drain electrode 342 of the TFT 373. Then, the mask made of resist is removed. It is to be noted that the stacked metal films of this embodiment have a stacked structure of three layers: a Ti film that is 100 nm thick, an Al film containing a slight amount of Si that is 350 nm thick, and a Ti film that is 100 nm thick.

In addition, in the case where each of the wiring 404, the connection electrode 405, the terminal electrode 401, the source or drain electrode 402 of the TFT 372, and the source or drain electrode 403 of the TFT 373 is formed using a single-layer conductive film as shown in FIG. 29B, a titanium film (Ti film) is preferably used in terms of heat resistance, conductivity, or the like. In addition, instead of the titanium film, a single-layer film formed using an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the element as its main component; or a single-layer film formed using a nitride thereof, such as titanium nitride, tungsten nitride, tantalum nitride or molybdenum nitride, can be used. By forming each of the wiring 404, the connection electrode 405, the terminal electrode 401, the source or drain electrode 402 of the TFT 372, and the source or drain electrode 403 of the TFT 373 as a single-layer film, the number of film formations can be reduced for the manufacturing process.

By the above-described process, the top-gate TFTs 372 and 373 using polycrystalline silicon films can be manufactured.

Subsequently, a conductive metal film (titanium (Ti) or molybdenum (Mo), for example) which does not easily react to make an alloy with a photoelectric conversion layer (amorphous silicon, typically) to be formed later is formed. After that, a mask made of resist is formed using a fifth photomask, and the conductive metal film is selectively etched so as to form a protective electrode 318 covering the wiring 319 (refer to FIG. 31A). Here, a Ti film with a thickness of 200 nm obtained by a sputtering method is used. It is to be noted that the connection electrode 320, the terminal electrode 351, and the source or drain electrodes of the TFTs are also covered with conductive metal films 345, 348, 346, and 347, similarly. Therefore, the conductive metal films cover side faces where second-layer Al films are exposed in these electrodes, preventing aluminum atoms from diffusing to the photoelectric conversion layer.

However, in the case where each of the wiring 319, the connection electrode 320, the terminal electrode 351, the source or drain electrode 341 of the TFT 372, and the source or drain electrode 342 of the TFT 373 is formed using a single-layer conductive film, that is, in the case where, as shown in FIG. 29B, the wiring 404, the connection electrode 405, the terminal electrode 401, the source or drain electrode 402 of the TFT 372, and the source or drain electrode 403 of the TFT 373 are formed instead of these electrodes and wirings, the protective electrodes 318, 345, 348, 346, and 347 may not necessarily be formed.

Next, a photoelectric conversion layer 381 including a p-type semiconductor layer 381p, an i-type semiconductor layer 381i, and an n-type semiconductor layer 381n is formed over the third interlayer insulating film 317.

The p-type semiconductor layer 381p may be formed by depositing a semiamorphous silicon film containing an impurity element belonging to Group 13 of the periodic table, for example, boron (B), by a plasma CVD method.

In addition, the wiring 319 and the protective electrode 318 are in contact with the bottom layer of the photoelectric conversion layer 381, in this embodiment, the p-type semiconductor layer 381p.

When the p-type semiconductor layer 381p is formed, the i-type semiconductor layer 381i and the n-type semiconductor layer 381n are formed sequentially. In this manner, the photoelectric conversion layer 381 including the p-type semiconductor layer 381p, the i-type semiconductor layer 381i, and the n-type semiconductor layer 381n is formed.

As the i-type semiconductor layer 381i, a semiamorphous silicon film may be formed by a plasma CVD method, for example. As the n-type semiconductor layer 381n, a semi-amorphous silicon film containing an impurity element belonging to Group 15 of the periodic table, for example, phosphorus (P), may be formed, or an impurity element belonging to Group 15 of the periodic table may be introduced after a semiamorphous silicon film is formed.

Furthermore, as the p-type semiconductor layer 381p, the intrinsic semiconductor layer 381i, and the n-type semiconductor layer 381n, not only semiamorphous semiconductor films but also amorphous semiconductor films may be used.

Figure 31A:
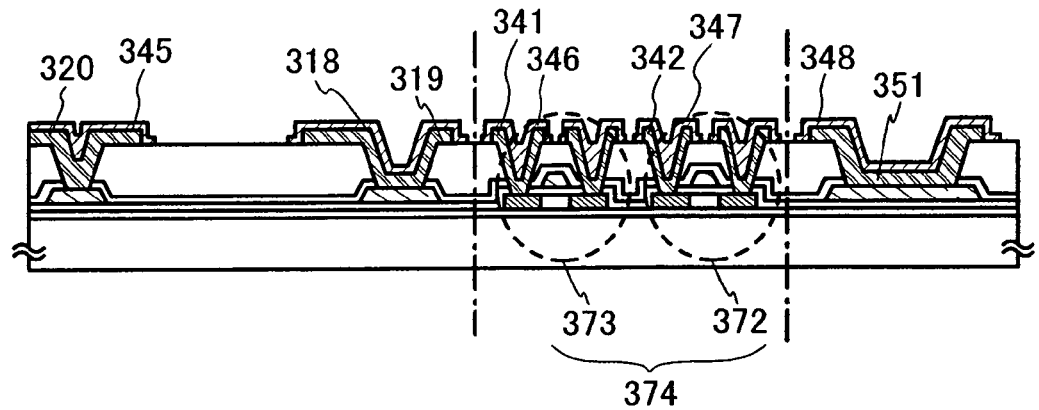
FIGS. 31A to 31C are diagrams used to explain a manufacturing method of a semiconductor device related to Embodiment 8.
Figure 31B:
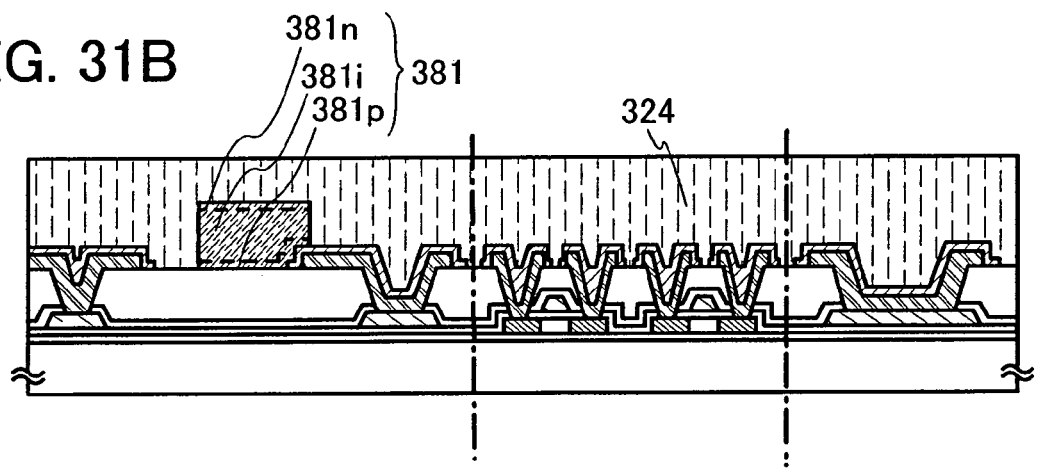

Then, a sealing layer 324 including an insulator material (for example, an inorganic insulating film containing silicon) is formed to have a thickness of 1 to 30 µm over the entire surface, and the state shown in FIG. 31B is obtained. Here, a silicon oxide film containing nitrogen that is 1 µm thick is formed by a CVD method as the insulator material film. At this time, adhesiveness is improved by using the insulating film formed by a CVD method.

Next, after the sealing layer 324 is etched to provide openings, terminal electrodes 391 and 392 are formed by a sputtering method. The terminal electrodes 391 and 392 are made with a stacked structure of a titanium film (Ti film, 100 nm thick), a nickel film (Ni film, 300 nm thick), and a gold film (Au film, 50 nm thick). The fixing strength of the terminal electrodes 391 and 392 obtained in this manner is greater than 5 N, which is a sufficient fixing strength for the terminal electrode.

Figure 31C:
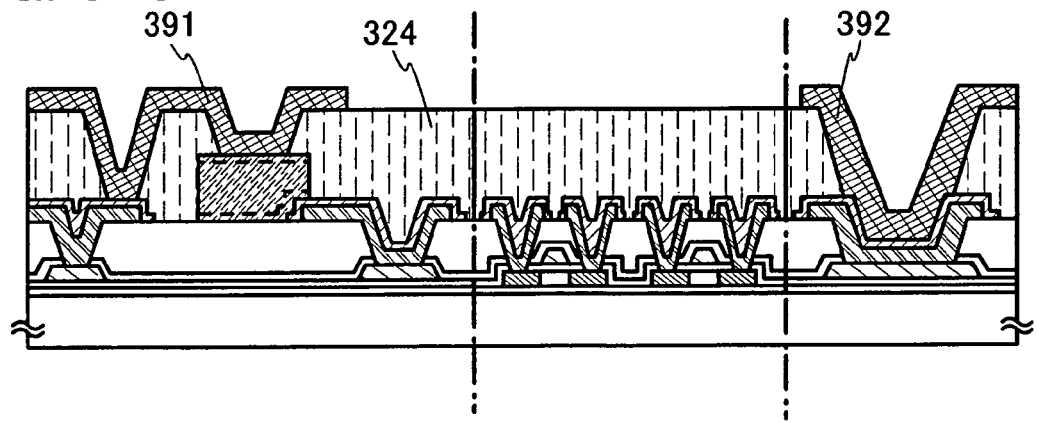

In the above-described process, the terminal electrodes 391 and 392 that can be connected by solder joint are formed, and a structure shown in FIG. 31C is obtained.

Subsequently, a plurality of optical sensor chips are cut out by cutting the substrate into pieces. A large number of optical sensor chips (for example, an optical sensor chip with an area of 2 mm×1.5 mm) can be manufactured from one large-area substrate (for example, a substrate with an area of 600 cm×720 cm).

Figure 32A:
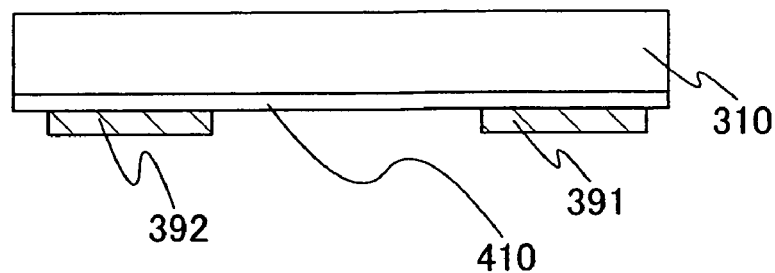
FIGS. 32A to 32C are diagrams used to explain a semiconductor device related to Embodiment 8.
Figure 32B:
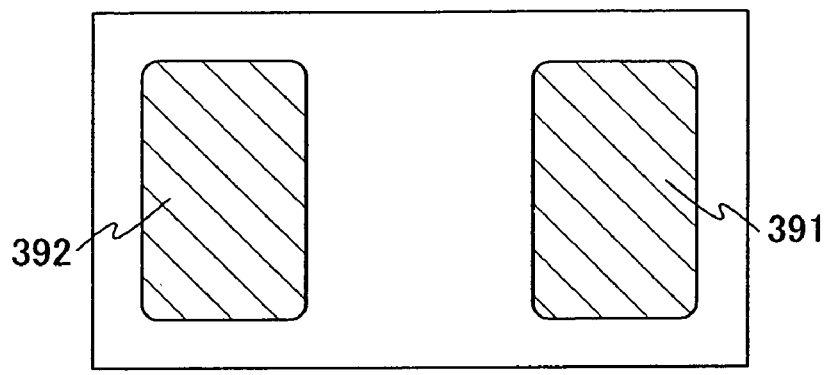
Figure 32C:
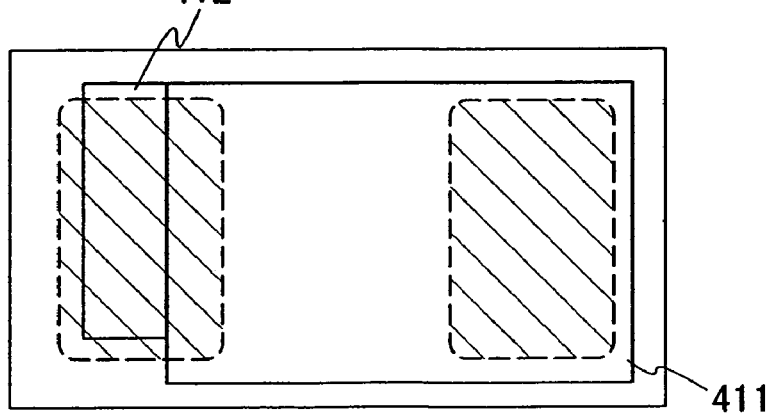

A cross-sectional view of one optical sensor chip (for example, one with an area of 2 mm×1.5 mm) that is cut out is shown in FIG. 32A, a bottom view thereof is shown in FIG. 32B, and a top view thereof is shown in FIG. 32C. In FIGS. 32A to 32C, the same reference numerals as in FIGS. 29A to 29C, FIGS. 30A to 30C, and 31A to 31C are used for the same portions. It is to be noted that, in FIG. 32A, the total film thickness of the substrate 310, an element formation region 410, and the terminal electrodes 391 and 392 is 0.8±0.05 mm, for example.

In addition, in order to reduce the total film thickness of the optical sensor chip, a plurality of optical sensor chips may be cut out by cutting the substrate into pieces using a dicer after the substrate 310 is ground and thinned by CMP treatment or the like.

In FIG. 32B, the electrode size of one of the terminal electrodes 391 and 392 is 0.6 mm×1.1 mm, for example, and the electrode interval is 0.4 mm, for example. In addition, in FIG. 32C, the area of a light receiving portion 411 is 1.57 mm². Furthermore, an amplifier circuit portion 412 is provided with approximately 100 TFTs.

Finally, the obtained optical sensor chip is mounted on the mounting side of the substrate 360. Solder joints 364 and 363 are used for a connection between the terminal electrode 391 and the electrode 361 and for a connection between the terminal electrode 392 and the electrode 362, respectively. The solder joints are formed in advance by a screen printing method or the like over the electrodes 361 and 362 of the substrate 360, and the solder joints and the terminal electrodes are made so as to be in contact with each other to mount the optical sensor chip by a reflow soldering process. The reflow soldering process is conducted, for example, at approximately 255 to 265° C. for about 10 seconds in an inert gas atmosphere. Furthermore, in addition to solder, a bump made of a metal (such as gold or silver) or a bump made of a conductive resin or the like can be used. In addition, lead-free solder may also be used for mounting in consideration of an environmental problem.

It is to be noted that this embodiment can be combined with any description in the other embodiments.

Embodiment 9

In this embodiment, examples of various electronic devices in which a semiconductor device obtained in Embodiment 8 is incorporated will be described. As electronic devices to which the present invention is applied, computers, displays, cellular phones, televisions, and the like are given. Specific examples of such electronic devices are shown in FIGS. 33, 34A, 34B, 35A, 35B, and 36.

Figure 33:
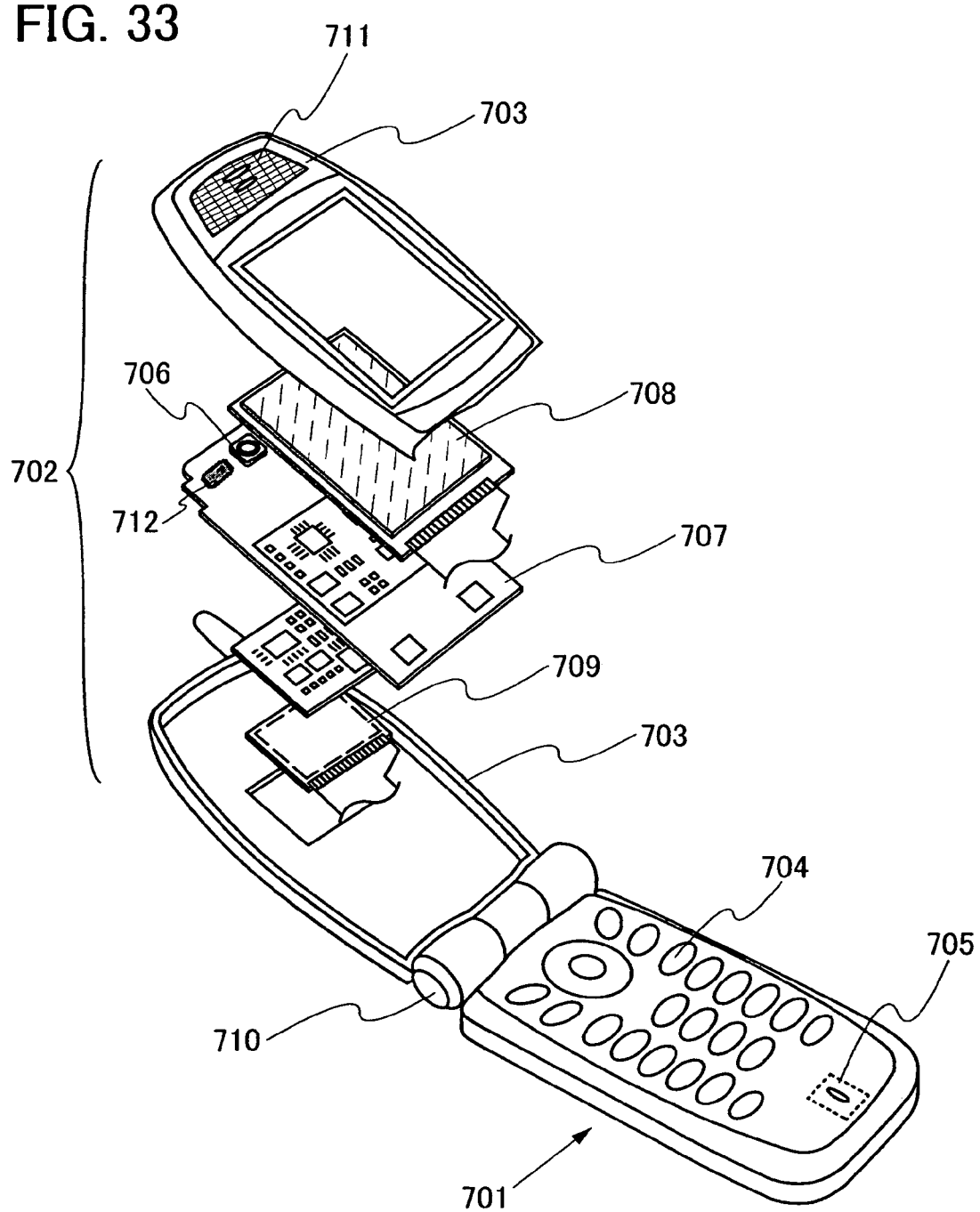
FIG. 33 is a diagram used to explain an electronic device related to Embodiment 9.

FIG. 33 shows a cellular phone, which includes a main body (A) 701, a main body (B) 702, a chassis 703, operation keys 704, a sound input portion 705, a sound output portion 706, a circuit board 707, a display panel (A) 708, a display panel (B) 709, a hinge 710, a light transmitting material portion 711, and an optical sensor 712. The semiconductor device described in Embodiment 8 can be applied to the optical sensor 712. Thus, the generation of variations in the properties of the optical sensor 712 can be suppressed.

The optical sensor 712 detects light which has passed through the light transmitting material portion 711, controls the luminance of the display panel (A) 708 and the display panel (B) 709 depending on the illuminance of the detected external light, and controls the illumination of the operation keys 704 based on the illuminance obtained by the optical sensor 712. In this manner, current consumption of the cellular phone can be reduced.

Figure 34A:
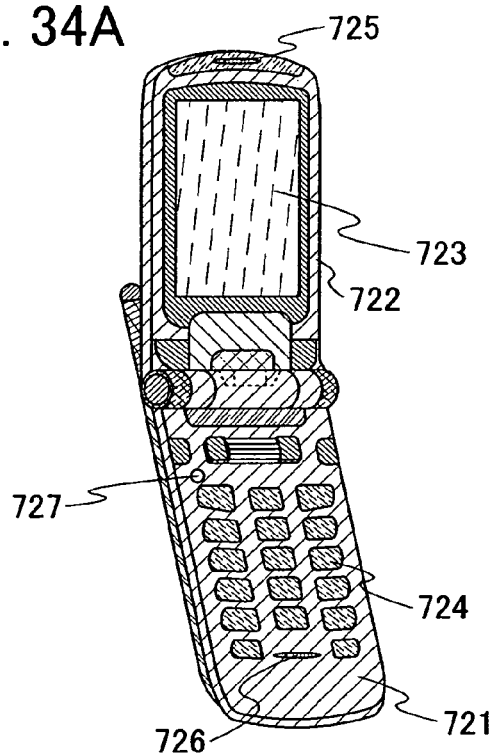
FIGS. 34A and 34B are diagrams used to explain an electronic device related to Embodiment 9.
Figure 34B:
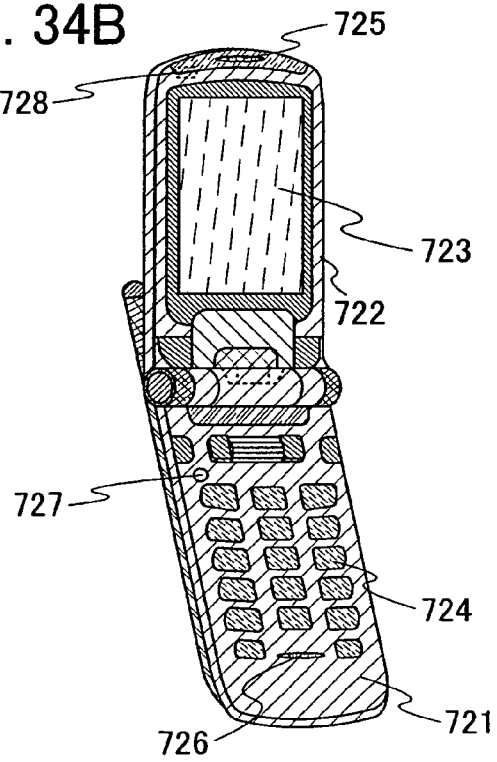

FIGS. 34A and 34B show other examples of a cellular phone. In FIGS. 34A and 34B, a reference numeral 721 denotes a main body; 722, a chassis; 723, a display panel; 724, operation keys; 725, a sound output portion; 726, a sound input portion; and 727 and 728, optical sensor portions to which the semiconductor device described in Embodiment 8 can be applied. Thus, the generation of variations in the properties of the optical sensor portions 727 and 728 can be suppressed.

In the cellular phone shown in FIG. 34A, the luminance of the display panel 723 and the operation keys 724 can be controlled through the detection of external light by the optical sensor portion 728 provided in the main body 721.

Furthermore, in the cellular phone shown in FIG. 34B, an optical sensor portion 728 is provided inside the main body 721 in addition to the structure of FIG. 34A. By the optical sensor portion 728, the luminance of a backlight that is provided in the display panel 723 can also be detected.

Figure 35A:
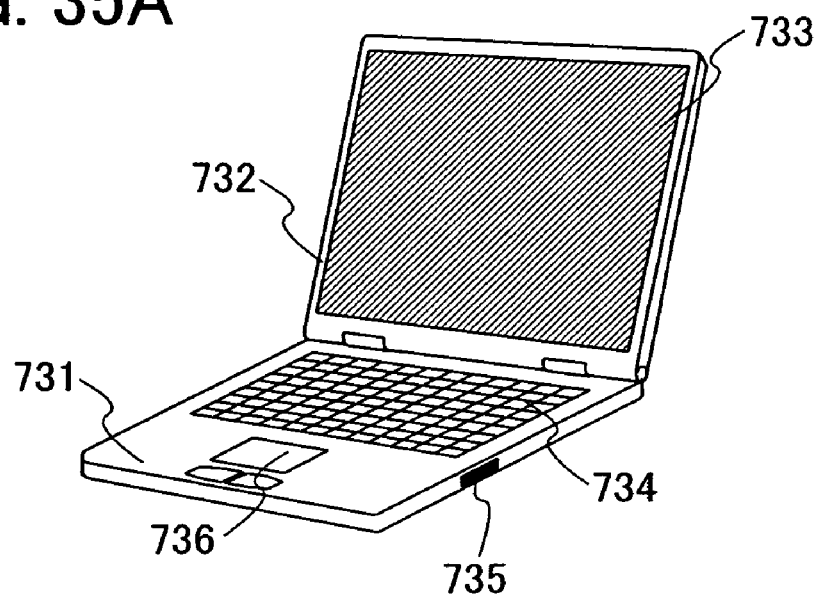
FIGS. 35A and 35B are diagrams used to explain an electronic device related to Embodiment 9.

FIG. 35A shows a computer, which includes a main body 731, a chassis 732, a display portion 733, a keyboard 734, an external connection port 735, a pointing mouse 736, and the like.

Figure 35B:
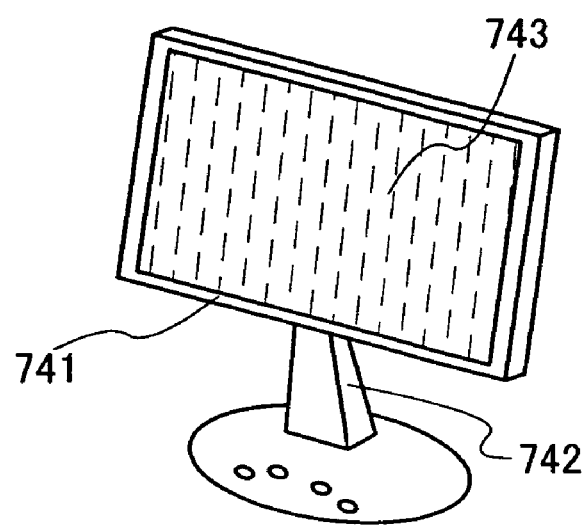

In addition, FIG. 35B shows a display device such as a television receiver. The display device includes a chassis 741, a support 742, a display portion 743, and the like.

Figure 36:
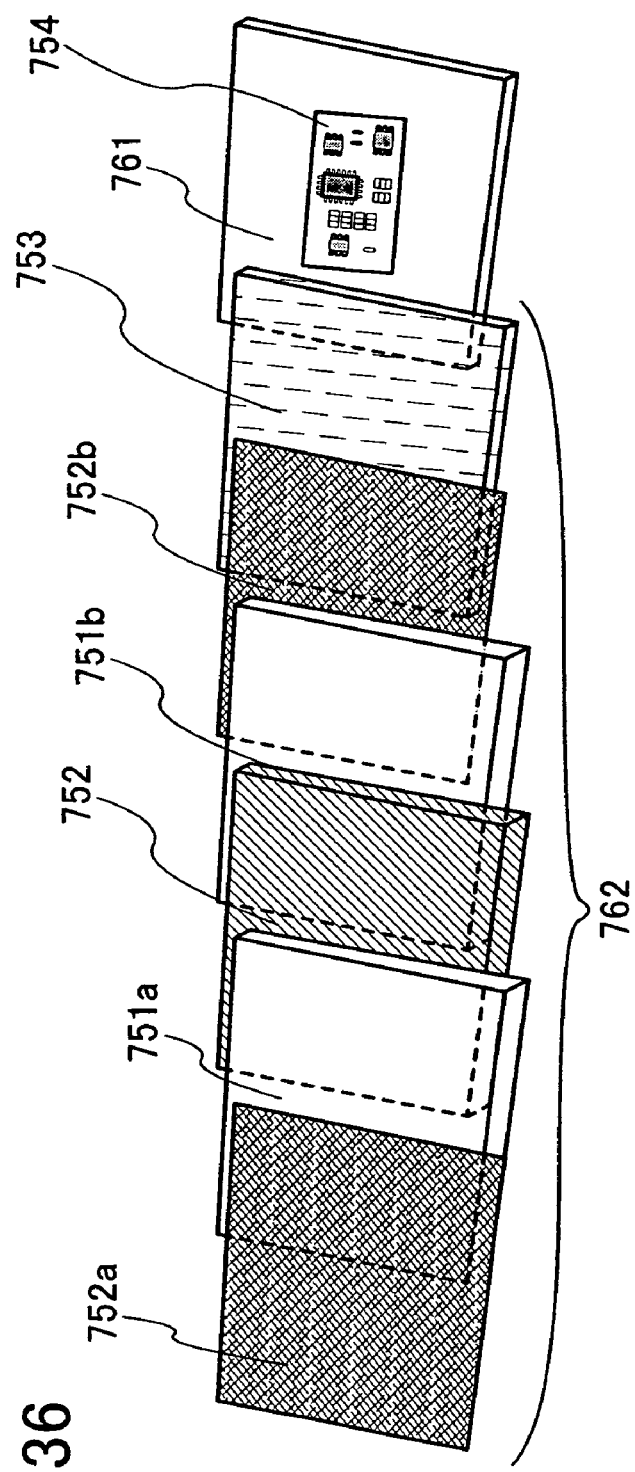
FIG. 36 is a diagram used to explain a liquid crystal panel included in an electronic device related to Embodiment 9.
Figure 37:
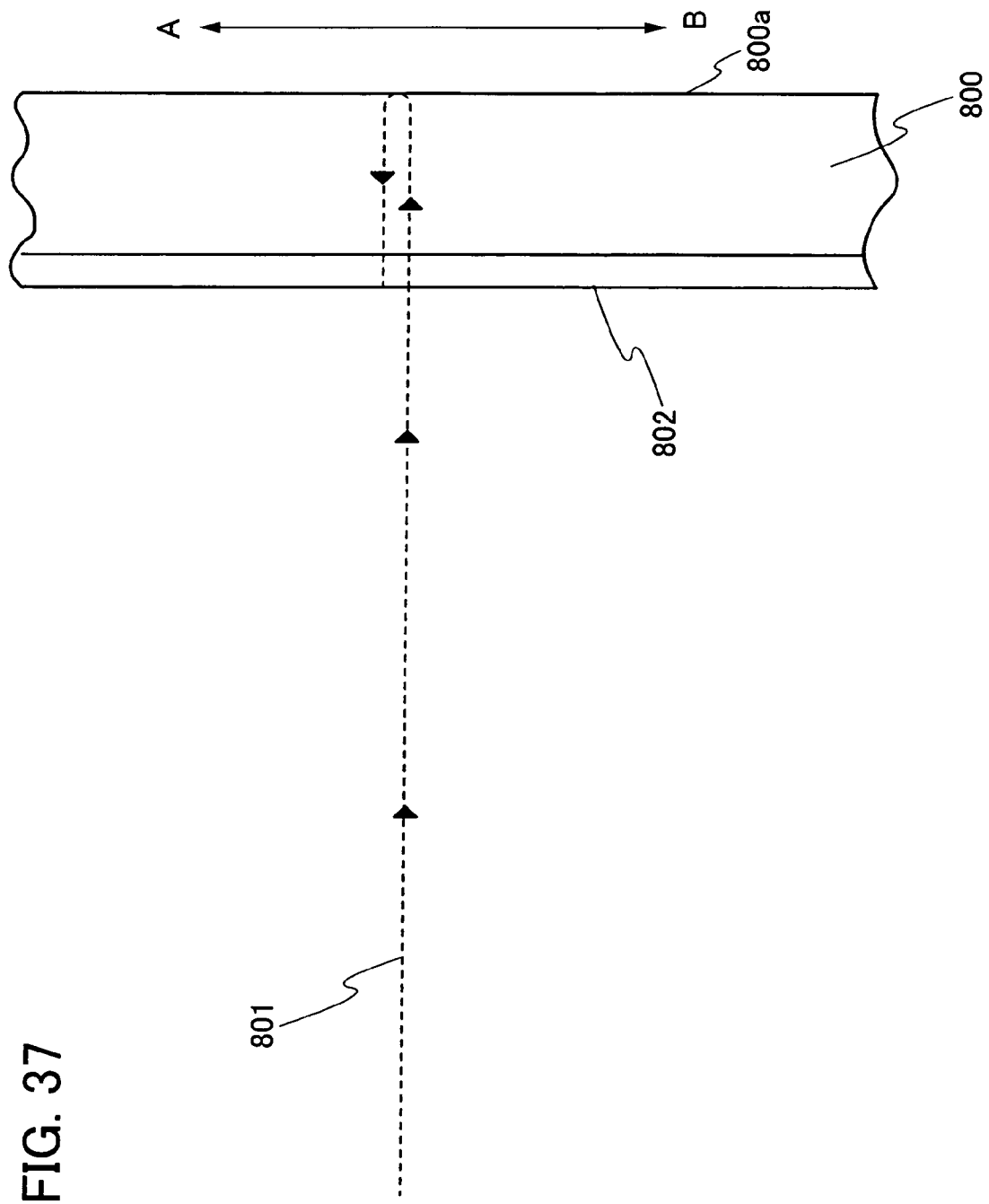
FIG. 37 is a diagram used to show a crystallization method for a semiconductor device related to a first conventional example.
Figure 38:
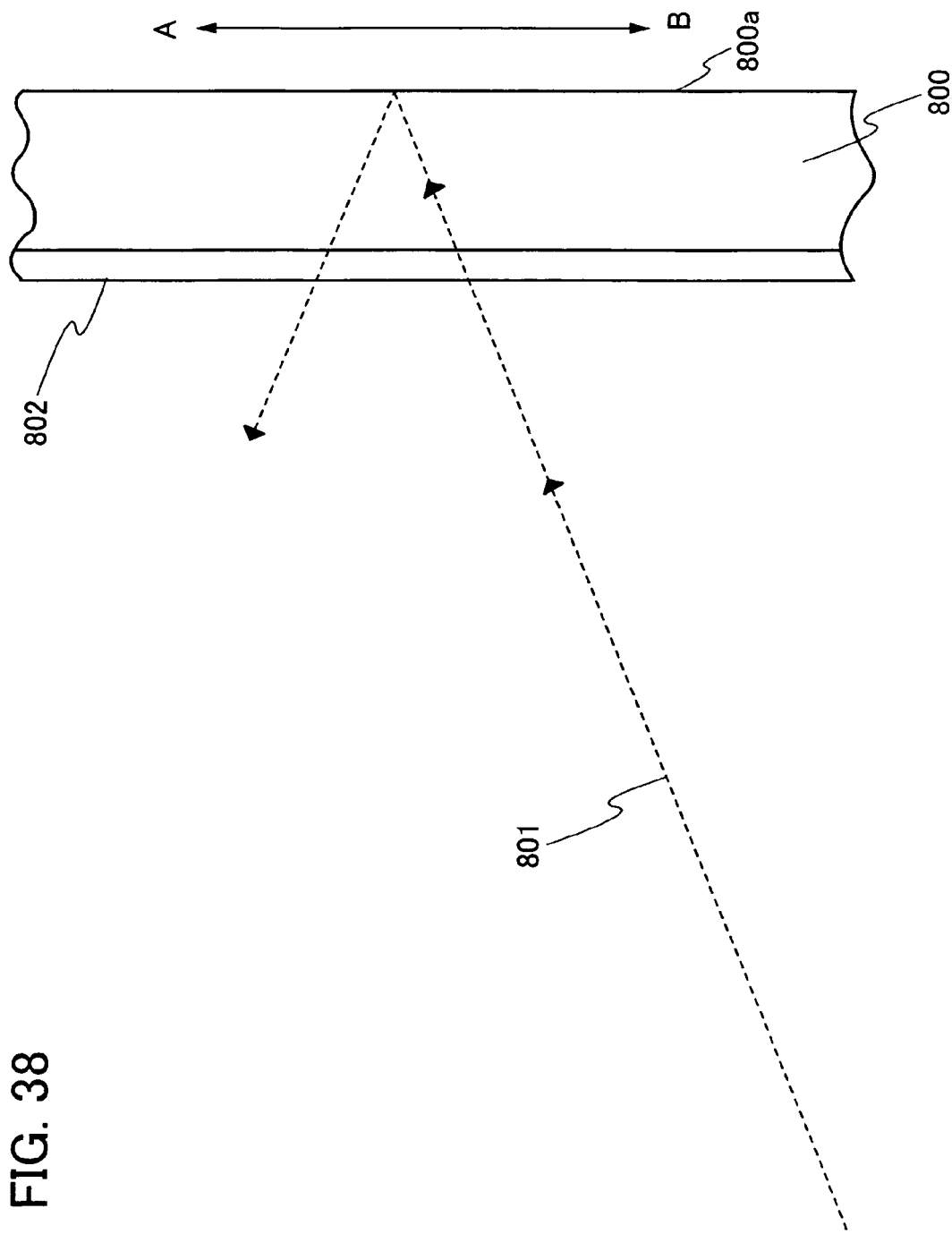
FIG. 38 is a diagram used to show a crystallization method for a semiconductor device related to a second conventional example.

A detailed structure of cases where liquid crystal panels are used for the display portion 733 of the computer shown in FIG. 35A and the display portion 743 of the display device shown in FIG. 35B is shown in FIG. 36.

A liquid crystal panel 762 shown in FIG. 36 is built in the chassis 761 and includes substrates 751a and 751b, a liquid crystal layer 752 interposed between the substrates 751a and 751b, polarizing filters 752a and 752b, a backlight 753, and the like. In addition, an optical sensor portion 754 is formed in the chassis 761. The semiconductor device described in Embodiment 8 can be applied to the optical sensor portion 754. Thus, the generation of variations in the properties of the optical sensor 754 can be suppressed.

The optical sensor portion 754 detects the amount of light from the backlight 753, and the information is fed back to adjust the luminance of the liquid crystal panel 762.

It is to be noted that the present invention is not limited to the above-described Embodiment Modes and Embodiments and can be carried out while being changed in various ways without departing from the scope of the present invention.

This application is based on Japanese Patent Application serial No. 2006-025276 filed in Japan Patent Office on Feb. 2, 2006, the contents of which are hereby incorporated by reference.

What is claimed is:

1. A method for crystallizing a semiconductor film, comprising the steps of:
   oscillating a first laser beam by a first oscillator;
   oscillating a second laser beam by a second oscillator;
   processing the first laser beam and the second laser beam, so as each have a linear cross section extending along a surface of the semiconductor film;
   irradiating the semiconductor film with the first laser beam and the second laser beam concurrently;
   moving an irradiated portion of the semiconductor film along a direction substantially perpendicular to the linear cross section of the first laser beam and the second laser beam,
   wherein the first laser beam is incident on the semiconductor film at a first angle with respect to a plane extending perpendicularly from the surface of the semiconductor film and extending along the linear cross section of the first laser beam and the second laser beam, and
   wherein the second laser beam is incident on the semiconductor film at a second angle opposite the first angle of the first laser beam with respect to the plane.

2. A method for crystallizing a semiconductor film according to claim 1, wherein each of the first oscillator and the second oscillator is a pulsed laser oscillator with an oscillating frequency of 10 MHz or more or a CW laser oscillator.

3. A method for crystallizing a semiconductor film, comprising the steps of:
   oscillating a laser beam by an oscillator;
   splitting the laser beam into a first laser beam and a second laser beam;
   processing the first laser beam and the second laser beam, so as each have a linear cross section extending along a surface of the semiconductor film;
   irradiating the semiconductor film with the first laser beam and the second laser beam concurrently;
   moving an irradiated portion of the semiconductor film along a direction substantially perpendicular to the linear cross section of the first laser beam and the second laser beam,
   wherein the first laser beam is incident on the semiconductor film at a first angle with respect to a plane extending perpendicularly from the surface of the semiconductor film and extending along the linear cross section of the first laser beam and the second laser beam
   wherein the second laser beam is incident on the semiconductor film at a second angle opposite the first angle of the first laser beam with respect to the plane,
   wherein an optical path length of the first laser beam is different from an optical path length of the second laser beam.

4. A method for crystallizing a semiconductor film according to claim 3, wherein the laser beam are split by a beam splitter.

5. A method for crystallizing a semiconductor film according to claim 3, wherein the oscillator is a pulsed laser oscillator with an oscillating frequency of 10 MHz or more.

6. A method for crystallizing a semiconductor film according to claim 3, wherein difference in the optical path lengths between the first laser beam and the second laser beam is greater than or equal to 1 cm and less than or equal to 30 cm.

7. A method for crystallizing a semiconductor film, comprising the steps of:
  oscillating a laser beam by an oscillator;
  splitting the laser beam into a first laser beam and a second laser beam;
  processing the first laser beam and the second laser beam, so as each have a linear cross section extending along a surface of the semiconductor film;
  irradiating the semiconductor film with the first laser beam and the second laser beam concurrently;
  moving an irradiated portion of the semiconductor film along a direction substantially perpendicular to the linear cross section of the first laser beam and the second laser beam,
  wherein the first laser beam is incident on the semiconductor film at a first angle with respect to a plane extending perpendicularly from the surface of the semiconductor film and extending along the linear cross section of the first laser beam and the second laser beam,
  wherein the second laser beam is incident on the semiconductor film at a second angle opposite the first angle of the first laser beam with respect to the plane.

8. A method for crystallizing a semiconductor film according to claim 1, wherein intensities of the first laser beam and the second laser beam at the beam spots are substantially the same.

9. A method for crystallizing a semiconductor film according to claim 3, wherein intensities of the first laser beam and the second laser beam at the beam spots are substantially the same.

10. A method for crystallizing a semiconductor film according to claim 7, wherein intensities of the first laser beam and the second laser beam at the beam spots are substantially the same.

11. A method for crystallizing a semiconductor film according to claim 1, wherein the first laser beam and the second laser beam intersects with each other at the semiconductor film.

12. A method for crystallizing a semiconductor film according to claim 3, wherein the first laser beam and the second laser beam intersects with each other at the semiconductor film.

13. A method for crystallizing a semiconductor film according to claim 7, wherein the first laser beam and the second laser beam intersects with each other at the semiconductor film.

14. A method for crystallizing a semiconductor film according to claim 1, wherein absolute values of the first angle and the second angle are substantially the same.

15. A method for crystallizing a semiconductor film according to claim 3, wherein absolute values of the first angle and the second angle are substantially the same.

16. A method for crystallizing a semiconductor film according to claim 7, wherein absolute values of the first angle and the second angle are substantially the same.

17. A method for manufacturing a semiconductor device, comprising the steps of:
  forming a semiconductor film over a substrate;
  oscillating a first laser beam by a first oscillator;
  oscillating a second laser beam by a second oscillator;
  processing the first laser beam and the second laser beam, so as each have a linear cross section extending along a surface of the semiconductor film;
  irradiating the semiconductor film with the first laser beam and the second laser beam concurrently;
  moving an irradiated portion of the semiconductor film along a direction substantially perpendicular to the linear cross section of the first laser beam and the second laser beam,
  wherein the first laser beam is incident on the semiconductor film at a first angle with respect to a plane extending perpendicularly from the surface of the semiconductor film, and extending along the linear cross section of the first laser beam and the second laser beam, and
  wherein the second laser beam is incident on the semiconductor film at a second angle opposite the first angle of the first laser beam with respect to the plane.

18. A method for manufacturing a semiconductor device, comprising the steps of:
  oscillating a laser beam by an oscillator;
  splitting the laser beam into a first laser beam and a second laser beam;
  processing the first laser beam and the second laser beam, so as each have a linear cross section extending along a surface of the semiconductor film;
  irradiating the semiconductor film with the first laser beam and the second laser beam concurrently;
  moving an irradiated portion of the semiconductor film along a direction substantially perpendicular to the linear cross section of the first laser beam and the second laser beam,
  wherein the first laser beam is incident on the semiconductor film at a first angle with respect to a plane extending perpendicularly from the surface of the semiconductor film and extending along the linear cross section of the first laser beam and the second laser beam,
  wherein the second laser beam is incident on the semiconductor film at a second angle opposite the first angle of the first laser beam with respect to the plane,
  wherein an optical path length of the first laser beam is different from an optical path length of the second laser beam.

19. A method for manufacturing a semiconductor device, comprising the steps of:
  oscillating a laser beam by an oscillator;
  splitting the laser beam into a first laser beam and a second laser beam;
  processing the first laser beam and the second laser beam, so as each have a linear cross section extending along a surface of the semiconductor film;
  irradiating the semiconductor film by the first laser beam and the second laser beam concurrently;
  moving an irradiated portion of the semiconductor film along a direction substantially perpendicular to the linear cross section of the first laser beam and the second laser beam,
  wherein the first laser beam is incident on the semiconductor film at a first angle with respect to a plane extending perpendicularly from the surface of the semiconductor film and extending along the linear cross section of the first laser beam and the second laser beam, wherein the second laser beam is incident on the semiconductor film at a second angle opposite the first angle of the first laser beam with respect to the plane.

20. A method for manufacturing a semiconductor device according to claim 17, wherein a source, a channel region, and a drain are formed in the island-shaped semiconductor film.

21. A method for manufacturing a semiconductor device according to claim 18, wherein a source, a channel region, and a drain are formed in the island-shaped semiconductor film.

22. A method for manufacturing a semiconductor device according to claim 19, wherein a source, a channel region, and a drain are formed in the island-shaped semiconductor film.

* * * * *